(12) United States Patent
Ishimori et al.

(10) Patent No.: US 8,459,840 B2
(45) Date of Patent: Jun. 11, 2013

(54) SEMICONDUCTOR LIGHT EMITTING APPARATUS AND LIGHT SOURCE APPARATUS USING THE SAME

(75) Inventors: Atsuyoshi Ishimori, Osaka (JP); Shozo Oshio, Osaka (JP); Yasuharu Ueno, Osaka (JP); Noriyasu Tanimoto, Osaka (JP)

(73) Assignee: Panasonic Corporation, Osaka (JP)

( * ) Notice: Subject to any disclaimer, the term of this patent is extended or adjusted under 35 U.S.C. 154(b) by 330 days.

(21) Appl. No.: 12/919,194

(22) PCT Filed: Jun. 2, 2009

(86) PCT No.: PCT/JP2009/060407
§ 371 (c)(1),
(2), (4) Date: Sep. 9, 2010

(87) PCT Pub. No.: WO2009/148176
PCT Pub. Date: Dec. 10, 2009

(65) Prior Publication Data
US 2011/0090703 A1    Apr. 21, 2011

(30) Foreign Application Priority Data

Jun. 2, 2008  (JP) .................. 2008-144557

(51) Int. Cl.
*F21V 9/16* (2006.01)
(52) U.S. Cl.
USPC ...................... 362/293; 362/311.02
(58) Field of Classification Search
USPC .............. 362/294, 311.02, 259, 293
See application file for complete search history.

(56) References Cited

U.S. PATENT DOCUMENTS

| 7,361,938 B2 | 4/2008 | Mueller et al. |
| 7,514,721 B2 | 4/2009 | Krames et al. |
| 2004/0062699 A1 | 4/2004 | Oshio |
| 2004/0145308 A1 | 7/2004 | Rossner et al. |
| 2007/0259206 A1 | 11/2007 | Oshio |
| 2007/0267646 A1 | 11/2007 | Wierer, Jr. et al. |

(Continued)

FOREIGN PATENT DOCUMENTS

| EP | 1 588 991 | 10/2005 |
| EP | 1588991 A1 * | 10/2005 |

(Continued)

OTHER PUBLICATIONS

Japanese Application No. 2010-543244 Information Statement dated Sep. 25, 2012, 4 pages.

*Primary Examiner* — David V Bruce

(57) ABSTRACT

A semiconductor light emitting apparatus includes a solid-state light emitting device and a wavelength converter that converts primary light emitted by the solid-state light emitting device into secondary light at a loner-wavelength. The wavelength converter is an inorganic compact that includes a transparent wavelength conversion layer containing phosphor having a garnet crystal structure. The phosphor contains a constituent element group composed of at least one element selected from the group consisting of Mg, Ca, Sr, Ba, Y, La, Gd, Tb, and Lu. Part of the constituent element group is substituted by $Ce^{3+}$ and the amount of $Ce^{3+}$ is 1 atomic % less of the entire constituent element group. As a result, a high-power and highly reliable semiconductor light emitting apparatus suitable as a point light source is provided. In addition, such a semiconductor light emitting apparatus is manufactured through a simple application of traditionally used practical technicians.

12 Claims, 38 Drawing Sheets

U.S. PATENT DOCUMENTS

| | | |
|---|---|---|
| 2008/0111143 A1 | 5/2008 | Ishida et al. |
| 2008/0128654 A1 | 6/2008 | Oshio |
| 2008/0138919 A1 | 6/2008 | Mueller et al. |
| 2008/0182127 A1 | 7/2008 | Oshio |
| 2008/0191610 A1 | 8/2008 | Oshio |
| 2008/0211389 A1 | 9/2008 | Oshio |
| 2008/0258110 A1 | 10/2008 | Oshio |
| 2009/0155943 A1 | 6/2009 | Krames et al. |
| 2009/0250663 A1 | 10/2009 | Oshio |
| 2009/0295272 A1 | 12/2009 | Oshio |
| 2012/0243222 A1 * | 9/2012 | van de Ven et al. ........... 362/231 |
| 2012/0262052 A1 | 10/2012 | Oshio |

FOREIGN PATENT DOCUMENTS

| | | |
|---|---|---|
| EP | 1 659 642 | 5/2006 |
| EP | 1 760 794 | 3/2007 |
| EP | 1760794 A1 * | 3/2007 |
| JP | 2840185 | 10/1998 |
| JP | 2002-141561 | 5/2002 |
| JP | 2004-115304 | 4/2004 |
| JP | 2004146835 | 5/2004 |
| JP | 2005-336450 | 12/2005 |
| JP | 2006005367 | 1/2006 |
| JP | 2007-039303 | 2/2007 |
| JP | 2007-103901 | 4/2007 |
| JP | 2007-150331 | 6/2007 |
| JP | 2008-123837 | 5/2008 |
| WO | 2007/080555 | 7/2007 |
| WO | 2007/107915 | 9/2007 |
| WO | 2007/107917 | 9/2007 |
| WO | WO 2007107915 A1 * | 9/2007 |
| WO | WO 2007107917 A2 * | 9/2007 |
| WO | 2007/144809 | 12/2007 |
| WO | 2008/025723 | 3/2008 |
| WO | WO 2008025723 A1 * | 3/2008 |

* cited by examiner

Fig. 18

| No. | Ce substitution amount (atomic%) | Gd substitution amount (atomic%) | Thickness (mm) | Volume (mm³) | x | y | Correlated color temp (K) |
|---|---|---|---|---|---|---|---|
| 1 | 0.05 | 0 | 0.2 | 0.19 | 0.251 | 0.241 | 42764 |
| 2 | 0.05 | 0 | 0.2 | 0.19 | 0.253 | 0.250 | 26254 |
| 3 | 0.05 | 0 | 0.2 | 0.19 | 0.282 | 0.310 | 8861 |
| 4 | 0.05 | 0 | 0.3 | 0.29 | 0.308 | 0.361 | 6516 |
| 5 | 0.5 | 0 | 0.1 | 0.10 | 0.351 | 0.432 | 5027 |
| 6 | 0.5 | 0 | 0.2 | 0.19 | 0.358 | 0.444 | 4883 |
| 7 | 0.5 | 0 | 0.3 | 0.29 | 0.385 | 0.493 | 4476 |
| 8 | 1 | 0 | 0.1 | 0.1 | 0.420 | 0.537 | 4053 |
| 9 | 2 | 0 | 0.1 | 0.1 | 0.437 | 0.523 | 3746 |
| 10 | 2 | 0 | 0.02 | 0.02 | 0.344 | 0.387 | 5149 |
| 11 | 2 | 0 | 0.02 | 0.02 | 0.344 | 0.374 | 5121 |
| 12 | 3 | 0 | 0.1 | 0.10 | 0.457 | 0.507 | 3378 |
| 13 | 3 | 0 | 0.02 | 0.02 | 0.370 | 0.395 | 4385 |
| 14 | 0.05 | 18 | 0.6 | 0.57 | 0.283 | 0.269 | 11105 |

Fig. 34

| No. | Ce substitution amount (atomic%) | Gd substitution amount (atomic%) | Thickness (mm) | Volume (mm³) | x | y | Correlated color temp (K) |
|---|---|---|---|---|---|---|---|
| 1 | 0.5 | 5 | 0.08 | 0.076 | 0.31319 | 0.33331 | 6449 |
| 2 | 0.5 | 15 | 0.12 | 0.115 | 0.32658 | 0.33856 | 5767 |
| 3 | 0.5 | 20 | 0.11 | 0.105 | 0.34182 | 0.35046 | 5124 |
| 4 | 0.5 | 30 | 0.135 | 0.129 | 0.36278 | 0.3642 | 4523 |
| 5 | 0.5 | 50 | 0.2 | 0.191 | 0.39362 | 0.38001 | 3684 |
| 6 | 0.8 | 10 | 0.06 | 0.057 | 0.34063 | 0.36307 | 5200 |
| 7 | 0.8 | 20 | 0.075 | 0.072 | 0.34797 | 0.34983 | 4884 |
| 8 | 0.8 | 40 | 0.12 | 0.115 | 0.42934 | 0.40501 | 3090 |
| 9 | 0.8 | 50 | 0.15 | 0.143 | 0.45478 | 0.40871 | 2758 |

Fig. 37

| Temperature range (°C) | Ce substitution amount (atomic%) | Gd substitution amount (atomic%) | Color temperature range (K) |
|---|---|---|---|
| ~70 | 0.5 | ~50 | 3600~8000 |
| ~150 | 0.5 | ~30 | 4500~8000 |
| ~200 | 0.5 | ~10 | 6000~8000 |

Fig. 38

| Temperature range (°C) | Ce substitution amount (atomic%) | Gd substitution amount (atomic%) | Color temperature range (K) |
|---|---|---|---|
| ~70 | 0.8 | ~50 | 2800~7000 |
| ~150 | 0.8 | ~20 | 4500~7000 |
| ~200 | 0.8 | ~10 | 5500~7000 |

SEMICONDUCTOR LIGHT EMITTING APPARATUS AND LIGHT SOURCE APPARATUS USING THE SAME

TECHNICAL FIELD

The present invention relates to semiconductor light emitting apparatuses used as point light, sources for vehicle headlights and projection light sources and also relates to light source apparatuses using such a semiconductor light emitting apparatus.

BACKGROUND ART

Example of the semiconductor light emitting apparatuses above include a white LED having a solid-state light emitting device and a wavelength converter that converts the primary light emitted by the solid-state light emitting device into loner-wavelength light. Commonly used in such a white LED (hereinafter, "LED chip" or simply "chip") is a light emitting diode having a light-emitting layer of a InGaN-based compound semiconductor. An example of the wavelength converter is a resin phosphor layer made from a phosphor powder (phosphor particles) dispersed in a transparent resin.

In recent years, there is a growing demand for higher-output semiconductor light emitting apparatuses. Unfortunately, however, to increase the output power of a semiconductor light emitting apparatus means to increase the fluorescent excitation light emitted by the LED chip, which leads to heat generation due to the energy loss (Stokes loss) associated with the wavelength conversion by the phosphor. The heat builds up in the resin phosphor layer to elevate the temperature of the resin phosphor layer, which increases the lattice vibrations in the solid to reduce the photon conversion efficiency.

In addition, due to the temperature rise of the resin phosphor layer and exposure to the strong primary light emitted by the LED chip, the transparent resin of the resin phosphor layer undergoes accelerated chemical reaction with surrounding component members and the atmosphere. The physical properties of the transparent resin are adversely affected to reduce the optical output and reliability (such as the reduction of light transmittance).

In view of the above drawbacks, it is suggested to use, as the wavelength converter, a ceramic compact (for example, a compact of transparent phosphor ceramics, phosphor glass, or optical-functional composite ceramics) having high thermal conductivity and excellent heat dissipation to suppress the temperature rise of the wavelength converter (see patent literatures 1 and 2 listed below).

CITATION LIST

Patent Literature

[PTL 1]
JP patent application publication No. 2004-146835
[PTL 2]
JP patent application publication No. 2006-5367

SUMMARY OF INVENTION

Technical Problem

However, a ceramic compact made from a phosphor having a garnet structure with a typical amount of $Ce^{3+}$ substitution is insufficient to perform effective wavelength conversion and to yield expected output.

The present invention is made to address the above-noted problems and aims to provide a semiconductor light emitting apparatus capable of producing high-power output despite that a wavelength converter with excellent heat dissipation is employed therein. The present invention also aims to provide a light source apparatus using the semiconductor light emitting apparatus.

Solution to Problem

In order to solve the above problems, a semiconductor light emitting apparatus according to the present invention includes: a solid-state light emitting device operable to emit primary light; and a wavelength converter operable to convert the primary light into secondary light at a longer wavelength. The wavelength converter is an inorganic compact that includes a transparent wavelength conversion layer containing a phosphor having a garnet crystal structure. The phosphor contains a constituent element group consisting of one or more elements selected from Mg, Ca, Sr, Ba, Y, La, Gd, Tb, and Lu. Part of the constituent element group is substituted by $Ce^{3+}$. An amount of the $Ce^{3+}$ substitution is within a range from 0.01 atomic % and 1 atomic %, both inclusive.

In another aspect, a light source apparatus according to the present invention has any of semiconductor light emitting apparatuses according to the present invention.

Advantageous Effects of Invention

The semiconductor light emitting apparatus according to the present invention has a wavelength converter that is an inorganic compact. By virtue of this, excellent heat dissipation is achieved.

In addition, since the amount of $Ce^{3+}$ substituting part of the constituent element group is limited to 1 atomic % or less, the wave conversion efficiency is ensured to be high (absolute quantum efficiency is 80% or higher) and thus high-power output is ensured. The semiconductor light emitting apparatus is enabled to emit more illumination light adjusted suitably for general illumination purpose. The present invention achieves to provide a high-power semiconductor light emitting apparatus suitable for general illumination purpose.

BRIEF DESCRIPTION OF DRAWINGS

FIG. 18 is a table showing the correlated color temperatures of emission light of a plurality of white LEDs.

FIG. 34 is a table showing the correlated color temperatures of light emitted by the white LEDs.

FIG. 37 is a table showing the temperature ranges that are determined by the $Ce^{3+}$ substitution amount and the $Gd^{3+}$ substitution amount.

FIG. 38 is a table showing the temperature ranges that are determined by the $Ce^{3+}$ substitution amount and the $Gd^{3+}$ substitution amount.

DESCRIPTION OF EMBODIMENTS

Embodiments of a semiconductor light emitting apparatus consistent with the present invention are described below with reference to the drawings.

Figure 1:
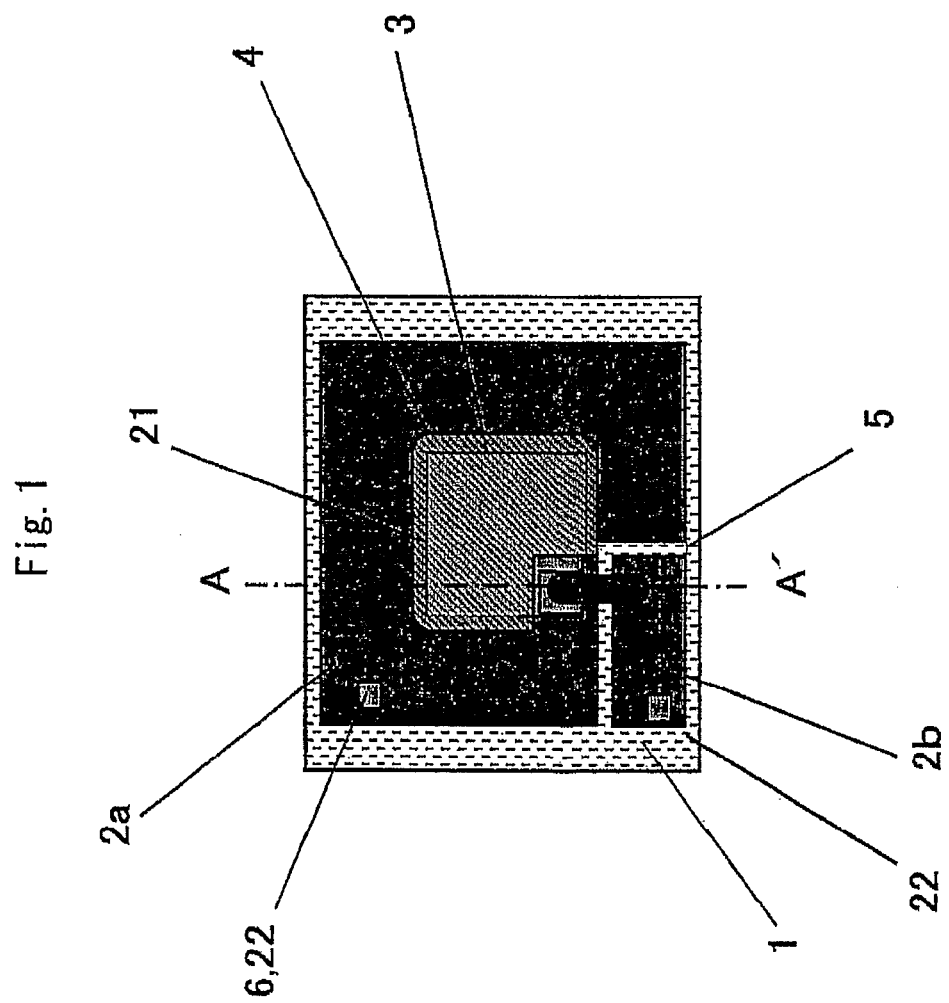
FIG. 1 is a top plan view showing an exemplary semiconductor light emitting apparatus according to the present invention.
Figure 12:
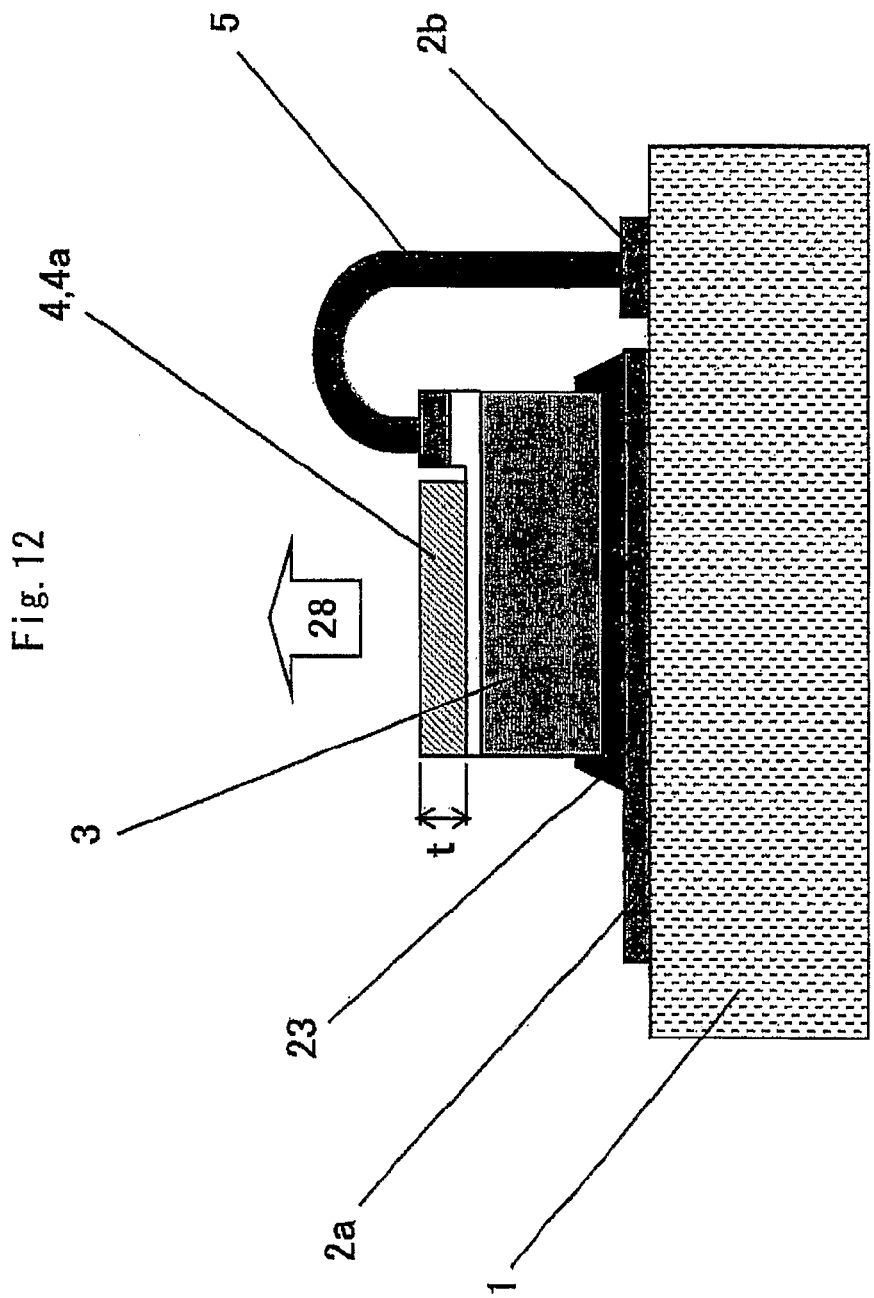
FIG. 12 is a cross-sectional side view of the exemplary semiconductor light emitting apparatus according to the present invention.

FIG. 1 is a top plan view showing an exemplary semiconductor light emitting apparatus according to the present invention. FIG. 12 is a cross-sectional side view of an exemplary semiconductor light emitting apparatus according to the present invention.

First, particulars common to all preferred embodiments are described with reference to FIG. 1.

Heat-Dissipating Substrate 1

In FIG. 1, a heat-dissipating substrate 1 is a mounting substrate for mounting a solid-state light emitting device 3 thereon.

The heat-dissipating substrate 1 is a plate having at least one flat surface and the flat surface is used as a mounting surface for the solid-state light emitting device 3.

At least one material of the heat-dissipating substrate 1 is selected from metal, semiconductor material, ceramic material, and resin material. Basically, any of an insulator board, conductive board (especially, a metal board) may be used as the heat-dissipating substrate 1.

Specifically, the heat-dissipating substrate 1 may be made from any of inorganic materials including copper, aluminum, stainless steel, metal oxide (such as aluminum oxide, silicon oxide and glass), metal nitride (such as aluminum nitride and silicon nitride), silicon carbide, metal silicon, and carbon. Alternatively, the heat-dissipating substrate 1 may be made from a silicone-based resin or epoxy-based resin.

For the purpose of obtaining a good heat-dissipating property, the heat-dissipating substrate 1 is preferably made from a metal, a ceramic compact or a complex of metal and ceramics.

For the purpose of reducing the manufacturing cost, on the other hand, the heat-dissipating substrate 1 is preferably a compact mainly made from a resin (such as silicone-based resin). For example, the heat-dissipating substrate 1 may be a resin compact containing a filler (e.g., inorganic particles of alumina, silica, or of any of various metals).

Further, the purpose of improving the light-extraction efficiency, the heat-dissipating substrate 1 preferably has an excellent visible light reflectance. Examples of such a heat-dissipating substrate include those having a metallic luster or a white body color.

The above examples of the heat-dissipating substrate 1 are relatively inexpensive, readily available, and easy to handle. In addition, with the thermal conductivity being high, heat-dissipating substrate 1 serves to suppress the temperature rise of the solid-state light emitting device 3.

In one example, the heat-dissipating substrate 1 may be made entirely of an insulator. With this heat-dissipating substrate 1, it is relatively easy to configure a semiconductor light emitting apparatus so that only limited portions of the apparatus is allowed to have a potential. This advantage facilitates due design considerations regarding electrical aspects, so that it is made relatively easy to provide a light source apparatus configured to allow easy handling of electrical aspects.

In another example, the heat-dissipating substrate 1 may employ a conductive board as a substrate to impart an extremely good thermal conductivity. With this heat-dissipating substrate 1, the semiconductor light emitting apparatus is configured to have an excellent heat dissipation.

For the above reasons, in the case where importance is placed on the easiness for making electrical design considerations, it is preferable to employ an insulator board made entirely of an insulator. Alternatively, in the case where the heat dissipation property is of first importance, it is preferable to employ an insulator board made with a conductive board as a substrate.

With any of the above insulator boards, it is preferable that the heat-dissipating substrate 1 is made with board having a thermal conductivity equal to or higher than 1 W/mK or made from a material having a thermal conductivity equal to or higher than 1 W/mK. Here, the thermal conductivity is preferably no less than 10 W/mK, and more preferably no less than 100 W/m.

With any example of the heat-dissipating substrate 1 as described above, heat generated in response to electrical power supplied to the semiconductor light emitting apparatus is conducted via the heat-dissipating substrate 1 to a lower temperature portion such as an external heat dissipater to promote the thermal diffusion. As a consequence, the semiconductor light emitting apparatus works to suppress the overall temperature rise, so that excellent heart radiation performance is ensured.

Note that it is preferable that the heat-dissipating substrate 1 takes form of a flat plate, which is easy to handle. With the heat-dissipating substrate 1 having such a shape, the solid-state light emitting device 3 is easily mounted, which permits to simplify the manufacturing steps.

Conductors A2a & B2b (Conductors X)

In the following description, a conductor (patterning electrode) A2a and a conductor (patterning electrode) B2b may be both commonly referred to as conductors (patterning electrodes) X.

The conductors A2a and B2b are a pair of conductors for supplying electric power to the solid-state light emitting device 3.

The conductor X may be a conductor whose main constituent is at least one material selected from metal, conductive compound, and semiconductor. In order for the conductor X to have both low resistivity and high thermal conductivity, it is preferable that the main constituent is a metal material with the metal composition of 80 wt % or higher.

Examples of metals usable for the conductor X include gold (Au), silver (Ag), copper (Cu), platinum (Pt), palladium (Pd), zinc (Zn), nickel (Ni), titanium (Ti), zircon (Zr), hafnium (Hf), vanadium (V), niobium (Nb), tantalum (Ta), chromium (Cr), molybdenum (Mo), tungsten (W), rhodium (Rh), iridium (Ir), aluminum (Al), stannum (Sn), silicon (Si), and iron (Fe) as well as an alloy of these metals and a silicide of these metals. Examples of the conductive compounds include low resistivity materials such as titanium nitride (TiN) and tantalum nitride (TaN).

Examples of semiconductors usable for the conductor X include transparent conductive materials such as In—Sn—O, ZnO:Al, and $TiO_2$:Nb.

In order to provide the semiconductor light emitting apparatus with high light-extraction efficiency, it is preferable that the conductor X has a metallic luster.

Rough reference measures of a preferable metallic luster are given below in terms of optical reflectance at room temperature. That is, the optical reflectance within a blue-red wavelength region (420-660 nm) should be no less than 50%, for example. Preferably, the optical reflectance within a visible light region (380-780 nm) is no less than 80%.

Although it is preferable that the conductors A2a and B2b both have the metallic luster specified above, it is basically sufficient as long as the conductor A2a has the specified metallic luster. The conductor A2a takes up a large portion of the rear surface (mounting surface) of the solid-state light emitting device 3.

The conductors X as described above may be made with any of a conductive plate, conductive compact, conductive thick film, and conductive thin film. Yet, a conductive thick film is preferable in manufacturing cost.

Further, preferable conductive thick and thin films are those having been commonly used in the filed of wiring of electronic appliance. For example, a preferable conductive thick film is any of those formed by using a screen printing method, ink jet method, doctor blade method, slurry casting method, spin coat method, precipitation method, electrophoresis method and plating techniques. A preferable conductive thin film is any of those made by using deposition techniques, sputtering techniques, and chemical vapor deposition.

Note that the conductive plate refers, for example, to a patterned metal plate (such as Al, Ti, Nb, Ta, Cr, Mo, W, Rh, Ir, Fe, Ni, Pd, Pt, Cu, Ag, or Zn as well as an alloy of those metals and stainless steel).

A metal plate having been patterned is fixed to the heat-dissipating substrate 1 with an adhesive or the like, so that the heat-dissipating substrate 1 attached with the conductor A2a is provided.

In view of design requirements of the semiconductor light emitting apparatus, it is preferable that the conductor X is thicker within a range not exceeding about 3 mm. Specifically, for example, the thickness of the conductor X should be at least 10 µm yet less than 3 mm. Preferably, the thickness is at least 100 µm but less than 3 mm, and more preferably at least 300 µm and less than 3 mm.

With the above described thickness, an excellent thermal conductivity is imparted to the conductor X. Thus, when the solid-state light emitting device 3 is mounted thereon, the conductor X also acts as a good heat dissipator.

With the above described thickness, in addition, the wiring resistance is kept low. As a consequence, Joule heating occurring in the conductor X is suppressed, so that a rise in the temperature of the semiconductor light emitting apparatus is suppressed.

Note that the semiconductor light emitting apparatus according to the present invention is so configured that the heat-dissipating substrate 1 may be commonly used as one of the pair of conductors X (the conductor A2a).

Figure 13:
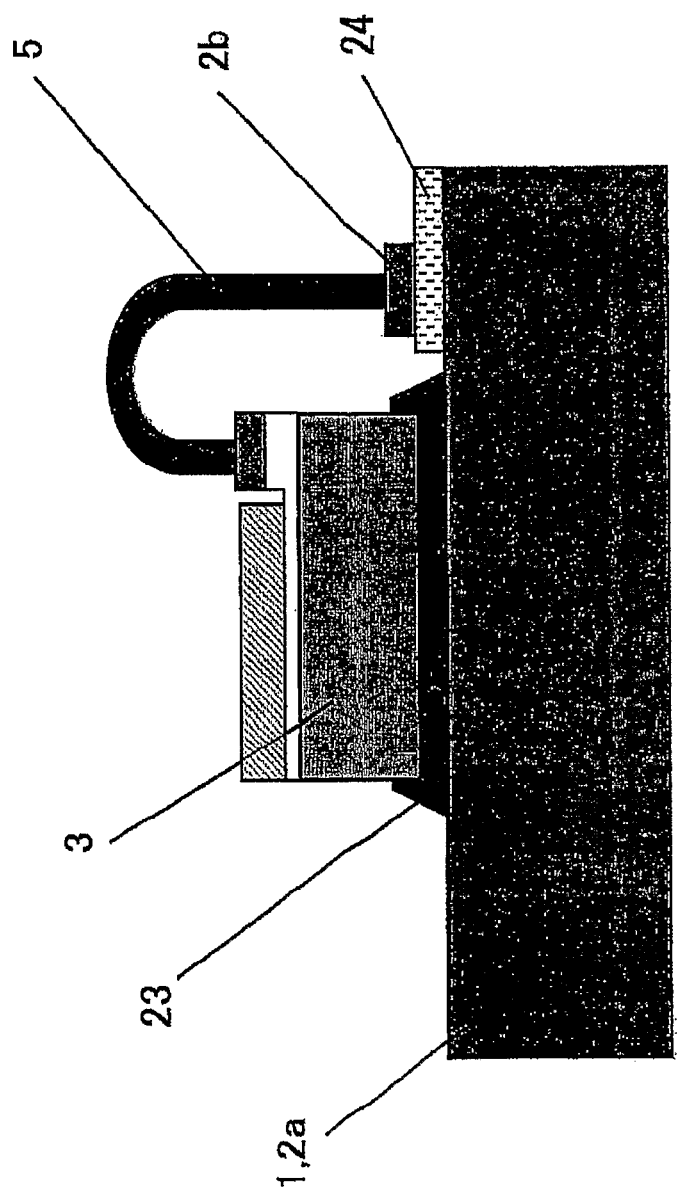
FIG. 13 is a cross-sectional side view of another exemplary semiconductor light emitting apparatus according to the present invention.

FIG. 13 shows an example of such an assembly. The assembly shown in FIG. 13 may be assembled by fixing, onto the heat-dissipating substrate 1 made from metal, an insulator board (insulator 24) having the conductor B2b on one main surface of the insulator 24. Alternatively, the insulator 24 may be disposed on the heat-dissipating substrate 1 and the conductor B2b on the insulator 24.

Note that an electrode pad 6 shown in FIG. 1 is a conductor (typically metal) that may be optionally provided on the conductor X for the purpose of extracting a wire, for example. The electrode pad 6 may also be used as a feeder terminal.

Outline of Solid-State Light Emitting Device 3

The solid-state light emitting device 3 is an electric-optic converting element for converting electric energy into optical energy. Examples of the solid-state light emitting device 3 include a so-called light emitting diode (LED), semiconductor laser (LD), inorganic EL device (EL), and organic EL device (OLED).

In view of the operation principle of the electric-optic converting element, either of LED and LD is preferable as the solid-state light emitting device 3 in order to obtain the semiconductor light emitting apparatus acting as a high-power point light source. On the other hand, in order to obtain the semiconductor light emitting apparatus acting as a high-power surface light source, either of EL and OLED is preferable as the solid-state light emitting device 3.

In order to increase the reliability of the semiconductor light emitting apparatus, it is preferable that the solid-state light emitting device 3 is either of LED, LD, and EL, which have a light-emitting layer made from an inorganic material.

In order to ensure that the output light has a good color rendering property and produces a uniform light diffusing surface, it is preferable that the solid-state light emitting device 3 is either of EL and OLED, which emit substantially non-directional light whose emission spectrum has a relatively wide half band width.

In order to obtain light output having high directivity, it is preferable that the solid-state light emitting device 3 is either of LED and LD.

Furthermore, in view of the energy efficiency of wavelength conversion by a wavelength converter 4, it is preferable that the solid-state light emitting device 3 emits primary light (visible light) having an emission peak at a longest possible wavelength within a portion of the visible region, which is longer than 380 nm. In order to obtain white output light, it is preferable that the solid-state light emitting device 3 emits primary light having an emission peak at within a violet-blue green wavelength region that is 380 nm or longer but shorter than 510 nm.

Note that under existing circumstances, such as the output standard of a solid-state light emitting device, it is preferable that the solid-state light emitting device 3 emits primary light having an emission peak within a violet-blue wavelength region preferably from 400 nm to <480 nm, more preferably from 430 nm to <475 nm, and still more preferably from 440 nm to <465 nm.

With any of the solid-state light emitting devices described above, the semiconductor light emitting apparatus is so configured that the energy difference between absorption and emission of light by the wavelength converter 4 is relatively small. In the principle of wavelength conversion, this configuration serves to reduce the optical energy loss associated with wavelength conversion. As a consequence, the amount of heat generated by the wavelength converter 4 due to the energy loss is reduced, so that the temperature rise caused by the accumulation on heat generated by the wavelength converter 4 is suppressed, which in turn serves to reduce the temperature quenching of phosphor contained in the wavelength converter 4. For the above-stated reasons, the semiconductor light emitting apparatus is enabled to maintain a relatively high wavelength conversion efficiency, despite that the solid-state light emitting device 3 is configured to output light (primary light) of the increased intensity.

The dimensions of the solid-state light emitting device 3 are not specifically limited. In one example, the solid-state light emitting device 3 is such that the area of the contoured surface in plan view measures 0.01 mm$^2$ or larger but smaller than 4 cm$^2$.

In the case where the solid-state light emitting device 3 is an LED, the area of the contoured surface of an individual LED in plan view is about 0.61 mm$^2$ or larger but smaller than 4 cm$^2$. However, in order to obtain a high-power point light source, it is preferable, based on the balance between input power and the property as a point light source, that the area of the contoured surface is preferably about 0.25 mm$^2$ or larger but smaller than 4 cm$^2$, and more preferably about 0.6 mm$^2$ or larger but smaller than 2 cm$^2$.

Generally, an LED has a configuration that is classified into four types depending on the pull-out configuration of a pair of feeder electrodes and the position of the active layer in the state where the LED chip is mounted on a heat-dissipating substrate. FIGS. 2-5 are longitudinal sectional views showing preferable examples of the solid-state light emitting device 3 each with one the four types of LED configuration.

Figure 2:
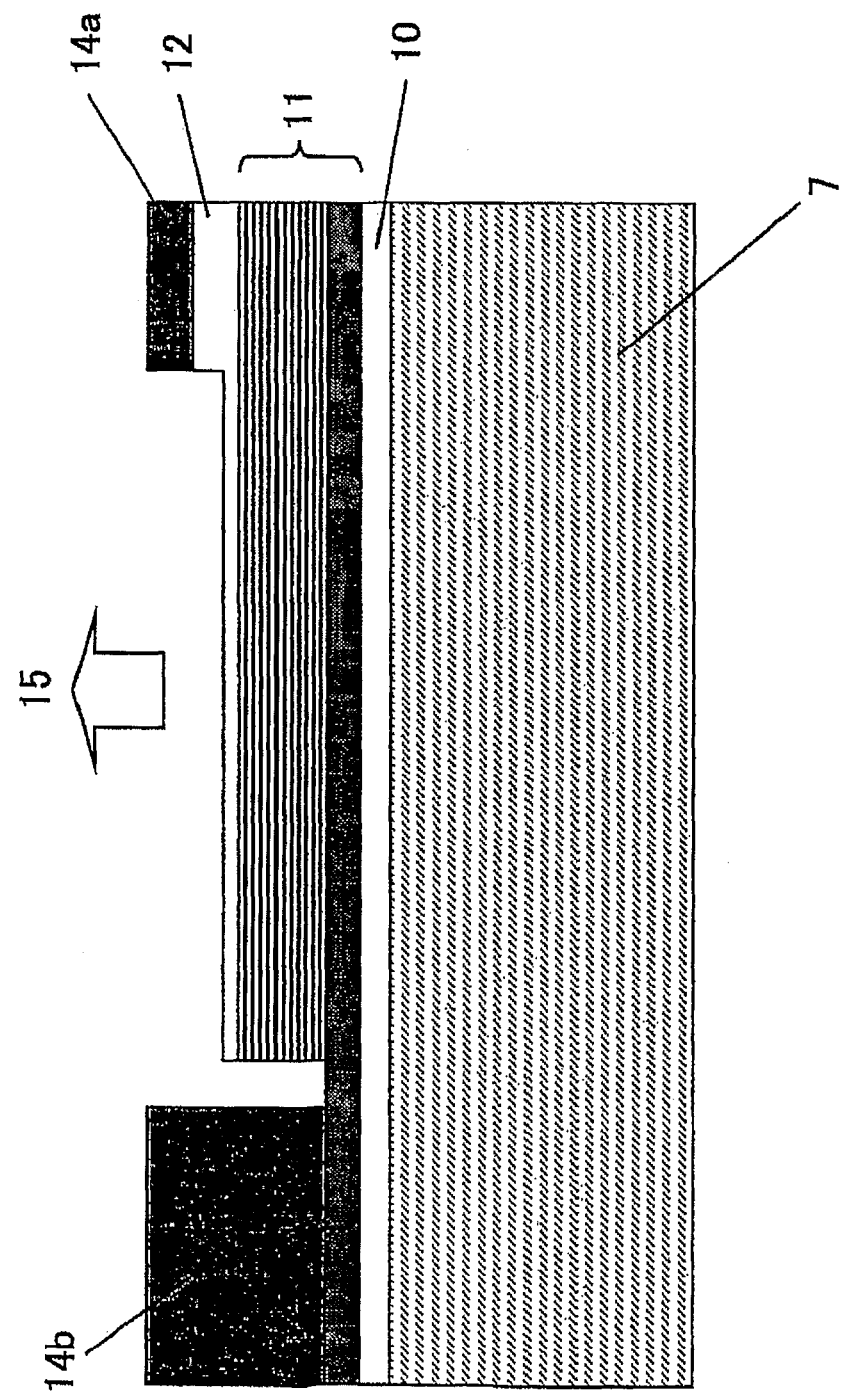
FIG. 2 is a cross-sectional side view showing an exemplary configuration of a solid-state light emitting device according to the present invention.

In FIG. 2, the rear surface (i.e., underside surface) of the LED chip is a mounting surface. In this type of LED configuration, the semiconductor light-emitting layer (active layer) that emits LED light is located in the vicinity of the upper surface of the LED chip and the pair of feeder electrodes A14a and B14b are both located on the upper surface. The chip surface having the pair of feeder electrodes A14a and B14b is a light emitting surface.

Figure 3:
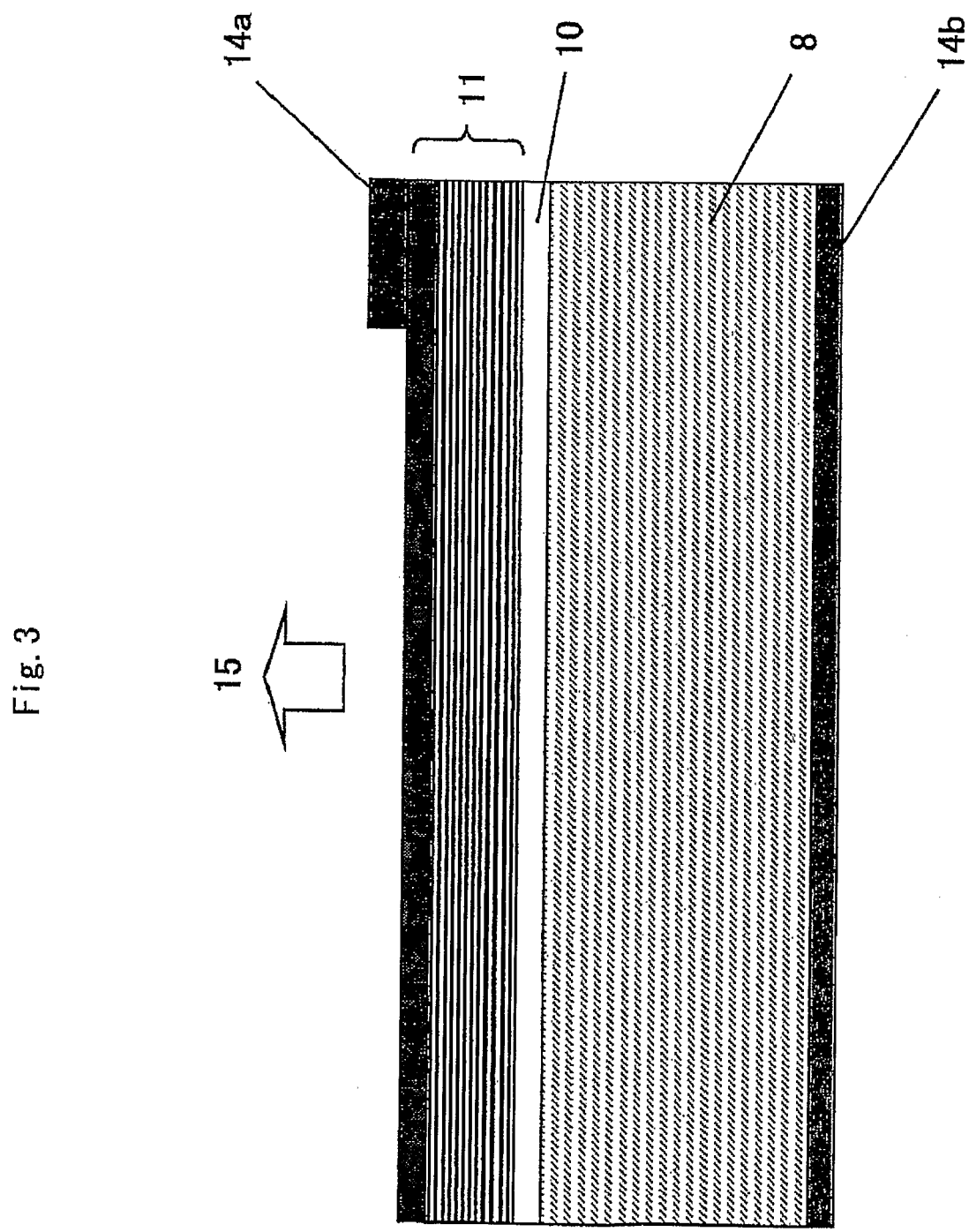
FIG. 3 is a cross-sectional side view showing another exemplary configuration of the solid-state light emitting device according to the present invention.

In FIG. 3, the rear surface of the LED chip is a mounting surface. In this type of LED configuration, the active layer is located in the vicinity of the upper surface of the LED chip and one of the pair of feeder electrodes is located on the upper surface and the other on the rear surface. The chip surface having an upper one of the feeder electrodes is a light emitting surface.

Figure 4:
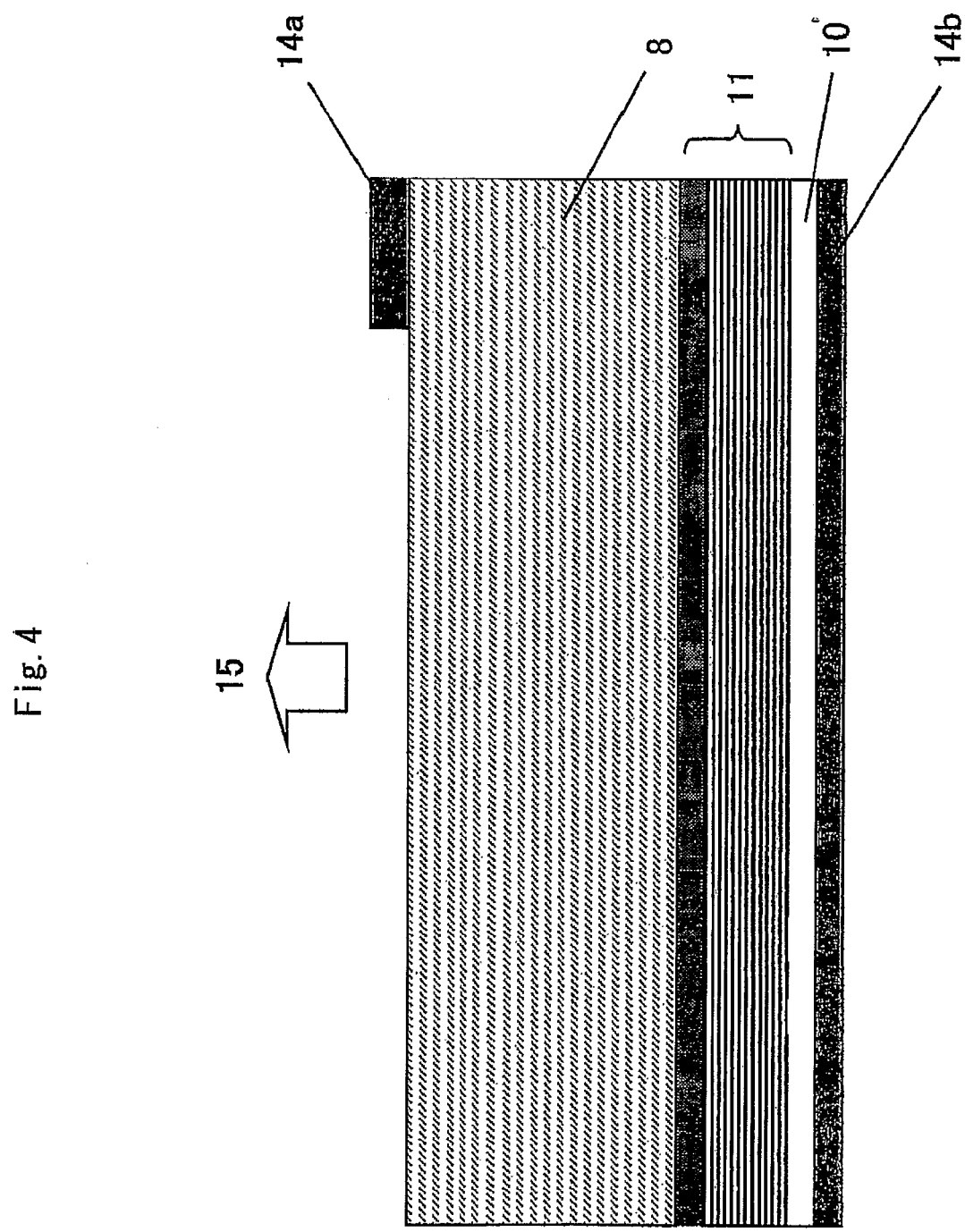
FIG. 4 is a cross-sectional side view showing yet another exemplary configuration of the solid-state light emitting device according to the present invention.

In FIG. 4, the rear surface of the LED chip is a mounting surface. In this type of LED configuration, the active layer is located in the vicinity of the rear surface of the LED chip and one of the pair of feeder electrodes is located on the upper surface and the other on the rear surface. The chip surface having an upper one of the feeder electrodes is a light emitting surface.

Figure 5:
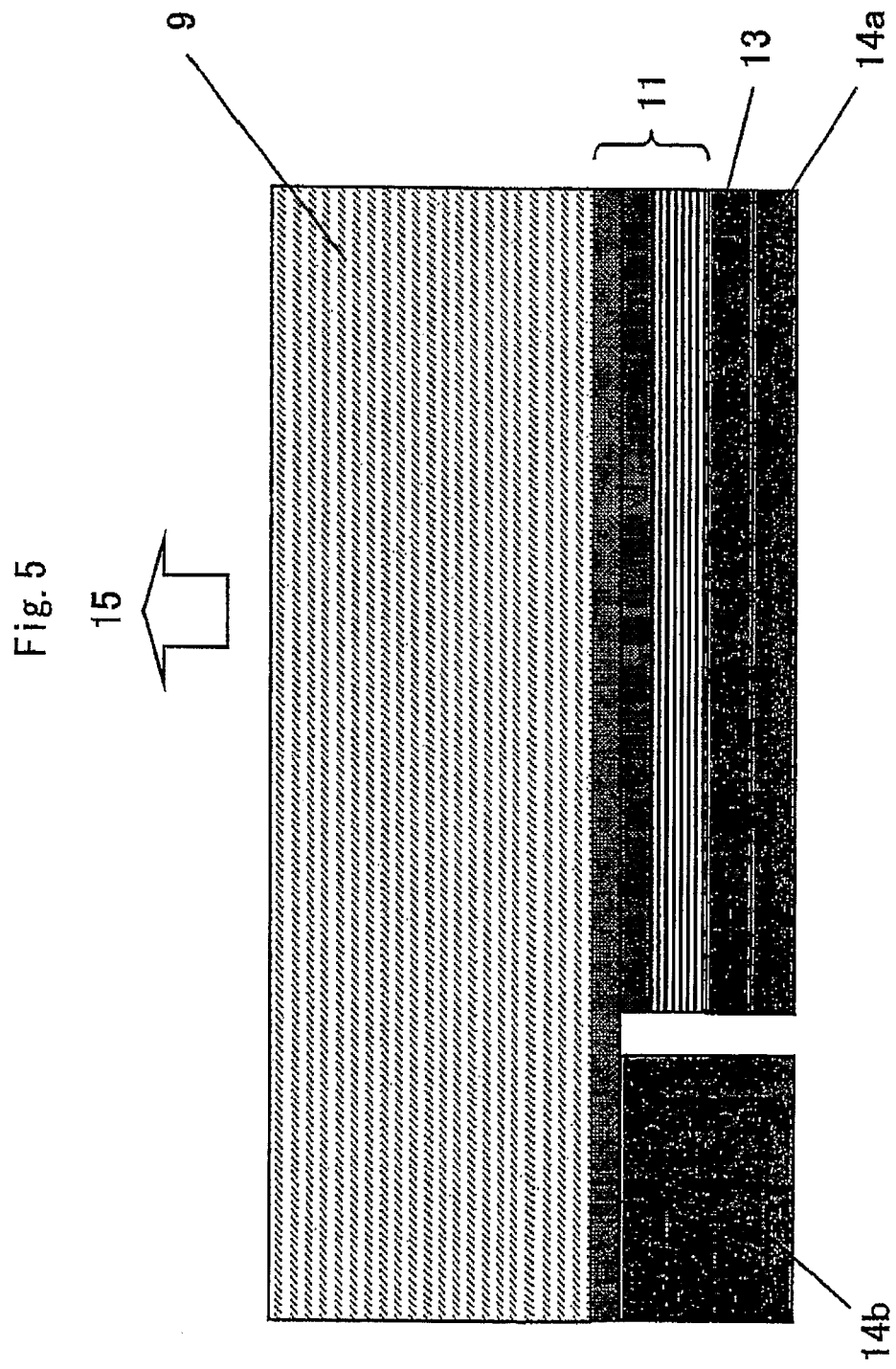
FIG. 5 is a cross-sectional side view showing yet another exemplary configuration of the solid-state light emitting device according to the present invention.

In FIG. 5, the rear surface of the LED chip is a mounting surface. In this type of LED configuration, the active layer is located in the vicinity of the rear surface of the LED chip and the pair of feeder electrodes are both located on the rear surface. The chip surface that is opposite from the chip surface having the pair of feeder electrodes A14a and B14b is a light emitting surface.

For the convenience sake in the description, the chip mounting configurations corresponding to the typical examples shown in FIGS. 2-5 may hereinafter be referred to as "face-up with dual upper electrode configuration", "face-up with top-rear electrode configuration", "flip-chip with top-rear electrode configuration", and as "flip-chip with dual bottom electrode configuration", respectively.

Note that as apparent from FIG. 5, in the LED chip in the "flip-chip with dual rear electrode configuration", basically, the mounting surface (rear surface) opposite from the main light-extracting surface makes intimate contact with the heat dissipating body only partly, rather than entirely thought the entire rear surface.

Preferably, the semiconductor light-emitting layer 11, which is a source of primary light 15 emitted by the solid-state light emitting device 3, is supported by either of an insulating substrate 7 and a conductive substrate 8.

This configuration serves to reinforce the mechanical strength of the semiconductor light-emitting layer 11, which would otherwise tend to be insufficient, to ease handling difficulties.

Note that the manufacturing details of the solid-state light emitting device 3 having such a configuration is omitted herein, since it is disclosed in JP patent application publication No. 2007-150331, for example.

Preferably, each of the insulating substrate 7 and the conductive substrate 8 is at least one semiconductor substrate selected from a metal composed mainly of a group VI metallic element, a compound composed mainly of a group IV element, and a compound composed mainly of a group III-V element.

Each semiconductor substrate mentioned above may be made into either of the insulating substrate 7 and the conductive substrate 8, depending on the presence or absence of impurity. In addition, with its good thermal conductive property, the semiconductor substrate serves to suppress the temperature rise of the solid-state light emitting device 3.

As shown in FIGS. 2-4, it is preferable that the solid-state light emitting device 3 is flat at the bottom, which constitutes the mounting surface and also is the surface opposite from the main light-extracting surface of the primary light.

With the above configuration, the solid-state light emitting device 3 is mounted on the heat dissipating body in a manner to make intimate contact. Consequently, the semiconductor light emitting apparatus is configured to ensure excellent heat dissipation and to output relatively high-power primary light.

It is especially preferable that the solid-state light emitting device 3 has the top-rear electrode configuration as shown in FIG. 3 or 4. In this configuration, at least one of the electrodes is disposed on the main light-extracting surface and the primary light is emitted by applying voltage across the entire solid-state light emitting device 3 in the thickness direction.

With the above configuration, the number of conductors (wire conductors) C5 can be reduced to a relatively smaller number, which serves to ensure high-power primary light output. Each conductor C5 is disposed in the vicinity of the light extracting surface and thus blocks part of the primary light to go out.

More preferably, the solid-state light emitting device 3 has the "face with top-rear electrode configuration" shown in FIG. 3. As described above, in this configuration, the rear surface of the solid-state light emitting device 3 is the mounting surface. The semiconductor light-emitting layer 11 (active layer), which produces the primary light 15, is located in the vicinity of the upper surface of the LED chip, and the pair of electrodes are located one on the upper surface and the other on the rear surface.

With this configuration, it is avoided to support the semiconductor light-emitting layer 11 in the close vicinity and with a large area. Since the semiconductor light-emitting layer 11 is rather delicate and fragile, this configuring is effective to render the semiconductor light-emitting layer 11 less prone to a thermal distortion associated with the increase of the input power density and with a larger current. This configuration is also effective to reduce the risk of current leak of the semiconductor light-emitting layer 11 after the chip mounting with an adhesive having conductivity. As above, the semiconductor light-emitting layer 11 is configured to reduce the risk of cracks and variations in property.

In addition, since the primary light 15 emitted by the semiconductor light-emitting layer 11 exits without having passed through any substrate, the primary light will be of strong directivity that is suitable for headlights, for example.

Note that it is preferable that the solid-state light emitting device 3 is principally made from an inorganic material, such as a metallic material, semiconductor material, and ceramic material.

As above, the solid-state light emitting device 3 is made from one or more materials all having a good thermal conductive property. Consequently, the thermal conductivity of the solid-state light emitting device 3 increases and thus the heat dissipation is increased, which serves to suppress the temperature rise.

It is also preferable to texture the main light-extracting surface to roughen or form concaves and convexes thereon, by conducting a surface roughening process.

This surface profile serves to increase the light-extraction efficiency, so that the high-power primary light is obtained.

Preferably, the semiconductor light-emitting layer 11 is made from either of a group II-VI compound, a group III-V compound, and a group IV compound.

The semiconductor light-emitting layer 11 made from any of the above compounds serves as a highly efficient, inorganic electric-optic converter. Thus, high-power output of the primary light 15 is ensured with little or no problems in reliability.

Preferably, the area size of the rear surface of the solid-state light emitting device 3 is equal to or larger than the that of the upper surface, which constitutes the main light-extracting surface.

The above arrangement ensures that the substrate (either of the insulating substrate 7, conductive substrate 8, and semiconductor substrate) is larger by volume than the semiconductor light-emitting layer 11 acting as a heat source. In addition, the above arrangement increases the contacting surface of the semiconductor light-emitting layer 11 with the heat dissipating body (such as the conductor A2a and the heat-dissipating substrate 1) onto which the solid-state light emitting device is mounted. As a result, it is achieved to improve the transfer speed of heat generated within the solid-state light emitting device as well as the transfer speed of heat generated by the wavelength converter 4 to be released to the heat-dissipating substrate via the solid-state light emitting device 3. With the improved heat transfer speed, the temperature rise of the wavelength converter 4 and the solid-state light emitting device 3 are more reliably suppressed.

Preferably, the solid-state light emitting device 3 is adhesively joined to the heat dissipating body with a material, that is principally made from a metal (such as a silver paste or solder).

Generally, metallic materials have a good thermal conductivity. Thus, heat generated by the wavelength converter 4 is ensured to be effectively transferred to the heat-dissipating substrate via the solid-state light emitting device 3. Similarly, heat generated by the solid-state light emitting device is ensured to be effectively transferred to the conductor A2a and the heat-dissipating substrate 1. As a result, the temperature rise of the wavelength converter 4 and the solid-state light emitting device 3 are effectively suppressed.

Note that the details and arrangement of the solid-state light emitting device 3 will be described later.

Exemplary Configurations of Solid-State Light Emitting Device 3

The following describes exemplary configurations of the solid-state light emitting device 3. Note that the manufacturing of the solid-state light emitting device 3 having such a configuration is not described in detail, since it is disclosed in JP patent application publication No. 2007-150331, for example.

Exemplary Configuration 1 of Solid-State Light Emitting Device 3

FIG. 2 shows one exemplary configuration of the solid-state light emitting device 3. In this example, a reflective layer 10 is disposed on or above the insulating substrate 7, and the semiconductor light-emitting layer 11 is disposed on or above the reflective layer 10. In addition, a pair of electrodes (a transparent electrode 12 and the feeder electrode B14b) used for applying voltage to the semiconductor light-emitting layer 11 are disposed on or above the semiconductor light-emitting layer 11.

For the purpose of facilitating wiring connection, the transparent electrode 12 may be partly provided with the feeder electrode A14a as necessary.

The insulating substrate 7 is provided to achieve the following: to support the semiconductor light-emitting layer 11 to increase the mechanical strength of the semiconductor light-emitting layer 11; and to supply electrical power to the semiconductor light-emitting layer 11 via the pair of feeder electrodes A14a and B14b disposed on the upper surface of the solid-state light emitting device 3.

The insulating substrate 7 may be made from the same material as that of the heat-dissipating substrate 1 usable as the insulator board. Specifically, the insulating substrate 7 may be made from at least one material selected from a ceramic material, semiconductor material, and glass.

More specifically, the insulating substrate 7 may be made from one or more inorganic materials. Examples of the inorganic materials include: metal oxides, such as aluminum oxide, silicon oxide, glass, and various complex oxides (such as $Y_3Al_5O_{12}$); metal nitrides, such as aluminum nitride and silicon nitride); and silicon carbides.

The reflective layer 10 is provided to reflect light emitted by the semiconductor light-emitting layer 11 toward the insulating substrate 7, thereby improving the light-extraction efficiency of the upper surface of the solid-state light emitting device 3 that constitutes the main light-extracting surface.

The reflective layer 10 may be made a thick film (thickness of 1 μm or more but less than 1 mm or so) or a thin film (thickness of 10 nm or more but less than 1 μm or so) of any of: the same metal as the conductor X (for example, Au, Ag, Cu, Pt, Pd, Zn, Ni, Ti, Zr, Hf, V, Nb, Ta, Cr, Mo, W, Rh, Ir, Al, Sn, Si or Fe), an alloy of these metals, a silicide of these metals, any of the above-mentioned conductive compounds (such as TiN and TaN). Alternatively, the reflective layer 10 may be made a thick film (thickness of 1 μm or more but less than 1 mm or so) of inorganic compound powder having a white body color (such as $BaSO_4$, $TiO_2$, $Al_2O_3$, $SO_2$, or MgO) or a mixture of the inorganic compound powders.

Note that the reflective layer 10 is not limited to the specific examples described above as long as the reflectance of visible light (light within the wavelength region of 380-780 nm) is high (for example, the reflectance at room temperature is 70% or higher, and preferably 80% or higher.

Preferably, the reflective layer 10 contains at least one of the above-mentioned metals, alloy and silicide.

The reflective layer 10 as described above has a relatively high thermal conductivity and thus heat generated by the semiconductor light-emitting layer 11 during operation of the solid-state light emitting device 3 is released at a high heat transfer rate to the insulating substrate 7.

In addition, in the case where the reflective layer 10 is conductive, the reflective layer 10 may be used commonly as a feeder electrode.

The semiconductor light-emitting layer 11 is a multilayered structure that emits light (injection electroluminescence or intrinsic electroluminescence) in response to power supply. The semiconductor light-emitting layer 11 at least includes a layer of inorganic or organic semiconductor.

One example of a multilayered structure that emits injection electroluminescence is a laminate of p- and n-type semiconductor layers which may be inorganic or organic. Examples of preferable inorganic semiconductors include group IV compound semiconductor (such as SiC), group III-V compound semiconductor (such as InGaN-based compound), group II-VI compound semiconductor (such as ZnSSe-based compound or ZnO).

On the other hand, one example of a multilayered structure that emits intrinsic electroluminescence is a structure at least having a layer of inorganic phosphor (especially, wide bandgap semiconductor). One example of the inorganic phosphor is a phosphor whose base phosphor is sulfide (such as ZnS, CaS, SrS, $SrGa_2S_4$, $BaAl_2S_4$) added with an activator.

Note that the manufacturing of the solid-state light emitting device that emits intrinsic electroluminescence is not described herein since it is disclosed in JP patent No. 2840185, for example.

The transparent electrode 12 is used to supply electrical power to the semiconductor light-emitting layer 11 and also to extract the emission light of the semiconductor light-emitting layer 11 as the primary light 15 to the outside the solid-state light emitting device 3. The transparent electrode 12 is made from a semitransparent metal (such as Au) or the above-mentioned transparent conductive materials (such as In—Sn—O, ZnO:Al, and $TiO_2$:Nb).

The feeder electrodes A14a and B14b of the semiconductor light-emitting layer 11 play the role of electric terminals that supply electrical power. Usually, the feeder electrodes A14a and B14b are constructed of the same metal as the conductor X.

Upon application of direct voltage, alternating voltage, or pulse voltage to the feeder electrodes A14a and B14b of the solid-state light emitting device 3 of the above construction, current flows into the semiconductor light-emitting layer 11 to supply electrical power.

The electrical power supplied to the semiconductor light-emitting layer 11 is converted into light through the electric-optic conversion by the multilayered structure at least including a layer of inorganic or organic semiconductor. The resultant light exits as the primary light 15 from the solid-state light emitting device 3 via the transparent component member (the transparent electrode 12 or a transparent substrate).

The solid-state light emitting device 3 described above may be made by the following manufacturing method.

(1) On a single crystal substrate (such as sapphire, SiC, GaN, Si, or $Y_3Al_5O_{12}$), single crystal thin films of an n-type InGaN-based compound and of a p-type InGaN-based compound are grown by the epitaxial crystal technique. Then, a metal film is deposited to constitute the reflective layer 10. As a result, a light-emitting structure is formed.

(2) In a separate manufacturing step from the above step, a metal film similar to the above is formed on a substrate such as Si, SiC, or AlN. As a result, a supporting structure is formed.

(3) The light-emitting structure formed in the above step (1) and the supporting structure formed in the above step (2) are joined together by bonding the two metal layers of the respective structures. The bonding may be made via a bonding layer having a thickness of 10 nm or more but less than 1000 nm and made of an alloy (such as Au—Sn or Ag—Sn and), a metal (such as Mo or Ti), or a compound (such as $SiO_2$, $Si_3N_4$, $HfO_2$, or TiN).

(4) After the bonding, the single crystal substrate is removed by conducting a physical, chemical, or mechanical process to obtain a structure composed of the supporting structure and the light-emitting structure fixed to the supporting structure. Then, the feeder electrodes A14*a* and B14*b* are constructed from Au to complete the solid-state light emitting device 3.

Exemplary Configuration 2 of Solid-State Light Emitting Device 3

FIG. 3 shows another exemplary configuration of the solid-state light emitting device 3 is according to the present invention the solid-state light emitting device 3. In this example, the semiconductor light-emitting layer 11 is disposed above the conductive substrate 8 and the reflective layer 10 is disposed below the semiconductor light-emitting layer 11. In addition, the feeder electrode B14*b* is disposed on the rear surface of the solid-state light emitting device 3.

Regarding the construction in the vicinity of the light extracting surface, the transparent electrode 12 may be omitted, as shown in FIG. 3. Instead, part of the semiconductor light-emitting layer 11 may be configured to act as the transparent electrode 12.

In addition, the reflective layer 10 may be disposed between the semiconductor light-emitting layer 11 and the conductive substrate 8, as shown in FIG. 3. Alternatively, the reflective layer 10 may be disposed between the conductive substrate 8 and the feeder electrode B14*b*.

The conductive substrate 8 is provided to achieve the following: to support the semiconductor light-emitting layer 11 to increase the mechanical strength of the semiconductor light-emitting layer 11; and to supply electrical power to the semiconductor light-emitting layer 11 via the pair of feeder electrodes A14*a* and B14*b* that are disposed one on the top surface and the other at the rear surface of the solid-state light emitting device 3.

The conductive substrate 8 may be made from at least one material selected from metals or semiconductor materials. Examples of the semiconductor material include gallium nitride, silicon carbide, and silicon.

In the case of configuring the solid-state light emitting device 3 to emit the injection electroluminescence, the reflective layer 10 needs to be conductive to allow injection of electrons and holes into the semiconductor light-emitting layer 11. The reflective layer 10 may be a thick or thin film of a material selected from the above-mentioned metals (such as Au, Ag, Cu, Pt, Pd, Zn, Ni, Ti, Zr, Hf, V, Nb, Ta, Cr, Mo, W, Rh, Ir, Al, Sn, Si, and Fe), an alloy of any of the metals, and a silicide of any of the metals.

The rest of component members are the same as those described with reference to FIG. 2, so that the description thereof is omitted.

Upon application of direct voltage, alternating voltage, or pulse voltage to the feeder electrodes A14*a* and B14*b*, one of which is disposed on the upper surface and the other on the rear surface of the solid-state light emitting device 3 of the above construction, current flows into the semiconductor light-emitting layer 11 to supply electrical power.

The electrical power supplied to the semiconductor light-emitting layer 11 is converted into light through the action of electric-optic conversion by the multilayered structure. The resultant light exits as the primary light 15 from the solid-state light emitting device 3 via the transparent component members (the transparent electrode 12 and the conductive substrate 8 if it is transparent).

The solid-state light emitting device 3 shown in FIG. 3 may be made by the same manufacturing method as that of the solid-state light emitting device 3 shown in FIG. 2.

As shown in FIG. 3, one of the pair of feeder electrodes (i.e., the feeder electrode B14*b*) is disposed on the rear surface of the solid-state light emitting device 3, the size of the light extracting surface from which the primary light 15 is emitted is made relatively large, which is preferable to obtain a high-power semiconductor light emitting apparatus.

Exemplary Configuration 3 of Solid-State Light Emitting Device 3

FIG. 4 shows a yet another exemplary configuration of the solid-state light emitting device 3. In this example, the semiconductor light-emitting layer 11 is disposed below the conductive substrate 8. The feeder electrode B14*b* is disposed on the rear surface of the solid-state light emitting device 3, whereas the feeder electrode A14*a* is disposed on or above the conductive substrate 8. In addition, the conductive substrate 8 in this example is transparent.

Note, however, that the reflective layer 10 may be disposed below the semiconductor light-emitting layer 11 and the feeder electrode B14*b* may be configured to double as the reflective layer 10.

The conductive substrate 8 is provided to achieve the following: to support the semiconductor light-emitting layer 11 to increase the mechanical strength of the semiconductor light-emitting layer 11; to supply electrical power to the semiconductor light-emitting layer 11 via the pair of feeder electrodes A14*a* and B14*b* disposed one on the top surface and the other at the rear surface of the solid-state light emitting device 3; and to extract light emitted by the semiconductor light-emitting layer 11 as the primary light 15 to the outside of the solid-state light emitting device 3.

The conductive substrate 8 may be made from a semiconductor material, such as gallium nitride or silicon carbide.

In the case of configuring the solid-state light emitting device 3 to emit the injection electroluminescence, the reflective layer 10 needs to be conductive as described with reference to FIG. 3 to allow injection of electrons and holes into the semiconductor light-emitting layer 11. The reflective layer 10 may be a thick or thin film of a material selected from the above-mentioned metals, an alloy of any of the metals, and a silicide of any of the metals.

The rest of component members are the same as those described with reference to FIG. 2, so that the description thereof is omitted.

Further, the operations of the solid-state light emitting device 3 are the same as those described with reference to FIG. 3, so that the description thereof is omitted.

The solid-state light emitting device 3 shown in FIG. 4 may be made by the following manufacturing method. First, on a conductive single crystal semiconductor substrate (such as SiC or GaN), single crystal thin films of n-type and of p-type semiconductors are grown by the epitaxial crystal technique. Then, the feeder electrode B14*b* that commonly acts as the reflective layer 10 is formed. Finally, the feeder electrode A14*a* is formed on the other surface of the single crystal semiconductor substrate, than the surface on which the single crystal thin films are formed.

Similarly to the solid-state light emitting device shown in FIG. 3, the solid-state light emitting device 3 with the above construction ensures that the light extracting surface for the primary light 15 is relatively large. In addition, the semiconductor light-emitting layer 11 that functions as a heat generating portion is located near the surface of the heat-dissipating substrate 1 on which the solid-state light emitting device 3 is mounted. That is, this configuration shown in FIG. 4 is preferable for releasing heat of the semiconductor light-emitting layer 11 relatively effectively.

The solid-state light emitting device having the configuration shown in FIG. 4 is a solid-state light emitting device known as a "flip-chip with top-rear electrode configuration".

Exemplary Configuration 4 of Solid-State Light Emitting Device 3

FIG. 5 shows a yet another exemplary configuration of the solid-state light emitting device 3. In this example, the semiconductor light-emitting layer 11 is disposed below the transparent substrate 9, and the feeder electrodes A14a and B14b are both disposed on the rear surface of the solid-state light emitting device 3.

The transparent substrate 9 is provided to achieve the following: to support the semiconductor light-emitting layer 11 to increase the mechanical strength of the semiconductor light-emitting layer 11; to supply electrical power to the semiconductor light-emitting layer 11 via the pair of feeder electrodes A14a and B14b both disposed on the rear surface of the solid-state light emitting device 3; and to extract light emitted by the semiconductor light-emitting layer 11 as the primary light 15 to the outside of the solid-state light emitting device 3.

The transparent substrate 9 may be made from a semiconductor material, such as gallium nitride or silicon carbide, or from an insulator material, such as a metal oxide (for example, aluminum oxide, silicon oxide, or glass).

The rest of component members are the same as those described with reference to FIG. 2, so that the description thereof is omitted.

Upon application of direct voltage, alternating voltage, or pulse voltage to the feeder electrodes A14a and B14b of the solid-state light emitting device 3a of the above construction, current flows into the semiconductor light-emitting layer 11 to supply electrical power.

The electrical power supplied to the semiconductor light-emitting layer 11 is converted into light through the action of electric-optic conversion by the multilayered structure at least having a layer of inorganic or organic semiconductor. The resultant light exits as the primary light from the solid-state light emitting device 3 via the transparent substrate 9.

The solid-state light emitting device having the configuration shown in FIG. 5 is a solid-state light emitting device known as a "flip-chip with dual bottom electrode configuration".

Wavelength Converter 4

The wavelength converter 4 is an optic-optic converter that converts light (primary light 15) emitted by the solid-state light emitting device 3 into light having loner-wavelength. The wavelength converter 4 is a structure at least containing an inorganic photoluminescence phosphor (that meets the practical level of performance, hereinafter simply "phosphor 17").

Note that an inorganic phosphor is preferable as the wavelength converter 4 because of the excellent chemical stability at relatively high temperatures from 100° C. to 200° C., which increases the reliability of wavelength converter 4.

As the wavelength converter 4, it is preferable to avoid using a resin phosphor layer. The wavelength converter 4 preferably is a compact containing inorganic phosphor, and more preferably is a plate-like resin phosphor screen.

With any of the above configurations, it is relatively easy to manufacture the wavelength converter 4 having high reliability.

Especially, the plate-like resin phosphor screen is easy to handle, which is helpful to simplify manufacturing steps of the semiconductor light emitting apparatus.

In addition, it possible to manufacture the wavelength converter 4 in separate steps in advance, which makes it easier to manage the risk associated with manufacturing loss.

It is preferable that the compact containing the inorganic phosphor is either of a transparent phosphor ceramics, phosphor glass, phosphor composite ceramics (i.e., the MGC optical converter mentioned above).

The above-mentioned compacts are all technically tried-and-true compacts or of a comparable level and all inorganic. With these characteristics, the compacts have an excellent thermal conductivity and thus serve to suppress the temperature rise of the wavelength converter 4.

Note that it is also preferable to use a wavelength converter having: a transparent substrate made of an inorganic material; and a wavelength conversion layer containing at least an inorganic phosphor.

With such a wavelength converter, the phosphor layer is the only portion that generates heat at the time of wavelength conversion. When being made from an inorganic material, the transparent substrate functions as a good heat dissipator having a good thermal conductivity. Thus, the temperature rise of the wavelength converter is duly suppressed.

Note that examples of preferable wavelength converters mentioned above include: a wavelength converter having a transparent substrate and an inorganic compact containing an inorganic phosphor fixed to the substrate; and a wavelength converter having a transparent substrate having a portion configured to function as a wavelength conversion layer containing an inorganic phosphor.

The following describes preferred embodiments of the wavelength converter 4 according to the present invention. The following also describes exemplary configurations of the phosphor 17 (especially, inorganic phosphor) used in the wavelength converter 4, as well as exemplary configurations of the wavelength converter 4 at least having the wavelength conversion layer 4a.

Note that the other description of the wavelength converter 4, such as the location will be described later.

Embodiments of Wavelength Converter 4

First, the following describes an embodiment of the wavelength converter 4 according to the present invention, by making reference to the temperature rise of the wavelength conversion layer 4a (which is a phenomenon arising from energy loss (Stokes loss) associated with wavelength conversion).

Although details are not given here, based on theoretical consideration, the temperature rise of the wavelength conversion layer 4a included in the wavelength converter 4 is given by the following mathematical expression [Math. 1].

$$\Delta T[K] = (W_{loss}[W] \times t[m])/(\rho[W/m \cdot K] \times S[m^2])$$ [Math. 1]

where, $\Delta T$ is the temperature rise of the wavelength conversion layer 4a, $W_{loss}[W]$ is the energy consumption of the wavelength conversion layer 4a, $t[m]$ is the thickness of the wavelength conversion layer 4a, $\rho[W/m \cdot K]$ is the thermal conductivity of the wavelength conversion layer 4a, and $S[m^2]$ is the incident area of the primary light on the wavelength conversion layer 4a.

With reference to [Math. 1], the following properties are of preferable for the wavelength conversion layer 4a for suppressing the temperature rise caused in response to the energy loss associated with the wavelength conversion.

(a) $W_{loss}[W]$ (the energy consumption of the wavelength conversion layer 4a) is low;

(b) t (the thickness of the wavelength conversion layer 4a) is small;

(c) $\rho$ (the thermal conductivity of the wavelength conversion layer 4a) is high; and (d) S (the incident area of, the primary light on the wavelength conversion layer 4a) is large.

Consider, for example, that a white LED light source is composed of a blue LED and a yellow phosphor emits light having a correlated color temperature at about 5000 K. In the case of this white LED light source, about 10% to 30% of the optical energy of the primary light emitted by the blue LED is consumed into heat.

In one example, consider a white LED light source having a phosphor layer prepared by dispersing phosphor powder in a transparent resin. In the case of this white LED light source, the thermal conductivity of the transparent resin is 0.1-0.5 W/mK, which is lower than that of an inorganic material, by one to two orders of magnitude. Due to this low thermal conductivity, the temperature rise is large, so that there is a risk that the temperature of the LED chip may be elevated to exceed 100° C. even with a relatively low input power.

As a result, the temperature of the wavelength conversion layer 4a reaches a range that is well beyond 150° C. At such a high temperature, the temperature quenching of phosphor is no longer negligible.

In order to provide a semiconductor light emitting apparatus usable as a high-power output point light source, the wavelength converter 4 according to an embodiment of the present invention employs the wavelength conversion layer 4a having the following properties (a)-(c) to address the above-noted problems. Note that the property (d) relating to the incident area of the primary light is limited because of the purpose of providing a point light source.

The following describes the wavelength converter 4 provided with the wavelength conversion layer 4a having the properties (a)-(c).

For the reference purpose, the wavelength converter 4 provided with the wavelength conversion layer 4a having the property (d) is also described.

First, the following describes "the wavelength converter 4 provided with the wavelength conversion layer 4a having the property (a) that "$W_{loss}$ is low".

The wavelength conversion layer 4a having low $W_{loss}$ is obtained by following any of the following means (1)-(3) below. Note that the means (1) has been described above in the passages subheading "Solid-State Light Emitting Device 3".

(1) By employing a solid-state light emitting device 3 that emits primary light at a longest possible wavelength. With such a solid-state light emitting device, the energy difference between absorption and emission of the wavelength conversion layer 4a is minimized.

(2) By employing a phosphor having a photon conversion efficiency (internal quantum efficiency) that is closer to theoretical limitation. With such a phosphor, the energy loss at the time of photon conversion is reduced.

Specifically, it is preferable to employ a phosphor the exhibits the internal quantum efficiency of 80% or higher, preferably 85% or higher, and more preferably 90% or higher, under excitation light emitted by the solid-state light emitting device 3.

The internal quantum efficiency can be evaluated with the evaluation technique of the quantum efficiency of phosphor disclosed in a document by Kazuaki OHKUBO et al. (Shomeigaku-Kaishi (Journal of the Illuminating Engineering Institute of Japan), 1999 Vol. 83, No. 2, pp. 87).

(3) By employing the wavelength converter 4 having such a wavelength conversion layer 4a that photon loss before and after wavelength conversion is small. With such a wavelength conversion layer, the photon absorption loss is made smaller. (That is, in the case of a resin film, a resin having an excellent light transmission is employed.)

Specifically, the photon conversion efficiency of the wavelength conversion layer 4a before and after wavelength conversion is preferably 70% or higher, more preferably 80% or higher, and still more preferably 90% or higher.

The photon conversion efficiency can be evaluated with, for example, the evaluation technique of the quantum efficiency of phosphor disclosed in the above-cited document by Kazuaki OHKUBO et al.

Now, the description is given to the property (b) that is "t (the thickness of the wavelength conversion layer 4a) is small".

The wavelength converter 4 provided with wavelength conversion layer 4a having a small thickness t is obtained by any of the following means (4)-(6) below.

(4) By employing a phosphor having a high external quantum efficiency under excitation at the peak wavelength of light emitted by the solid-state light emitting device 3. With such a phosphor, the wavelength conversion layer 4a of the wavelength converter 4 is ensured to have a large light absorption and a high wavelength conversion efficiency with respect to light emitted by the solid-state light emitting device 3.

To show the specific standards, the external quantum efficiency (absolute value) is preferably 80% or higher, more preferably 85% or higher, and still more preferably 90% or higher.

Consider, for example, that a solid-state light emitting device emits primary light having an emission peak in a blue wavelength region of 430 nm or longer but shorter than 475 nm. Examples of phosphors that may be combined with the above solid-state light emitting device include: a $Ce^{3+}$-activated phosphor having a garnet structure (especially, a YAG:Ce-based phosphor in which the amount of $Ce^{3+}$ ions substituting rare-earth ions (such as $Y^{3+}$) is from 0.001% to <5%); and a phosphor of a high-concentration $Eu^{2+}$-activated alkaline earth metal compound in which the amount of $Eu^{2+}$ ions substituting alkaline earth metal ions is from <2% to 100% (such as an orthosilicate phosphor, oxynitride silicate phosphor, or thiogallate phosphor).

(5) By employing a resin film having a high phosphor concentration (phosphor weight/(phosphor weight+resin weight)). Since phosphor acts as a light absorber, by constituting the wavelength conversion layer 4a of the wavelength converter 4 with such a resin film, the wavelength conversion layer 4a achieves a good light absorption property with respect to light emitted by the solid-state light emitting device 3.

To show the specific standards, the phosphor concentration is preferably in the range from 10 wt % to 80 wt %, and more preferably from 20 wt % to 70 wt %, in view of the balance with manufacturing of the phosphor layer.

(6) By employing an inorganic phosphor layer using transparent phosphor ceramics or phosphor powder. The wavelength conversion layer 4a made with such an inorganic phosphor layer contains substantially no other materials than phosphor that acts as light absorber and thus exhibits a good light absorption property.

A thinner wavelength conversion layer 4a is more and more preferable for suppressing the temperature rise. Yet, in view of the balance with the mechanical strength and handling easiness during manufacturing, the thickness of the wavelength converter 4 is preferably within the range from 10 µm to <2 mm, more preferably in the range of 10 µm to <300 µm, and still more preferably 10 µm to <100 µm.

The following now describes means to obtain the wavelength converter 4 having the property (c) described above, that is "ρ is high" as the.

In general, inorganic materials are higher in heat conductivity ρ than organic materials. In view of this fact, the means (5) described above as well as the means (7) described below are considered to work.

(7) By employing an inorganic phosphor layer or the like, such as transparent phosphor ceramics, phosphor glass, MGC optical converter, or phosphor powder each of which is already mentioned. This is to provide the wavelength conversion layer 4a that is substantially composed of an inorganic material having high heat conductivity ρ and containing substantially no organic material, which has low heat conductivity ρ.

Lastly, the following means (8)-(10) may be used to obtain "the wavelength conversion layer 4a having a large light incident area S", which is the above property (d).

(8) By securing an enough distance between the main light-extracting surface of the solid-state light emitting device 3 and the wavelength conversion layer 4a. This is to allow the primary light to arrive at the wavelength conversion layer 4a after being diffused to a certain extent.

(9) By employing a solid-state light emitting device having, as a light emitting face, a uniform or substantially uniform diffusing surface, rather than a solid-state light emitting device emitting highly directional light. In addition, by configuring the solid-state light emitting device so as not to make direct contact with the wavelength conversion layer 4a.

(10) By configuring the semiconductor light emitting apparatus to have a light diffuser between the solid-state light emitting device 3 and the wavelength converter 4. With the light diffuser scattering light emitted by the solid-state light emitting device 3, the primary light is diffused to irradiate the wavelength conversion layer 4a.

Phosphor 17 for Wavelength Conversion Layer 4a of Wavelength Converter 4

As described above, an inorganic phosphor is preferable as the phosphor 17 used for the wavelength conversion layer 4a of the wavelength converter 4. The following describes in details inorganic phosphors according to the present invention.

Examples of preferable inorganic phosphors include: inorganic phosphor that emits light in response to interband energy transfer of the semiconductor; inorganic phosphor that emits light caused by impurity ions acting as donor or acceptor in the semiconductor; and inorganic phosphor that emits light caused by localized center (inorganic phosphor that emits light in response to electron transition of transition metal ions or rare-earth ions). Examples include inorganic phosphors having rare-earth ions (such as $Ce^{3+}$, $Pr^{3+}$, $Nd^{3+}$, $Sm^{3+}$, $Eu^{3+}$, $Eu^{2+}$, $Tb^{3+}$, $Dy^{3+}$, $Ho^{3+}$, $Er^{3+}$, $Tm^{3+}$, $Yb^{3+}$, $Yb^{2+}$), transition metal ions (such as $Mn^{2+}$, $Mn^{4+}$, $Sb^{3+}$, $Sn^{2+}$, $Ti^{4+}$, $Tl^{+}$, $Pb^{2+}$, $Cu^{+}$, $Cr^{3+}$, $Fe^{3+}$) activated as a luminescent center.

Especially, an inorganic phosphor activated by at least one metal ion selected from $Ce^{3+}$, $Pr^{3+}$, $Eu^{3+}$, $Eu^{2+}$, $Tb^{3+}$, $Yb^{2+}$, and $Mn^{2+}$ is preferable. It is because such an inorganic phosphor tends to exhibit high photon conversion efficiency when excited by light within at least either of the wavelength regions, which are the violet region (from 380 nm to <420 nm) and the blue to blue-green region (from 420 nm to <510 nm).

Especially, inorganic phosphors having at least either of $Ce^{3+}$ and $Eu^{2+}$ rare-earth ions as luminescent centers are preferable. Such inorganic phosphors tend to exhibit high photon conversion efficiency when excited by light in the violet-blue green region from 380 nm to <510 nm, more preferably in the violet-blue region from 400 nm to <480 nm, and still more preferably the blue region from 430 nm to <475 nm.

As described in the "Wavelength Converter 4" section of this specification above, the following inorganic phosphors are preferable to suppress the temperature rise caused by the energy loss associated with wavelength conversion by the wavelength conversion layer 4a. That is, it is preferable to use inorganic phosphors having a good light absorption property with respect to the light emitted by the solid-state light emitting device 3 and having an internal quantum efficiency that is close to the theoretical limitation. That is, it is preferable to use the inorganic phosphors having a large external quantum efficiency (absolute value of 80% or higher) when excited by light at the peak wavelength of the light emitted by the solid-state light emitting device 3.

An inorganic phosphor having a high external quantum efficiency exhibits a high absorbance of the primary light and converts the primary light into longer wavelengths at the high photon conversion efficiency. Thus, when exposed to the primary light, the wavelength conversion layer 4a allows mote light to pass and exit in the radiation direction of the primary light.

For this reason, the thickness of the wavelength conversion layer 4a may be thinner and still sufficient to produce output light, especially white light, to which the primary light is added as one component by addictive color mixture. A thin wavelength conversion layer 4a is more preferable for suppressing the temperature rise.

Alternatively, it is sufficient to select an inorganic phosphor that is preferable for increasing the heat resistance of the wavelength converter 4 having the wavelength conversion layer 4a, rather than for suppressing the temperature rise of the wavelength conversion layer 4a.

That is, any heat-resistant inorganic phosphor preferable as a wavelength-converting material of the wavelength converter 4 has the following property. That is, the emission peak at the temperature of 150° C. is 70% or more of the emission peak at room temperature, when excited by the emission peak wavelength of the primary light.

Such an inorganic phosphor serves as a wavelength conversion substance that undergoes little or no decrease in the luminous efficacy at high temperature. Thus, the wavelength converter 4 having the wavelength conversion layer 4a is configured to be capable of producing optical output without suffering much from reduction caused by a temperature rise. Consequently, the semiconductor light emitting apparatus is configured to be capable of producing light output without suffering much from reduction caused by a temperature rise.

Based on the study and evaluations conducted by the present inventors, the inorganic phosphors described below are preferable as a heat-resistant and high-efficiency inorganic phosphor to be used as the wavelength conversion substance.

(1) $Ce^{3+}$-activated phosphor having a peak wavelength within the range from 500 nm to <565 nm and having a crystal structure of garnet.

(2) Nitride phosphor activated at least by either of $Eu^{2+}$ and $Ce^{3+}$ (such as nitride phosphor or oxynitride phosphor).

For the purpose readily obtaining white or whitish light in combination with the solid-state light emitting device 3 that emits blue light, a yellow phosphor (having an emission peak within a range from 550 nm to <600 nm) is preferable. Yellow is a complementary color of blue.

For the reference purpose, the following is specific examples of heat-resistant and high-efficiency inorganic phosphors that are excited by violet light (380 nm or longer but shorter than 420 nm) or blue light (420 nm or longer but shorter than 500 nm).

(1) $Y_3Al_5O_{12}:Ce^{3+}$-based yellow-green, phosphors (especially peak wavelength is 525 nm or longer but shorter than 560 nm or a low-concentration $Ce^{3+}$-activated phosphor with the amount of $Ce^{3+}$ ions substituting part of the rare-earth ions ($Y^{3+}$ or $Gd^{3+}$) constituting the base phosphor is within a range from 0.01 atomic % to 1 atomic %);

(2) $BaY_2SiAl_4O_{12}:Ce^{3+}$-based green phosphors;

(3) $Ca_3Sc_2Si_3O_{12}:Ce^{3+}$-based green phosphor (including phosphors in which part of Ca or Sc is substituted by Mg);

(4) $MSi_2O_2N_2:Eu^{2+}$-based green/yellow phosphor (where M represents an alkaline earth metal);

(5) $M_3Si_6O_{12}N_2:Eu^{2+}$-based green phosphor (where M represents any of alkaline earth metals whose majority are Ba);

(6) $\beta$-$Si_3N_4:Eu^{2+}$-based green phosphor (including a phosphor in which part of Si—N is substituted by Al—O);

(7) Ca-a-SiAlON:$Eu^{2+}$-based yellow phosphor;

(8) $MAlSiN_3:Eu^{2+}$-based red phosphor (M represents an alkaline earth metal)

(9) $M_2(Al, Si)_5(N,O)_8:Eu^{2+}$-based red phosphor (M represents any of alkaline earth metals including $M_2Si_5N_8:Eu^{2+}$ red phosphor); and

(10) $BaMgAl_{10}O_{17}:Eu^{2+}$-based blue phosphor.

Of the among specific phosphors (1)-(10), a $Ce^{3+}$-activated phosphor is an inorganic phosphor excited by blue light, and all the $Eu^{2+}$-activated phosphors, except for (10), are inorganic phosphors excited by both violet and blue light at high efficiency. (Note that $Eu^{2+}$-activated phosphor of (10) is an inorganic phosphor not excited by blue light but by violet light at high efficiency).

Each inorganic phosphors (1)-(10) has the afterglow time ($t_{1/10}$) that is as short as 1 msec or less, because the light emission in such an inorganic phosphor is caused by the parity-allowed transitions of $Ce^{3+}$ or $Eu^{2+}$ ions, represented by $4f^n$–$4f^{n-1}5d^1$ (where, n=1 in the case of $Ce^{3+}$ ions and n=7 in the case of $Eu^{2+}$ ions).

By virtue of this property, the wavelength conversion layer 4a composed exclusively of an inorganic phosphor having either $Ce^{3+}$ or $Eu^{2+}$ rare-earth ions as luminescent centers is suitable for configuring the wavelength converter 4 (as well as a semiconductor light emitting apparatus having the wavelength converter 4) for a light source of an video display apparatus.

The form of inorganic phosphor is selectable from any generally known forms, including powder, sintered body, ceramic compact, and single crystal.

As will be describe below, one feature of the present invention is found in that the wavelength conversion substance constituting the wavelength conversion layer 4a of the wavelength converter 4. The wavelength conversion substance is selected from among a plurality of heat-resistant and high-efficiency inorganic phosphors and has: a specific composition and form; a garnet crystal structure; and activated by $Ce^{3+}$.

Wavelength Converter 4 (Reference Configuration of Wavelength Conversion Layer 4a)

Figure 6:
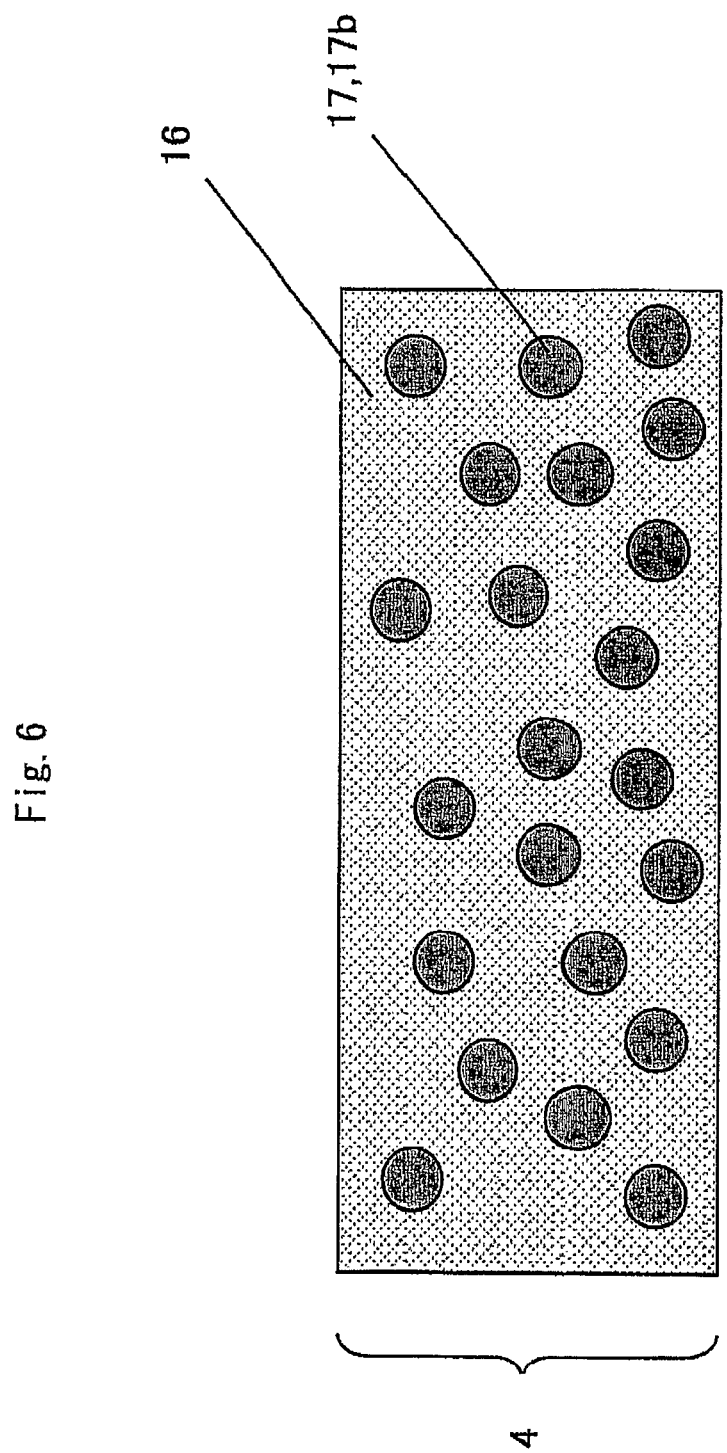
FIG. 6 is a cross-sectional side view showing a configuration of a conventional wavelength converter.

FIG. 6 shows, for the reference purpose, a conventional wavelength converter (and wavelength conversion layer). The conventional wavelength converter 4 shown in FIG. 6 is composed of a transparent host material 16 in which powder phosphor (phosphor particles 17b) are dispersed.

The transparent host material 16 is a transparent inorganic or organic material. Examples of organic materials include various transparent resins (such as silicon resin, fluororesin, epoxy resin and acrylic resin), whereas examples of inorganic materials include low-melting glass.

The particle size of the phosphor 17 in the powder form is 1 nm or larger but less than 1 mm. Specifically, the phosphor particles 17b are either of nanoparticles (in the range from 1 nm to <10 nm), ultrafine particles (in the range from 10 nm to <100 nm), small particles (in the range from 100 nm to <100 μm) and grains (in the range from 100 μm to <1 mm).

Note that the term "particle size" refers to an average or median particle diameter ($D_{50}$) that is generally described in catalogs of powder products, along with the measurement method used. For the sake of convenience, the average size is used to describe the size of particles having the diameter smaller than 100 nm, whereas the median size is used to describe the size of particles having the diameter equal to 100 nm or larger.

The wavelength converter 4 having the configuration shown in FIG. 6 is preferable in practice because this configuration is manufactured with a simple and easy manufacturing method and is field-proven.

Exemplary Configurations 1 and 2 of Wavelength Converter 4

Figure 7:
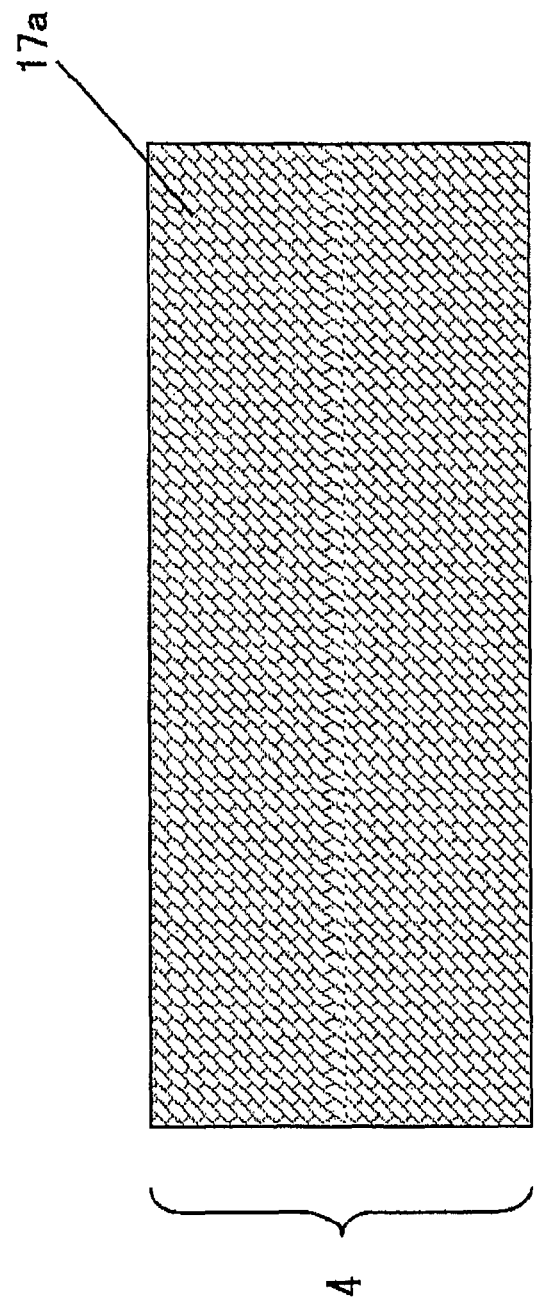
FIG. 7 is a cross-sectional side view showing an exemplary configuration of a wavelength converter according to the present invention.

FIG. 7 shows one exemplary configuration of the wavelength converter 4 (or the wavelength conversion layer 4a) according to the present invention. In this example, the phosphor 17 is an inorganic compact (hereinafter, a "phosphor compact 17a").

Examples of the phosphor compact 17a include various compacts known with the designations such as a sintered body of phosphor powder, transparent phosphor ceramics, phosphor glass, and phosphor single crystal. According to the present invention, the scope of the phosphor compact 17a encompass a compact of composite of phosphor and ceramic material. The MGC optical converter mentioned above is one example of a composite compact.

The wavelength converter 4 having the configuration shown in FIG. 7 may be a wavelength converter that is totally inorganic, which ensures a high thermal conductivity. This configuration is preferable in view of the heat dissipation and for suppressing the temperature rise of the wavelength converter 4.

In view of the handleability, the phosphor compact 17a is preferably 0.1 mm or thicker but thinner than 1 cm at the thinnest portion to provide an excellent mechanical strength.

In view of the effect of suppressing the temperature rise and color unevenness of the wavelength converter, it is preferable that the phosphor compact 17a is as thin as possible.

In view of a trade-off between the above two aspects, the phosphor compact 17a according to the present invention is configured to have the smallest thickness within the range from 10 μm to <1 mm, preferably from 10 μm to <600 μm, and more preferably 30 μm to <100 μm.

Yet, with an increase in the thickness of the phosphor compact 17a, the optical path of the primary light becomes longer. Thus, the absorption probability of light by the phosphor increase, which reduces the transmission of the primary light. In order to avoid this undesirable consequences, the concentration (substitution amount) of the activator (luminescent center ions) present in the phosphor and serving as a light absorption factor preferably falls within the range from 0.01 atomic to 1 atomic %, so that a relatively high external quantum efficiency is ensured. This concentration is lower by one to two orders of magnitude than a typical concentration (from 0.1 atomic % to <10 atomic %).

For example, in the case of the $Y_3Al_5O_{12}:Ce^{3+}$-based yellow-green phosphor mentioned above, it is preferable that the phosphor is activated by a low concentration $Ce^{3+}$ with the substitution amount of $Ce^{3+}$ ions falling with in the range from 0.01 atomic % to <1 atomic %.

Suppose that an constituent element group A is composed of one or elements selected from the group consisting of Mg, Ca, Sr, Ba, Y, La, Gd, Tb, and Lu. The phosphor at least contains all the elements of the constituent element group A, part of the constituent element group A is substituted by $Ce^{3+}$, and has a crystal structure of garnet. In order to ensure high heat-resistance and small temperature quenching, it is preferable more and more preferable that the substitution amount of $Ce^{3+}$ ions is smaller and thus concentration of $Ce^{3+}$ activating the phosphor is smaller. Such a preferable phosphor is desirable to improve the light output.

It should be noted, however, with the decrease of the concentration of $Ce^{3+}$ activating the phosphor, the wavelength of emission peak shifts to shorter wavelengths, which results in greenish emission light. In order to avoid this undesirable consequences, it is preferable regarding the $Y_3Al_5O_{12}:Ce^{3+}$-based yellow-green phosphor to substitute part of Y by Gd. As a result, the peak wavelength shifts to longer wavelengths, so that yellowish emission light is produced. Further, it is preferable to coactivate the $Y_3Al_5O_{12}:Ce^{3+}$-based yellow-green phosphor by $Pr^{3+}$ as luminescent center ions, so that a red light component is added to result in yellowish emission light.

Note that details are given later of the preferable ranges of the amount $Ce^{3+}$ of added to activate $Y_3Al_5O_{12}:Ce^{3+}$-based yellow-green phosphor, the thickness of the phosphor compact 17a, and the substitution amount of $Gd^{3+}$, with reference to experimental data.

Figure 8:
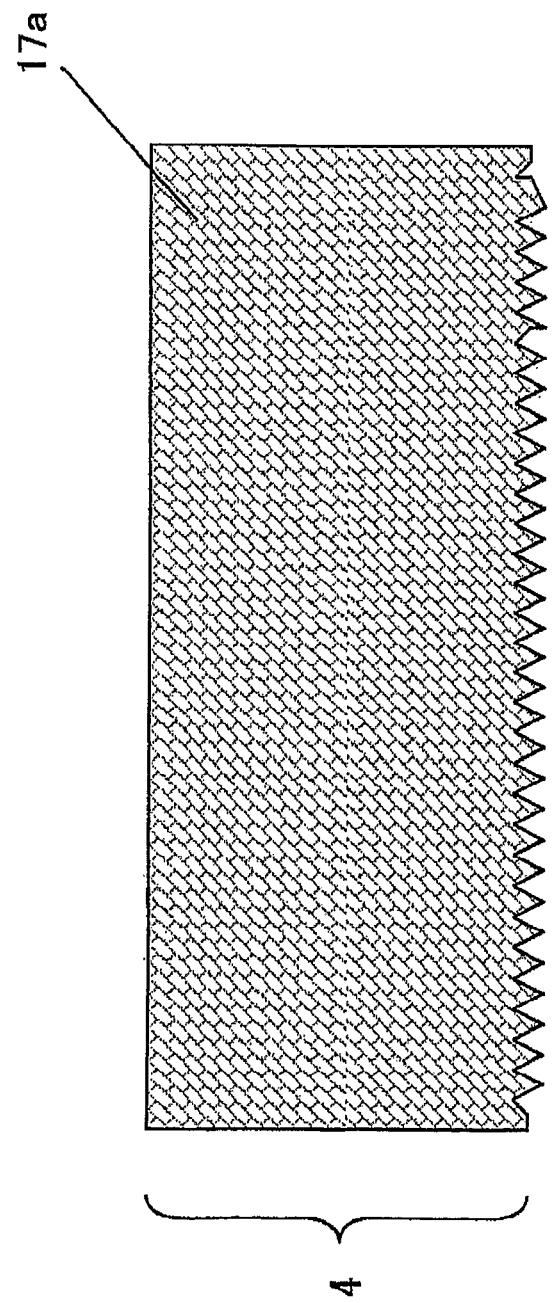
FIG. 8 is a cross-sectional side view showing another exemplary configuration of the wavelength converter according to the present invention.

As shown in FIG. 8, in one example, at least one surface of the wavelength conversion layer 4a of the wavelength converter 4 is profiled by applying a surface treatment. The profiled surface may have the roughness of about height difference of 10 nm or more but less than 1 mm.

The surface having the above-described profile may be a surface roughened with the use of a chemical agent, or of photonic crystal composed of regularly arranged constituents of the wavelength converter 4. Alternatively, micro-lenses may be formed on the wavelength converter 4 to obtain the desirable surface profile.

The wavelength converter 4 of this configuration is preferable in that the light-extraction efficiency is improved and the emission light of higher directivity is obtained.

An inorganic phosphor that is especially preferable for the wavelength convertor is a $Y_3Al_5O_{12}:Ce^{3+}$-based phosphor, This phosphor has excellent overall characteristics including the photon conversion efficiency, light transmittance, and temperature quenching. In addition, it is relatively easy to obtain and manufacture transparent phosphor ceramics, phosphor glass, or the MGC optical convertor.

Exemplary Configuration 3 of Wavelength Converter 4

Figure 9:
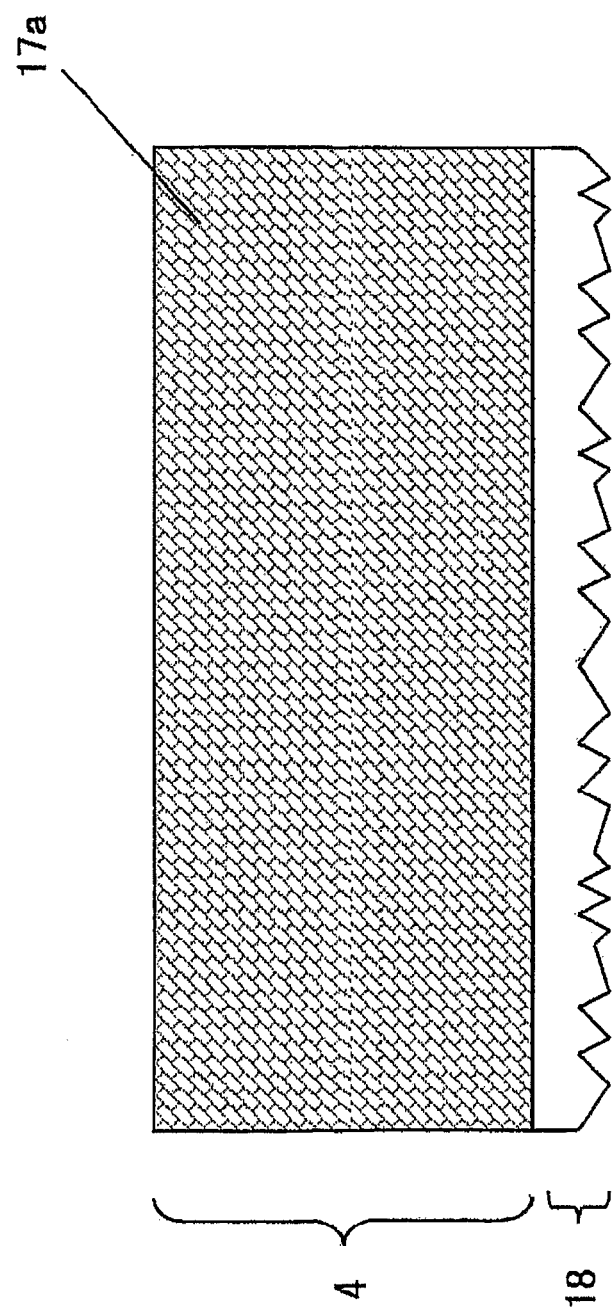
FIG. 9 is a cross-sectional side view showing yet another exemplary configuration of the wavelength converter according to the present invention.

FIG. 9 shows another exemplary configuration of the wavelength converter 4. In this example, the wavelength converter 4 has a light diffuser 18 (light scatterer) disposed on one surface of the phosphor compact 17a that constitutes the wavelength conversion layer 4a. Preferably, the light diffuser 18 is attached to the surface of the phosphor compact 17a with adhesive or by bonding.

The light diffuser 18 described above acts to sufficiently scatter the light entering the wavelength conversion layer 4a of the wavelength converter 4 (i.e., the primary light) and/or the light exiting from the wavelength conversion layer 4a (i.e., both or either of the primary light and the secondary light). Note that the term "secondary light" refers to the light obtained by converting the primary light.

Consider the case where the incoming light is highly directive primary light (such as LED light) emitted locally toward the wavelength converter 4. The incoming light passes through the light diffuser 18 before entering into the wavelength conversion layer 4a, so that the light is scattered and decreased in the directivity. Consequently, the incident area of the light on the wavelength conversion layer 4a is increased than otherwise it would be, which serves to suppress the temperature rise of the wavelength conversion layer 4a and to suppress the color unevenness of the mixture light of the primary light and the secondary light.

Consider the case where the wavelength conversion layer 4a outputs highly directive primary light (such as LED light). In this case, the light diffuser 18 is disposed at such a location that both the primary light and the secondary light pass through the light diffuser 18, so that the light is scattered and decreased in the directivity, which is desirable to suppress the color unevenness of the mixture of the primary light and the secondary light.

As shown in FIG. 9, the light diffuser 18 may be a structure having a rough surface with the height difference falling within the range from 10 nm to <1 mm so (such as ground glass). Alternatively, the light diffuser 18 may be a film containing transparent particles 19, although not shown in the figures. Examples of the transparent particles 19 include inorganic particles (such as alumina powder, and silica powder), and transparent resin powder (such as acryl). Preferably, the transparent particles 19 are spherical.

The light diffuser 18 may be bonded to the wavelength converter 4 with an inorganic/organic adhesive, for example.

Exemplary Configurations 4 and 5 of Configuration of Wavelength Converter 4

Figure 10:
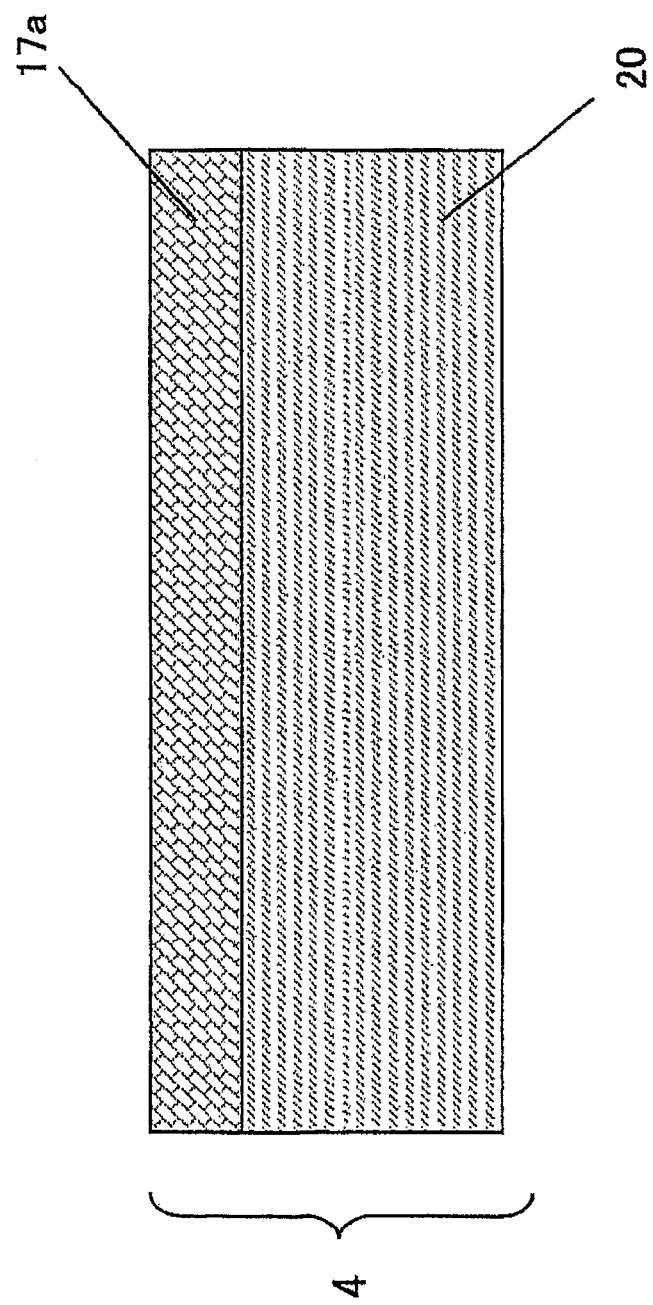
FIG. 10 is a cross-sectional side view showing yet another exemplary configuration of the wavelength converter according to the present invention.

FIG. 10 shows exemplary configurations of the wavelength converter 4 having the wavelength conversion layer 4a. As shown in FIG. 10, the wavelength converter 4 has a relatively thick transparent substrate 20 (such as glass, transparent ceramics, or acryl) disposed on at least one of surface of the phosphor compact 17a that constitutes the wavelength conversion layer 4a. The thickness may fall within the range from 0.1 mm to <10 mm or so.

Consider the case where the main material of the phosphor compact 17a (such as transparent phosphor ceramics) is a $Y_3Al_5O_{12}:Ce^{3+}$-based phosphor. With the typical amount of $Ce^{3+}$ added to activate the phosphor to render it suitable for a white LED (the amount of Ce substituting Y is within the range from 1 atomic % to 10 atomic %), the phosphor significantly absorbs blue light as described above. In view of this property, the transparent phosphor ceramics needs to be sufficiently thin to be able to allow blue light to transmit.

The thickness of such a phosphor is preferably within the range from 1 μm to <600 μm, and more preferably within the range from 10 μm to <600 μm. Due to such an extremely small thickness, the phosphor layer has low mechanical strength and prone to damage to damage.

The configuration shown in FIG. 10 addresses the aspects noted above. That is, the transparent substrate 20 supports the phosphor compact 17a to increase the mechanical strength of the wavelength conversion layer 4a included in the wavelength converter 4. Thus, despite the phosphor compact 17a being thin and low in the mechanical strength, the wavelength converter 4 is easy to handle.

In the case where only a limited portion of the phosphor compact 17a generates heat upon wavelength conversion and the transparent substrate 20 is made from an inorganic material (such as glass or transparent ceramics), the transparent substrate 20 acts as a good heat dissipater. Thus, the wavelength converter of this configuration is desirable to suppress the temperature rise of the wavelength conversion layer 4a, in addition to the above advantages.

Note that the wavelength converter 4 having the above configuration is manufactured by joining the phosphor compact 17a and the transparent substrate 20 with adhesive or by bonding. For example, an organic or inorganic adhesive (such as any of various resin adhesives or low-melting glass) may be used. In another example, a thermal reaction between the phosphor compact 17a and the transparent substrate 20 may be caused to achieve the bonding.

Figure 11:
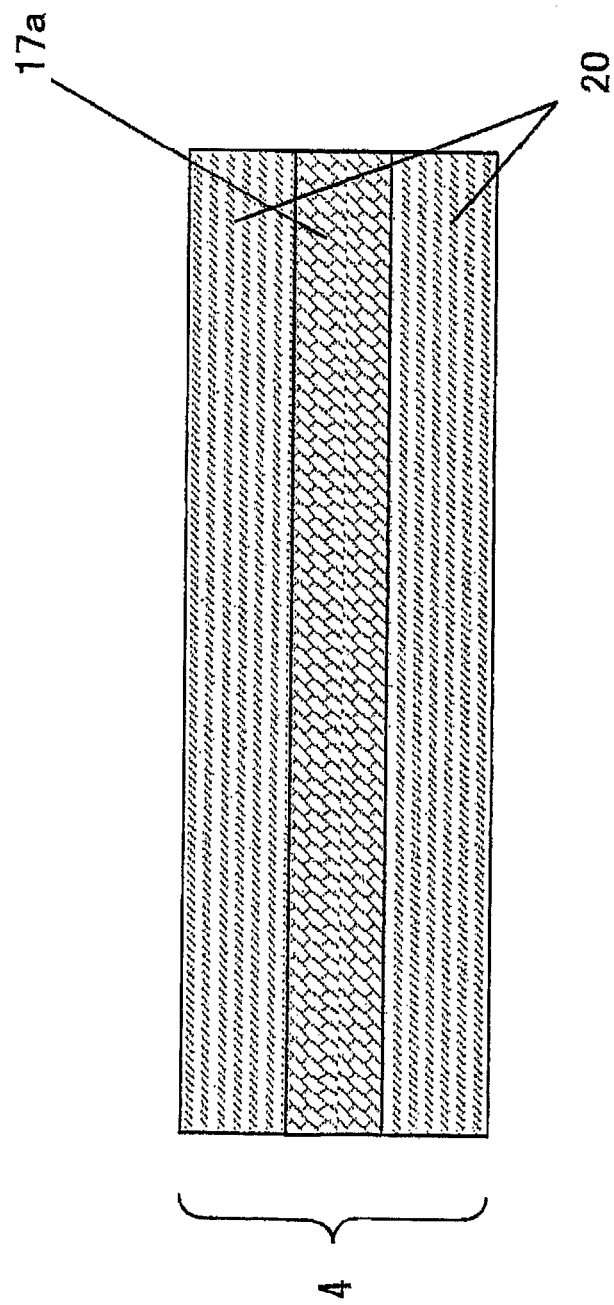
FIG. 11 is a cross-sectional side view showing yet another exemplary configuration of the wavelength converter according to the present invention.

In order to suppress distortion of the phosphor compact 17a that may occur due to the adhesion or bonding, a pair of transparent substrates 20 may be provided to sandwich the phosphor compact 17a therebetween, as shown in FIG. 11. Especially, it is preferable that the pair of transparent substrates 20 are identical in shape and thickens.

Further, in order to control the light distribution characteristics and to improve the light-extraction efficiency, one of the pair of transparent substrates 20 shown in FIG. 11 may be modified to have a dome-shaped surface defining a shape like a hemispherical lens.

Although not shown in the figures, the wavelength converter 4 may be modified as follows to improve the heat dissipation of the wavelength conversion layer 4a. That is, the transparent substrate 20 is disposed to make intimate contact additionally with at least one side surface of the wavelength conversion layer 4a, and more preferably with the entire side surfaces (i.e., the transparent substrate 20 is disposed to surround the wavelength conversion layer 4a).

Preferred Embodiment 1

The following is more detailed description, including description of the positional arrangement, of the solid-state light emitting device 3 and the wavelength converter 4 having the wavelength conversion layer 4a.

FIG. 12 is a cross-sectional side view of the exemplary semiconductor light emitting apparatus shown in FIG. 1, taken along the line A-A'.

As shown in FIG. 12, the semiconductor light emitting apparatus according to one embodiment of the present invention at least includes the solid-state light emitting device 3 and the wavelength converter 4. The wavelength converter 4 is an inorganic compact having the transparent wavelength conversion layer 4a. The wavelength conversion layer 4a at least contains an inorganic phosphor (not shown) that absorbs the primary light (not shown) emitted by the solid-state light emitting device 3 and emits light at a longer wavelength than the primary light. The thickness of the wavelength conversion layer 4a is 10 µm or more but less than 600 µm. The inorganic phosphor at least contains all the elements of the constituent element group A and part of the constituent element group A is substituted by $Ce^{3+}$ and has a garnet crystal structure. The constituent element group A is composed of one or more elements selected from the group consisting of Mg, Ca, Sr, Ba, Y, La, Gd, Tb, and Lu. The substitution amount of $Ce^{3+}$ for the Constituent element group A falls within the range of 0.01 atomic % to 1 atomic %, and more preferably from 0.01 atomic % to 0.5 atomic %. The substitution amount of $Gd^{3+}$ for the constituent element group A falls within the range of 50 atomic % to 30 atomic %, and more preferably less than 10 atomic %.

Preferably, Y and Gd are the main constituents of the constituent element group A of the garnet crystal structure (note it is defined that the "main" constituents occupy at least 70%, preferably at least 85%, and more preferably 100% of the entire constituent element group A). Preferably, in addition, the wavelength conversion layer 4a being in a state of a compact exhibits the absolute internal quantum efficiency of at least 85% or higher, and preferably 90% or higher at room temperature when excited by radiation of blue light at the wavelength of 450 nm.

The above configuration serves to suppress heat generation by the wavelength conversion layer 4a. In addition, the apparatus as well as the wavelength convertor are configured to conduct wavelength conversion at high efficiency and produce high-power output. That is, the above configuration serves to suppress the temperature rise of the wavelength conversion layer 4a caused by the energy loss associated with wavelength conversion. In addition, the above configuration serves to suppress the reduction of the optical output that would otherwise be caused as a result of employing an inorganic compact having the transparent' wavelength conversion layer 4a.

In addition, with the semiconductor light emitting apparatus according to the present invention, it is preferable that the wavelength converter 4 having the wavelength conversion layer 4a is disposed to make an intimate contact with the main light-extracting surface of the solid-state light emitting device, via a transparent adhesive substance (not shown).

With the above configuration, heat generated by the wavelength conversion layer 4a is conducted to the solid-state light emitting device 3 having a good thermal conductive property. Thus, although the heat generation by the wavelength conversion layer 4a increases with the increase of input power to the solid-state light emitting device 3, the heat is effectively released.

Further, with the semiconductor light emitting apparatus according to the present invention, it is preferable that the wavelength conversion layer 4a has such a profile that the outer counter conforms to the upper surface or main light-extracting surface (not shown) of the solid-state light emitting device 3. That is to say, the wavelength conversion layer 4a is placed into intimate contact with the main light-extracting surface.

With the above configuration, the size of the main light-extracting surface of the solid-state light emitting device 3 is made substantially equal to the size of the light-emitting surface of the semiconductor light emitting apparatus. Thus, a point light source that produces light with reduced color unevenness can be provided.

Further, with the semiconductor light emitting apparatus according to the present invention, the solid-state light emitting device 3 has a pair of feeder electrodes. The pair of feeder electrodes may be disposed both on either of the upper or rear surface of the solid-state light emitting device 3 or one on the upper surface and the other on the rear surface. In addition, the solid-state light emitting device 3 is disposed so that the entire rear surface (the surface opposite from light-extracting surface) intimately contacts with the heat dissipating body.

With this configuration, heat generated by the wavelength conversion layer 4a is conducted from the entire rear surface (mounting surface) of the solid-state light emitting device 3 at a uniform and high conduction rate to the high thermal conductor (such as the conductor A2a, the heat-dissipating substrate 1, and externally-attached heat dissipator (not shown)) disposed below the solid-state light emitting device 3. Thus, although the heat generation by the wavelength conversion layer 4a increases with the increase of input power to the solid-state light emitting device 3, the temperature rise of the wavelength conversion layer 4a is effectively suppressed.

In the manner above, the wavelength conversion layer 4a is permitted to release heat in the downward direction of the solid-state light emitting device 3 at an improved heat dissipating efficiency. This serves to suppress the decrease of light emission efficiency that would otherwise be caused as a result of the temperature rise of the wavelength conversion layer 4a.

With the configuration described above, in addition, the semiconductor light emitting apparatus is ensured to suppress both temperature quenching of the wavelength conversion layer 4a as well as color separation of the mixture light. As a consequence, the semiconductor light emitting apparatus is capable of producing light that is bright and of a uniform color.

As shown in FIG. 12, the semiconductor light emitting apparatus according to the present invention is configured such that the wavelength conversion layer 4a of the wavelength converter 4 is located at least above the main light-extracting surface (not shown) of the solid-state light emitting device 3. The wavelength converter 4 is configured to emit light at loner wavelengths than the primary light when excited by the primary light emitted by the solid-state light emitting device 3. This completes the semiconductor light emitting apparatus.

With the semiconductor light emitting apparatus according to the present invention, the primary light (not shown) emitted by the solid-state light emitting device 3 excites the inorganic phosphor contained in the wavelength conversion layer 4a. Thus, the output light 28 at least includes the secondary light converted by the wavelength conversion layer 4a.

The output light 28 may further include the primary light or a mixture light composed of color components of both the primary light and the secondary light (not shown).

With the semiconductor light emitting apparatus according to the present invention, the wavelength converter 4 is disposed to make an intimate contact at least with the main light-extracting surface of the solid-state light emitting device 3.

That is, the semiconductor light emitting apparatus according to the present invention employs, as the wavelength converter 4, a small piece of any material described in the earlier sections of this specification regarding the above-described wavelength converters 4. The wavelength converter 4 is formed and disposed so as to make intimate contact at least with the main light-extracting surface of the solid-state light emitting device 3. Preferably, the wavelength converter 4 is adhesively attached to the main light-extracting surface.

With the above arrangement, it is ensured that the light-exiting surface of the semiconductor light emitting apparatus is substantially equal in size to the main light-extracting surface of the solid-state light emitting device 3. Thus, all photons of the primary light 15 enter the wavelength converter 4 immediately at the moment the primary light 15 is emitted. This configuration is suitable for providing high-intensity point light source that is suitable for a vehicle headlight.

Conventionally, a semiconductor light emitting apparatus configured as the above point light source involves the fundamental problem as follows. That is, since light is made incident on a relatively small area of the wavelength conversion layer 4a of the wavelength converter 4, it is generally true that the wavelength conversion layer 4a tends to suffer from a temperature rise. As a result, the inorganic phosphor contained in the wavelength conversion layer 4a undergoes temperature quenching, which makes it difficult to ensure high power output.

In addition, there conventionally is another problem that an expected level of light output is failed to be obtained for unknown reasons.

According to the present invention, however, the wavelength converter 4 is a total inorganic wavelength converter (such as transparent phosphor ceramics) having a relatively high thermal conductivity. In addition, the wavelength converter 4 has the wavelength conversion layer 4a at least containing an inorganic phosphor that absorbs the primary light emitted by the solid-state light emitting device and emits light at longer wavelengths than the primary light. The wavelength conversion layer 4a is configured to have a thickness that ensures a high thermal conductivity and contains an inorganic phosphor (such as $Y_3Al_5O_{12}:Ce^{3+}$-based yellow-green phosphor mentioned above) that exhibits a high wavelength conversion efficiency and small temperature quenching. With the above features, this configuration of the wavelength convertor is capable of suppressing the heat generation and accumulation associated with wavelength conversion. Such generation and accumulation of heat undesirably serves as a factor to raise the temperature of the wavelength conversion layer 4a. In addition, this configuration of the wavelength convertor is preferable also to ensure the wavelength conversion at high efficiency and with little temperature quenching.

In one preferred embodiment, the semiconductor light emitting apparatus is configured to ensure, especially with the use of adhesive joining, a relatively good heat conduction path for releasing heat in the downward direction via the solid-state light emitting device 3 (solid-state light emitting devices are generally known to have high thermal conductivity). This congiruation of point light source serves to suppress the temperature rise of the wavelength conversion layer 4a and thus ensures high-power output.

Note that the wavelength converter 4 is adhesively attached to the main light-extracting surface of the solid-state light emitting device 3, with the use of an inorganic or organic transparent material as the adhesive. Examples of preferable adhesives include transparent resin adhesive (such as silicone-based resin adhesive) and low-melting inorganic adhesive (such as low-melting glass).

The adhesives mentioned above are readily available and prepared by conducting simple steps.

On the other hand, an adhesive 23 used to bond the solid-state light emitting device 3 to the heat dissipating body may be selected from various adhesives, including a resin adhesive (such as silicone-based resin adhesive) and an inorganic adhesive. The selection may be made in view of the configuration and the electrode arrangement of the solid-state light emitting device 3 as well as the property and material of the heat-dissipating substrate 1 (especially whether the heat-dissipating substrate 1 is insulating or conductive).

Examples of the inorganic adhesives include an insulative inorganic adhesive (such as low-melting glass, for example) and a conductive inorganic adhesive (such as metal paste (especially silver paste) or solder (such as Au—Sn or Ag—Sn)). The selection of a suitable adhesive may be made in view of the configuration and the electrode arrangement of the solid-state light emitting, device 3 as well as the property and material of the heat-dissipating substrate 1.

The use of adhesive 23 may be omitted in the following manner. That is, the conductor A2a and the feeder electrode may be made from the same metallic material (Au, for example), so that the conductor A2a may be physically bonded to the feeder electrode by applying external force such as pressure or supersonic vibration.

The semiconductor light emitting apparatus according to the present invention may have the solid-state light emitting device 3 with the "face-up with dual upper electrode configuration" as shown in FIG. 2. In this case, the adhesive 23 may be any of an insulative adhesive (such as the resin adhesive mentioned above and an insulative inorganic adhesive) and a conductive adhesive (such as a conductive inorganic adhesive), regardless of whether the heat-dissipating substrate 1 is an insulative or conductive board.

Further, the semiconductor light emitting apparatus according to the present invention may have the solid-state light emitting device 3 with the "top-rear electrode configuration" as shown in FIG. 3 or 4. In this case, the adhesive 23 needs to be a conductive adhesive (such as the conductive inorganic adhesive mentioned above) to electrically connect the conductor A2a to the feeder electrode B14b (not shown) of the solid-state light emitting device 3.

Further, the semiconductor light emitting apparatus according to the present invention may have the solid-state light emitting device 3 with the "flip-chip with dual bottom electrode configuration" as shown in FIG. 5. In this case, the adhesive 23 needs to be a conductive adhesive (such as the conductive inorganic adhesive mentioned above or bumps) to electrically connect the feeder electrode A14a to the conductor A2a and the feeder electrode B14b to the conductor B2b.

With the semiconductor light emitting apparatus according to the present invention, it is preferable that the wavelength conversion layer 4a constitutes the entire surface of the wavelength converter 4 when looking the light-exiting surface from above as shown in FIG. 1. It is also preferable that the wavelength converter 4 is disposed to at a location not coinciding with the electrode outlet portion 21 of the solid-state light emitting device 3 and to cover the main light-extracting surface.

The above configuration ensures that the entire portion of the primary light emitted from the main light-extracting surface enters the wavelength conversion layer 4a of the wavelength converter 4, while keeping the light output surface to a minimum size. Thus, the point light source is enabled to output light without color variations and output-power variations.

Further, it is preferable that the wavelength converter 4 has a substantially polygonal shape (i.e., the contour of the wavelength converter 4 defines a substantially polygonal shape) and at least one of the polygon corners is cut away, shaved, ground, or chamfered at least partly.

With this configuration, a manufacturing step of attaching the wavelength converter 4 can be more easily performed after the electric connection of the solid-state light emitting device 3 is made, which facilitates the manufacturing process. In addition, possible defects of the wavelength converter 4 and the solid-state light emitting device 3 can be checked before completing the semiconductor light emitting apparatus, which reduces the manufacturing loss.

As described earlier, the wavelength converter 4 at least includes the wavelength conversion layer 4a (the phosphor compact 17a) and the transparent substrate 20. The wavelength conversion layer 4a conducts wavelength conversion of the primary light, whereas and the transparent substrate 20 supports the wavelength conversion layer 4a but does not conduct wavelength conversion. Here, it is preferable that the transparent substrate 20 is larger in volume than the wavelength conversion layer 4a.

With the above configuration, the wavelength converter 4 is ensured to have a certain thickness, which renders the wavelength converter 4 easy to handle and less prone to thermal distortion.

In addition, because the wavelength conversion layer 4a is thin and the transparent substrate 20 acts as a good heat dissipater, accumulation of heat on the wavelength converter 4 is suppressed, which serves to reduce the temperature rise. With this wavelength converter 4, the semiconductor light emitting apparatus is configured to produce high-power output.

It is preferable that the wavelength converter 4 has a pair of transparent substrates 20 disposed to sandwich the wavelength conversion layer 4a.

With this configuration, the wavelength converter 4 produces heat at both of the upper and rear surfaces rather than at only one of them. Thus, the wavelength converter 4 is made more resistant against heat distortion.

In addition, both the upper and rear surfaces of the wavelength conversion layer 4a are in contact with one of the transparent substrates 20 having a high thermal conductivity and thus act as a heat dissipater. Consequently, the heat dissipating efficiency of the wavelength conversion layer 4a, which acts as a heat generating source, is nearly doubled to more effectively suppress the temperature rise. With this wavelength converter 4, the semiconductor light emitting apparatus is configured to produce high-power output.

It is also preferable that the adhesive substance mentioned above is a resin at least containing inorganic particles.

In general, inorganic materials have a high thermal conductivity. Thus, even with a resin, which is generally known to have a low thermal conductivity, the adhesive substance of a relatively high thermal conductivity is obtained.

It is noted, in addition, that the inorganic particles have the light diffusing function and thus serve to suppress unevenness of the color of emission light.

The inorganic particles may contain phosphor particles that absorb the primary light and emit light at longer wavelengths than the primary light. With this arrangement, the color tone of the output light is adjusted to some extent.

The following describes, with reference to experimental data, the preferable ranges of the thickness of the phosphor compact 17a, the addition amount of $Ce^{3+}$ and the substitution amount of $Gd^{3+}$ contained in the transparent phosphor ceramics according to the present invention. The transparent phosphor ceramics according to the present invention contains a $Y_3Al_5O_{12}:Ce^{3+}$-based yellow-green phosphor, which is a representative example of a phosphor that has a garnet crystal structure, contains the elements of the constituent element group A, and part of the constituent element group A is substituted by $Ce^{3+}$.

FIG. 18 is a table showing measurement data on a plurality of white LEDs. Each white LED includes a blue light emitting diode having a light emission layer composed of an InGaN-based compound (emission peak at 450 nm) and a different type of $Y_3Al_5O_{12}:Ce^{3+}$-based transparent phosphor ceramics. Each white LED emits white light as a result of adding and mixing the blue light emitted by the blue light emitting diode and yellow green light emitted by the transparent phosphor ceramics. Specifically, the table shows the $Ce^{3+}$ substitution amount and $Gd^+$ substitution amount of each type of $Y_3Al_5O_{12}:Ce^{3+}$ phosphor, the thickness of each phosphor ceramics (formed into a plate-like shape), the chromaticity (x and y) and color temperature of the emission light of each white LED.

Note that when each $Y_3Al_5O_{12}:Ce^{3+}$-based phosphor is expressed by the chemical formula: $(Y_{1-a-x}Gd_aCe_x)_3Al_5O_{12}$, the $Ce^{3+}$ substitution amount refers to the value of "x" and the $Gd^{3+}$ substitution amount refers to the value of "a".

Figure 19:
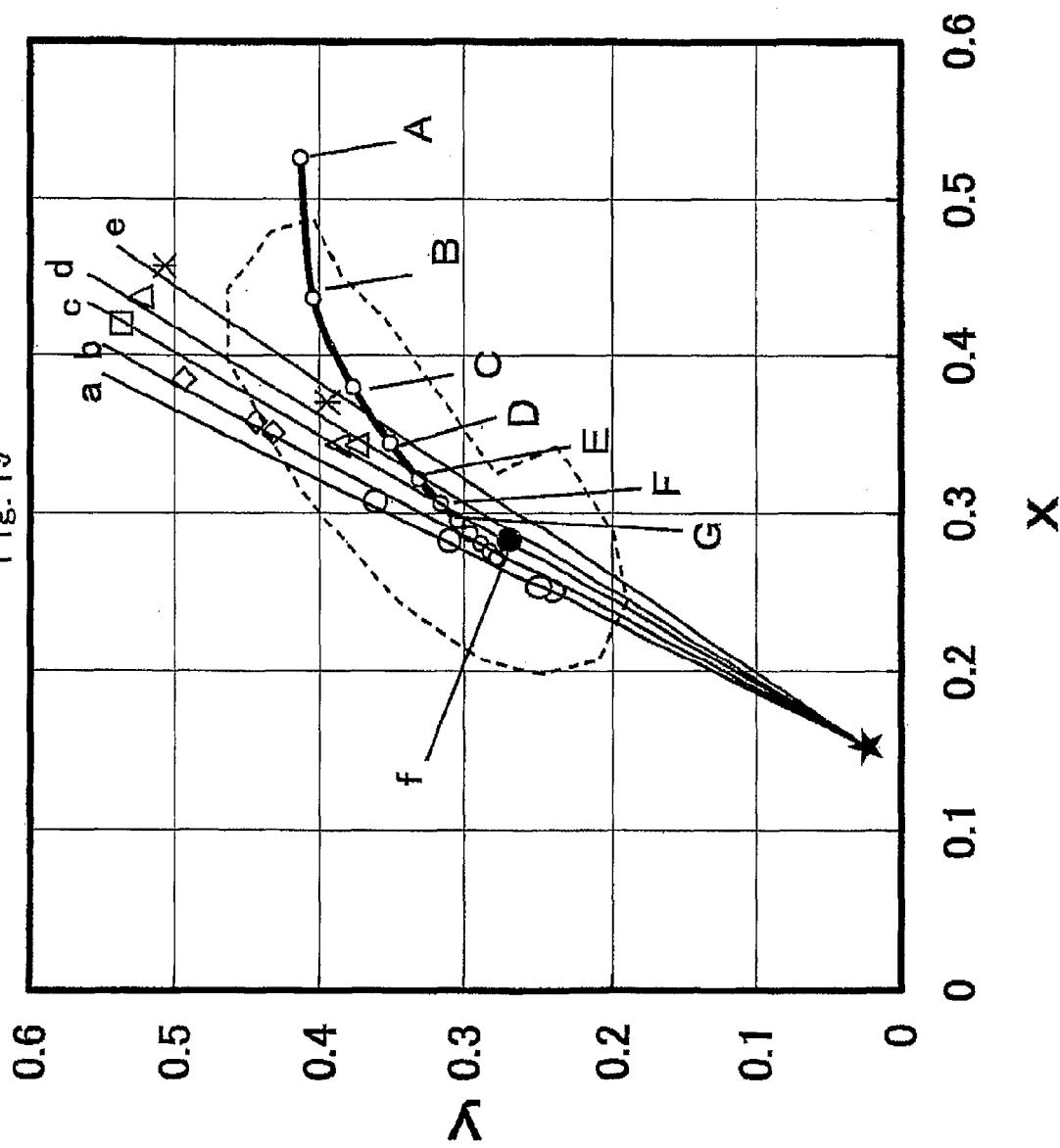
FIG. 19 is a diagram showing the chromaticities of light emitted by the respective white LEDs.
Figure 20:
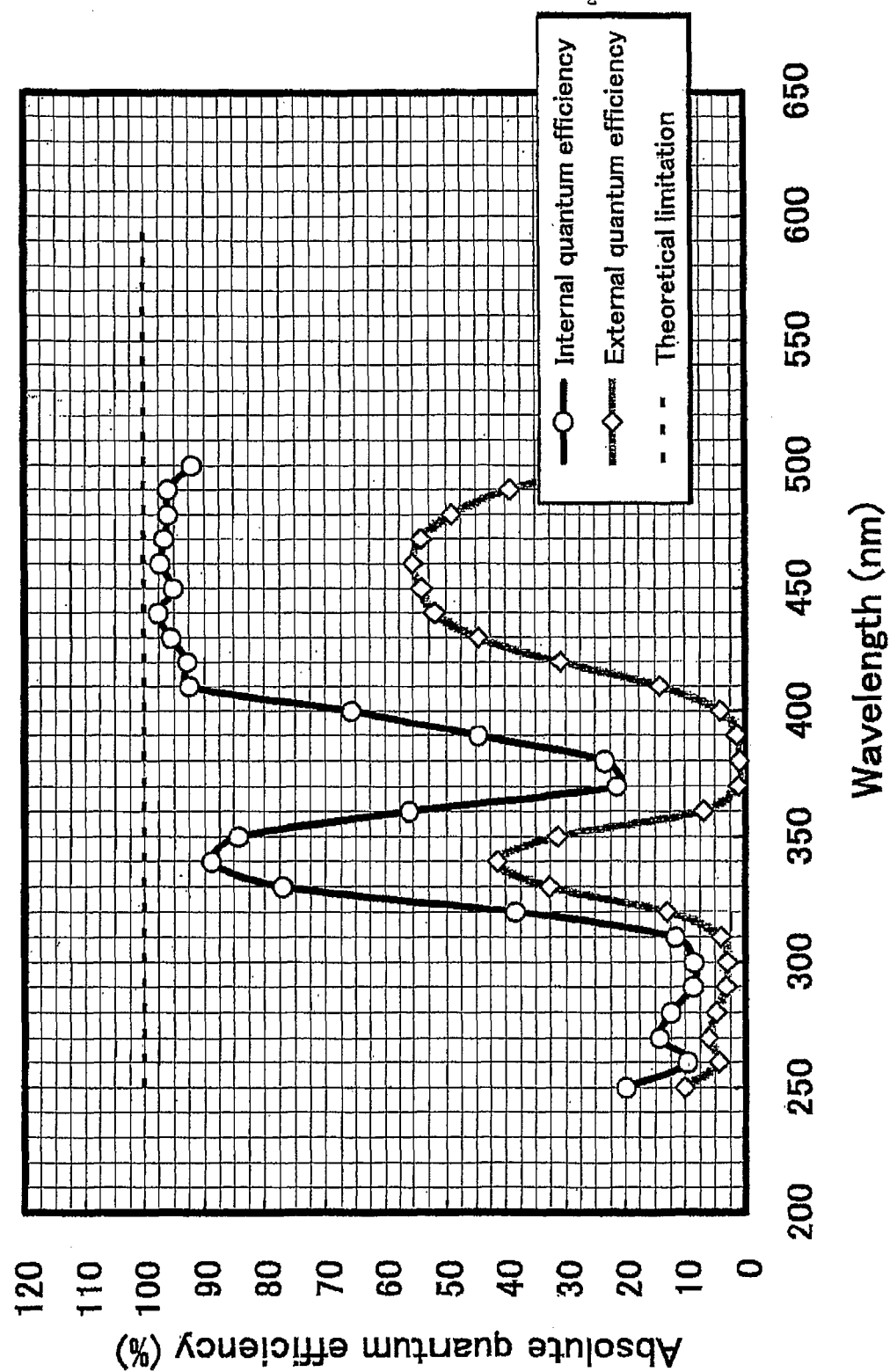
FIG. 20 is a graph of the internal quantum efficiency of an exemplary transparent phosphor ceramics according to the present invention.
Figure 21:
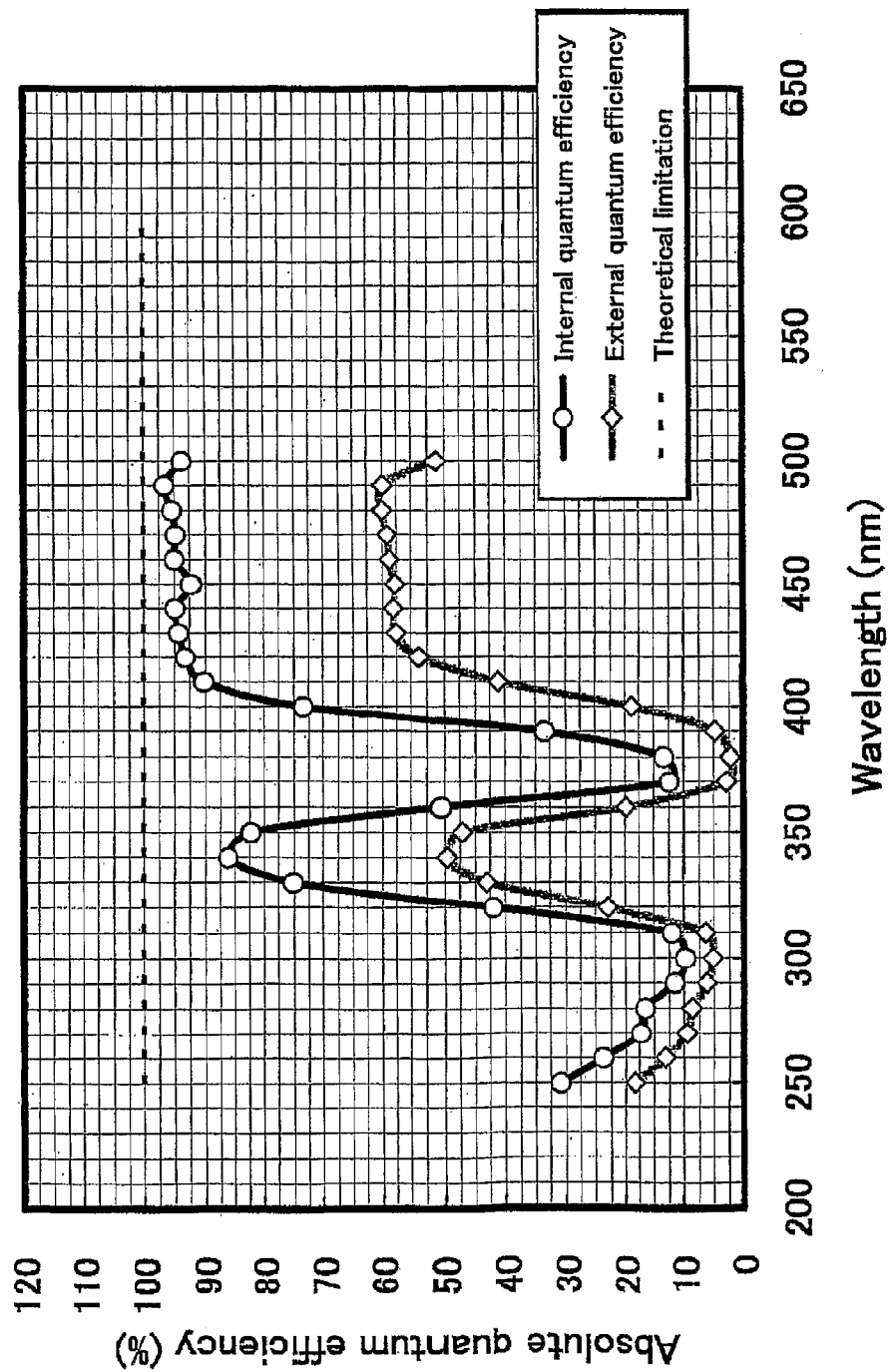
FIG. 21 is a graph of the internal quantum efficiency of another exemplary transparent phosphor ceramics according to the present invention.
Figure 22:
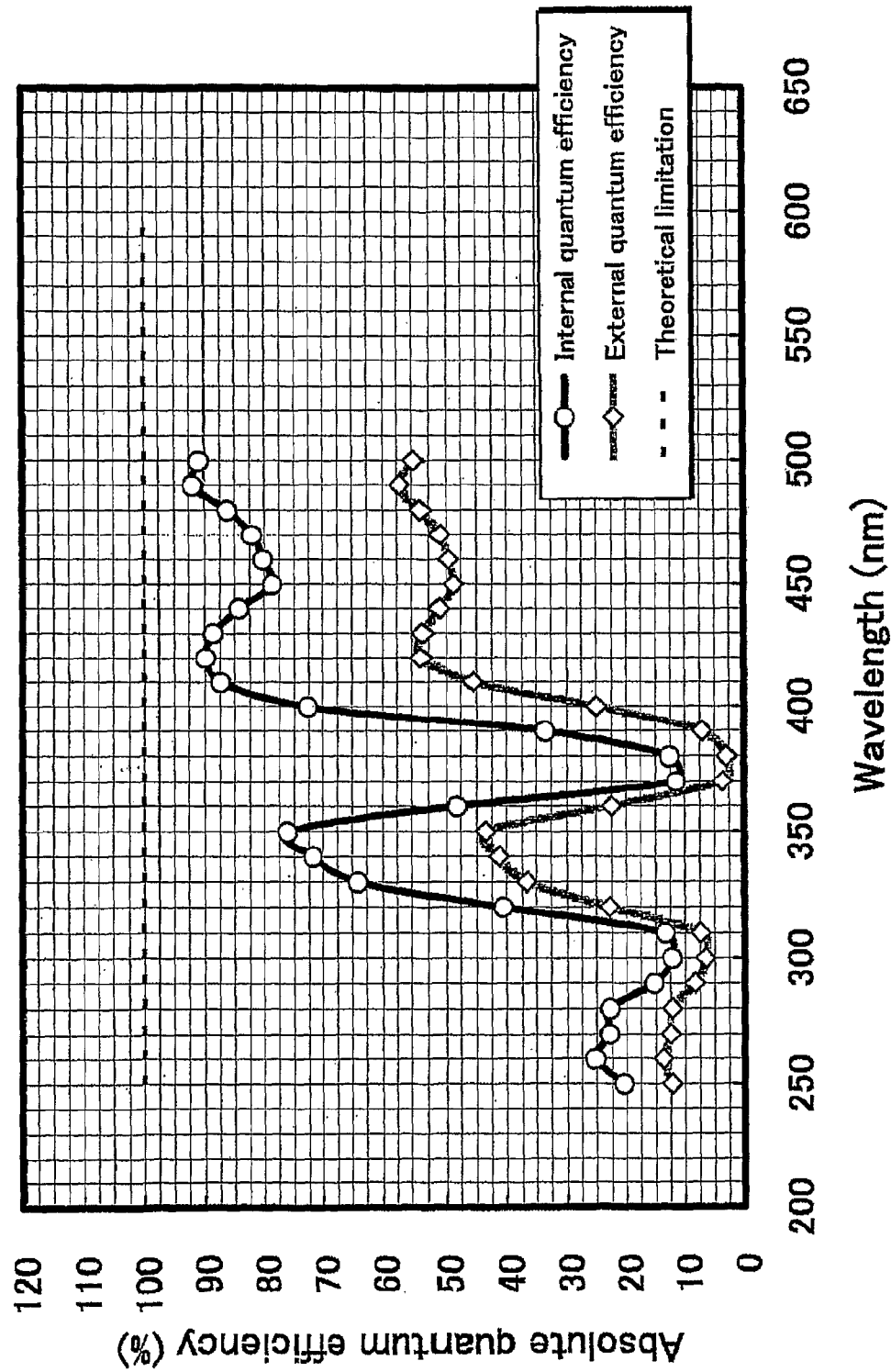
FIG. 22 is a graph of the internal quantum efficiency of yet another exemplary transparent phosphor ceramics according to the present invention.
Figure 23:
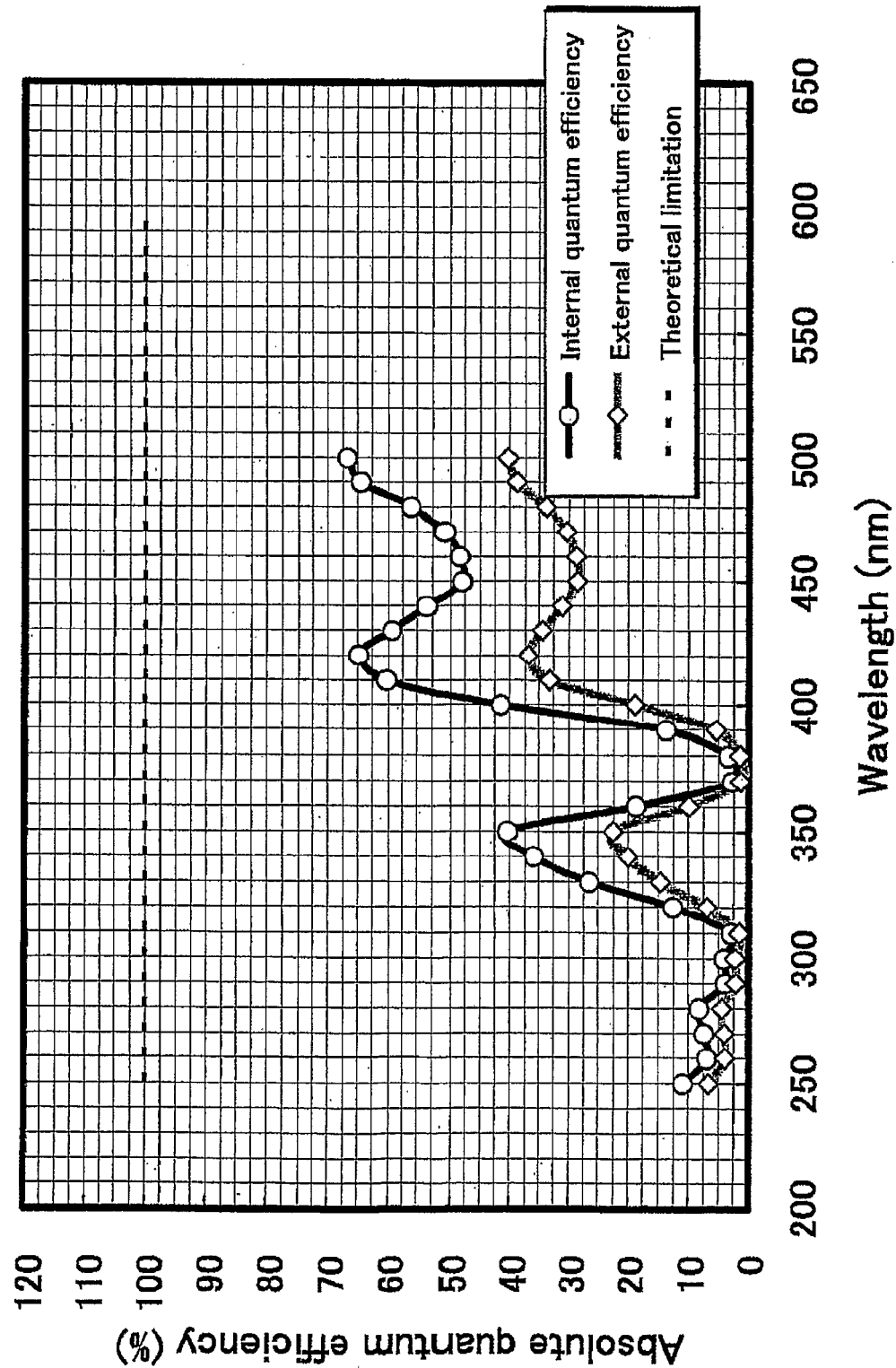
FIG. 23 is a graph of the internal quantum efficiency of yet another exemplary transparent phosphor ceramics according to the present invention.
Figure 24:
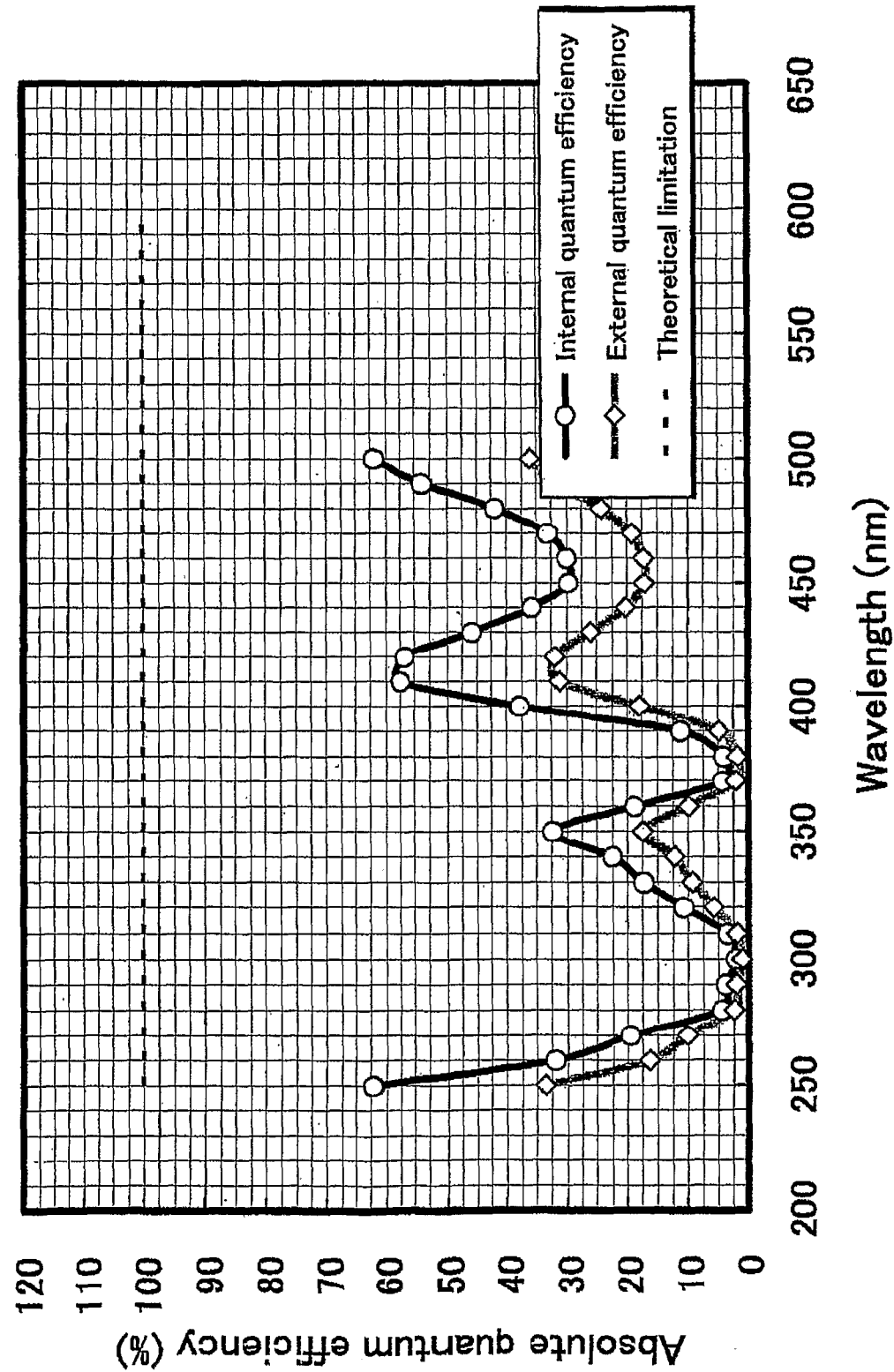
FIG. 24 is a graph of the internal quantum efficiency of yet another exemplary transparent phosphor ceramics according to the present invention.

FIG. 19 is a CIE chromaticity diagram on which data representing the chromaticity of light emitted by the respective white LEDs (whose configuration and properties are shown in FIG. 18) are plotted along with Planckian locus.

In FIG. 19, the points A, B, C, D, E, F, and G corresponding to the chromaticity coordinates representing color temperatures of 2000 K, 3000 K, 4000K, 5000 K, 6000 K, 7000 K, and 8000 K, respectively.

In FIG. 19, the straight-line segments a, b, c, d, and e represent, on the CIE chromaticity diagram, the chromaticities of light emitted by the white LEDs corresponding to $Ce^{3+}$ substitution amounts of 0.05 atomic %, 0.5 atomic %, 1 atomic %, 2 atomic %, and 3 atomic %, respectively. Note that the $Gd^{3+}$ substitution amount is uniformly 0 atomic %. As described above, each white LED emits light as a result of the additive color process by the same blue light emitting diode in combination with a different one of transparent phosphor ceramics ($Y_3Al_5O_{12}$:$Ce^{3+}$-based) having a different thickness.

In FIG. 19, in addition, the point f represents the chromaticity of color of the mixture light emitted by the blue emitting diode in combination with the $Y_3Al_5O_{12}$:$Ce^{3+}$-based transparent phosphor ceramics having the $Gd^{3+}$ substitution amount of 18 atomic %, the $Ce^{3+}$ substitution amount of 0.05 atomic %, and the thickness of 0.6 mm.

Through the comparison of FIGS. 18 and 19, the following is apparent.

$Ce^{3+}$ Substitution Amount (1)

With the increase of the $Ce^{3+}$ substitution amount, the emission light of the transparent phosphor ceramics of the $Y_3Al_5O_{12}$:$Ce^{3+}$-based yellow-green phosphor becomes more and more yellowish. As a consequence, the value x of the chromaticity of the mixture light becomes larger. That is to say, light with color temperature 8000 K or below is easily obtained.

With the increase of the $Ce^{3+}$ substitution amount, in addition, the resulting transparent phosphor ceramics tend to absorb blue light more easily. As a consequence, light of yellow-green or yellowish color is easily obtained with relatively thin transparent phosphor ceramics.

Although the relevant data is now shown, it is also found that the temperature quenching of a $Y_3Al_5O_{12}$:$Ce^{3+}$-based phosphor increases with the increase in the $Ce^{3+}$ substitution amount, so that the resulting transparent phosphor ceramics will be of relatively inferior in terms of heat resistance.

Yet, as will be described later, when the $Ce^{3+}$ substitution amount exceeds 0.5 atomic %, and especially reaches 1 atomic % of higher, the transparent phosphor ceramics exhibits a significant drop in the wavelength conversion efficiency of converting blue light into yellow-green light (photon conversion efficiency or internal quantum efficiency). With such transparent phosphor ceramics, it is difficult to provide a semiconductor light emitting apparatus capable of high-power output.

Based on FIGS. 18 and 19, it is known that the preferable range of the $Ce^{3+}$ substitution amount is from 0.5 atomic % to <3 atomic % or so, and more preferably from 1 atomic % to 3 atomic %, provided that the $Gd^{3+}$ substitution amount is zero. With the $Ce^{3+}$ substitution amount falling within this range, a point light source that emits light having the correlated color temperature falling within the range from 4500 K to 8000 K, and more preferably from 5000 K to 7000 K is obtained. (Note that the correlated color temperatures suitable for halogen lamps and vehicle headlights are within the range from 4000 K to 6700 K).

$Gd^{3+}$ Substitution Amount

With $Gd^{3+}$ substituting part of $Y^{3+}$ (18 atomic %) contained in the yellow-green $Y_3Al_5O_{12}$:$Ce^{3+}$ phosphor, the transparent phosphor ceramics emits yellowish light. As a result, the chromaticity x of the mixture light increases. That is, the mixture light of a low color temperature (8000 K or lower) is obtained.

Although the relevant data is now shown, it is also found that temperature quenching of the $Y_3Al_5O_{12}$:$Ce^{3+}$-based phosphor increases with the increase in the $Gd^{3+}$ substitution amount, so that the resulting transparent phosphor ceramics will be of relatively inferior in terms of heat resistance.

Based on FIGS. 18 and 19, it is known that the preferable range of the $Gd^{3+}$ substitution amount is from 15 atomic % to 50 atomic % or so, and more preferably from 20 atomic % to 40 atomic %, provided that the $Ce^{3+}$ substitution amount is about 0.05 atomic %. With the $Gd^{3+}$ substitution amount falling within this range, a point light source that emits light having the correlated color temperature falling within the range from 4500 K to 8000 K, and more preferably from 5000 K to 7000 K is obtained. (Note that those correlated color temperatures is suitable for halogen lamps and vehicle headlights).

After the careful study by the present inventors, it is found that as shown in FIGS. 18 and 34, the preferable range of the $Gd^{3+}$ substitution amount is from 0 atomic % to 50 atomic % or so, and more preferably from 0 atomic % to 30 atomic %, provided that the $Ce^{3+}$ substitution amount is about 0.5 atomic %. With the $Gd^{3+}$ substitution amount falling within this range, a point light source that emits light having the correlated color temperature falling within the range of 2800 K to 6700 K, and more preferably from 4000 K to 6700 K is obtained. (Note that those correlated color temperatures is even more suitable for recent halogen lamps and vehicle headlights.)

In view of other experimental data and so on, the following is found. That is, in the case where the $Gd^{3+}$ substitution is involved, as long as the $Ce^{3+}$ substitution amount falls within the range from 0.05 atomic % to 1 atomic %, and especially from 0.1 atomic % to 0.8 atomic %, it is expected that a similar advantageous effect is produced although the levels of the effect may differ.

Thickness of Transparent Phosphor Ceramics

With the increase of thickness t, the transparent phosphor ceramics increasingly absorbs blue light. As a result, yellow-green or yellowish mixture light is easily obtained.

From FIGS. 18 and 19, it is known that the preferable range of the thickness t is from 0.2 mm to 0.6 mm when the $Ce^{3+}$ substitution amount is 0.05 atomic %, and less than 0.1 mm when the $Ce^{3+}$ substitution amount is within the range from 0.5 atomic % to 1 atomic %, and less than 0.02 mm when the $Ce^{3+}$ substitution amount within the range from 2 atomic % to 3 atomic %. With the above defined thicknesses, a point light source that emits light having the correlated color temperature closer to the black body radiation is obtained. Specifically, the correlated color temperature obtained by the above point light source falls within the range of 4500 K to 8000 K, and more preferably from 5000 K to 7000 K. (Note that the correlated color temperatures suitable for halogen lamps and vehicle headlights are within the range from 4000 K to 6700 K.)

The following is more detailed description of the relation between the thickness and the $Ce^{3+}$ substitution amount of preferable transparent phosphor ceramics, with reference to FIGS. 18 and 19.

As apparent from FIGS. 18 and 19, the thickness of the transparent phosphor ceramics that is preferable to obtain white light suitable for illumination purpose, especially for vehicle headlights and projection light sources, differs depending on the $Ce^{3+}$ substitution amount. (In FIG. 19, the preferable white light corresponds to the region enclosed by dotted line). For example, when the $Gd^{3+}$ substitution amount is zero and the $Ce^{3+}$ substitution amount is 0.05 atomic % (represented by the line segment "a" shown in FIG. 19), the preferable thickness t of the $Y_3Al_5O_{12}$:$Ce^{3+}$ transparent phosphor ceramics falls within the range from 0.2 mm to 0.3 mm.

On the analogy of other experimental data and in view of measurement errors, it is found that the thickness preferable for obtaining the white light generally falls within the range of 0.1 mm (100 µm) to <2 mm, provided that the $Ce^{3+}$ substitution amount is within the range of 0.01 atomic % to <0.1 atomic %.

In addition, in the case where the $Ce^{3+}$ substitution amount is 0.5 atomic % (represented by the line "b" shown in FIG. 19), the preferable thickness is within the range from 0.1 mm to 0.2 mm.

On the analogy of other experimental data and in view of measurement errors, it is found that when the $Ce^{3+}$ substitution amount is in the range from 0.1 atomic % to <1 atomic %, the thickness that is preferable to obtain the white light generally falls within the range of 0.02 mm (20 µm) to <0.3 mm (300 µm).

It is also found that when the $Ce^{3+}$ substitution amount falls within the range of 1 atomic % to 3 atomic % (represented by the lines "c" to "e" shown in FIG. 19), the preferable thickness falls within the range of 0.02 mm to <0.1 mm.

On the analogy of other experimental data and in view of measurement errors, it is found that when the $Ce^{3+}$ substitution amount is within the range of 1 atomic % to <5 atomic %, the thickness that is preferable to obtain the white light generally falls within the range from 0.005 mm (5 µm) to <0.05 mm (50 µm).

It is also found that in the case of the $(Y, Gd)_3Al_5O_{12}:Ce^{3+}$ transparent phosphor ceramics with, for example, the $Gd^{3+}$ substitution amount of 18% and the $Ce^{3+}$ substitution amount of 0.05 atomic % (represented by the line "f" shown in FIG. 19), the preferable thickness is 0.6 mm or less.

On the analogy of other experimental data and in view of measurement errors, it is found that in the case where the $Ce^{3+}$ substitution amount falls within the range of 0.01 atomic % to <0.1 atomic %, similarly to the case with no $Gd^{3+}$ substitution, the preferable thickens to obtain the white light generally falls within the range from 0.1 mm (100 µm) to <2 mm.

Note that data shown in FIGS. 18 and 19 relate to, the $Y_3Al_5O_{12}:Ce^{3+}$ phosphors and $(Y, Gd)_3Al_5O_{12}:Ce^{3+}$ phosphors which are given as examples of phosphors each containing the elements of constituent element group A part of which is substituted by $Ce^{3+}$ and having a garnet crystal structure. It is noted, however, the similar advantageous effect is achieved by any other phosphor containing the elements of constituent element group A and part of which is substituted by $Ce^{3+}$ and having a crystal structure of garnet, depending on similarity in the crystal structure and the optical property.

Conditions for Obtaining Mixture Light Having Correlated Color Temperature from 4000 K to 8000K In view of the preferable thickness (t) of the transparent phosphor ceramics, the preferable $Ce^{3+}$ substitution amount, and the preferable $Gd^{3+}$ substitution amount, the following conditions are noted for obtaining the mixture light having the correlated color temperature falling within the range preferably from 4500 K to 8000K and more preferably from 5000 K to 7000 K.

(1) The $Ce^{3+}$ substitution amount is less than 3 atomic %.

Here, the lower limit is not specifically set. In view of the temperature quenching, a smaller $Ce^{3+}$ substitution amount is more preferable. Yet, in view of the blue light absorption efficiency, the $Ce^{3+}$ substitution amount is preferably 0.01 atomic % or higher, and more preferably 0.03 atomic % or higher.

To sum up, the $Ce^{3+}$ substitution amount is preferably within the range from 0.01 atomic % to <3 atomic %, and more preferably from 0.03 atomic % to <3 atomic %.

(2) The $Gd^{3+}$ substitution amount is preferably within the range from 0 atomic % to 50 atomic %. It is sufficient that the $Gd^{3+}$ substitution amount is adjusted in balance with the $Ce^{3+}$ substitution amount.

(3) The thickness (t) of the transparent phosphor ceramics needs to be adjusted, especially in view of the $Ce^{3+}$ substitution amount. Yet, the thickness generally falls within the range from 0.01 mm to 0.6 mm (i.e., from 10 µm to 600 µm).

FIGS. 20-24 show graphs of the measurement data on the samples of transparent ceramics all having a uniform thickness (0.6 mm). Each sample is made from a $Y_3Al_5O_{12}:Ce^{3+}$ transparent phosphor ceramics with a different amount of $Ce^{3+}$ substitution. The measurement data show the internal quantum efficiency (absolute value) and external quantum efficiency (absolute value) of each sample. The internal quantum efficiency is equal to a photon conversion efficiency and indicates the wavelength conversion efficiency. Similarly, the external quantum efficiency is equal to a photon conversion efficiency and indicates the wavelength conversion efficiency.

FIGS. 20-24 show the measurement data on the samples with the $Ce^{3+}$ substitution amount being 0.05 atomic %, 0.5 atomic %, 1 atomic %, 2 atomic %, and 3 atomic %, respectively.

Figure 25:
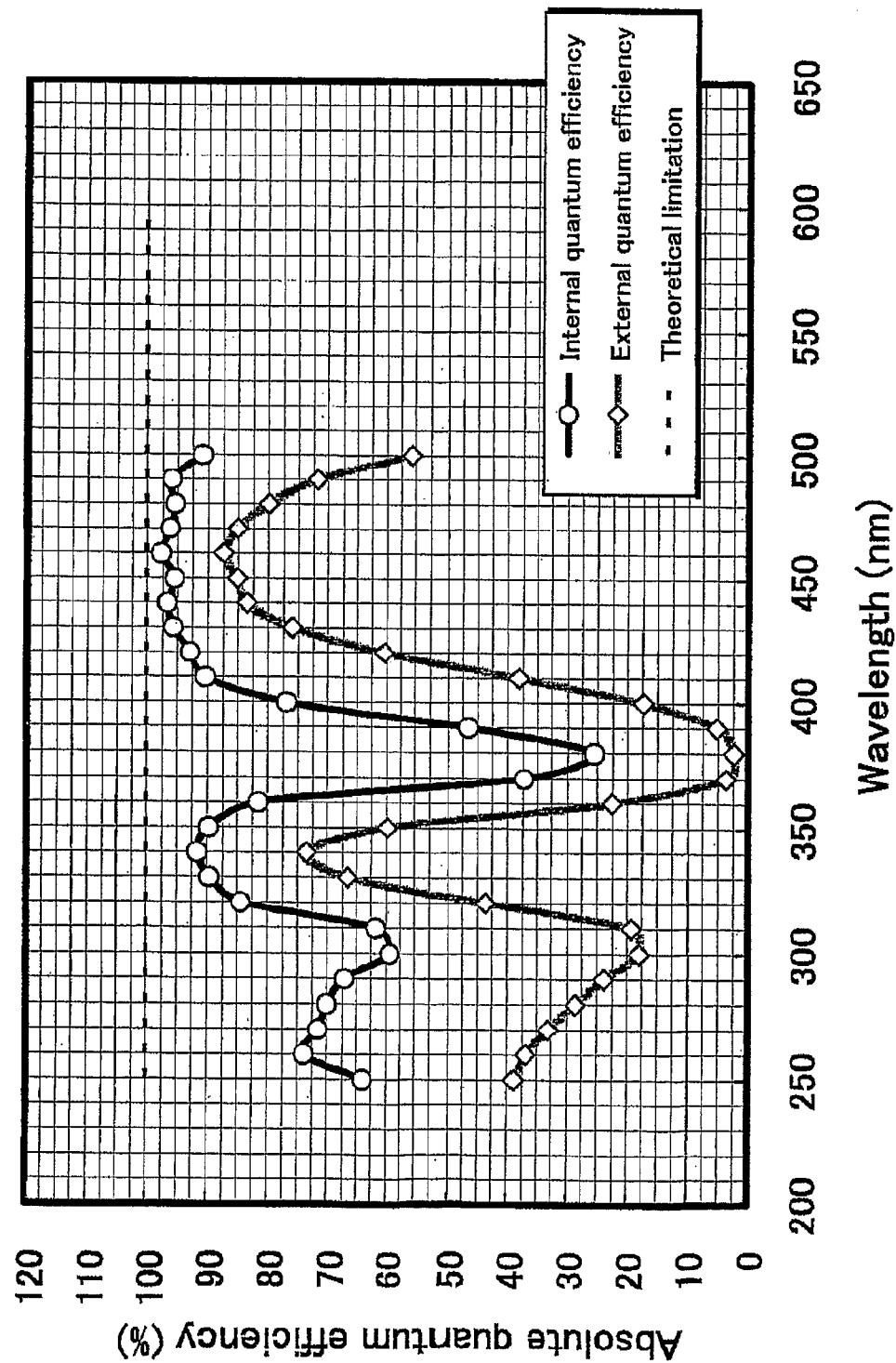
FIG. 25 is a graph of the internal quantum efficiency of $Y_3Al_5O_{12}$:$Ce^{3+}$ phosphor powder.

For the reference purpose, FIG. 25 shows the evaluation data of $Y_3Al_5O_{12}:Ce^{3+}$ phosphor powder with the $Ce^{3+}$ substitution amount being 2 atomic %.

Note that the evaluation of internal quantum efficiency of transparent phosphor ceramics are made by using the evaluation method disclosed in the above-mentioned document by Okubo. According to the evaluation method, a small sample piece (a compact of about a 1 cm square plate) of transparent phosphor ceramics is placed on a barium sulfate $(BaSO_4)$ powder compressed on a sample holder. The compressed $BaSO_4$ powder is used as the reflectance standard.

As shown in FIG. 25, the sample of $Y_3Al_5O_{12}:Ce^{3+}$ phosphor powder prepared with the optimized manufacturing conditions exhibits the internal quantum efficiency (>95%) that is close to the theoretical limitation (100%). This favorable property is part of the reasons that this type of phosphor powder is preferably used for a high-power output white LED.

In contrast, the following is observed with respect to samples of transparent phosphor ceramics prepared from $Y_3Al_5O_{12}:Ce^{3+}$ phosphor. As apparent from FIGS. 20-24, with the increase of the $Ce^{3+}$ substitution amount from 0.05 atomic % to 3 atomic %, the internal quantum efficiency decreases. Especially when the $Ce^{3+}$ substitution amount reaches 1 atomic % or higher, the internal quantum efficiency drops sharply.

Generally, phosphor powder suitable for white LED light sources is requested to have good light absorption in the blue region. For this reason, the substitution amount of $Ce^{3+}$ ions, which serve to absorb blue light, is typically set within a relatively high level of 1-5 atomic %. However, the research by the present inventors shows that with the $Ce^{3+}$ substitution amount typical for white LED light sources, it is impossible or difficult to prepare transparent phosphor ceramics having a high internal quantum efficiency.

The above noted finding demonstrates that the $Y_3Al_5O_{12}:Ce^{3+}$ transparent phosphor ceramics with the typical $Ce^{3+}$ substitution amount for white LED light sources is not suitable to reliably produce a semiconductor light emitting apparatus capable of producing high-power output.

Note that it is still not clear as to why the internal quantum efficiency decreases with the increasing amount of $Ce^{3+}$ substitution. Yet, the following mechanism provides one hypothetical explanation.

Assumed Mechanism for Reduction of Blue Wavelength Conversion Efficiency of $Y_3Al_5O_{12}:Ce^{3+}$ Transparent Phosphor Ceramics, with Increase of the $Ce^{3+}$ Substitution Amount Generally, transparent phosphor ceramics are known to be an aggregate of single crystals of inorganic phosphor particles. It is known that the transparency of the phosphor ceramics increases with the increase in particle size.

It is also known that the particle boundaries is one factor to reduce the transparency and the light emission efficiency.

In view of the above, attempts are generally made to increase the particle size and to decrease the volume fraction of particle boundaries in order to improve the transparency and light emission efficiency of the transparent phosphor ceramics.

In addition, regarding the manufacturing of transparent phosphor ceramics, it is known to add a small amount of sintering aid (such as MgO or $SiO_2$) to the phosphor materials prior to the sintering process. The sintering aid is added for the purpose of increasing the particle size and decreasing the volume fraction of particle boundaries.

It is also known that elements constituting part or all of the sintering aid tend to be segregated and localized in the vicinity of particle boundaries.

Thus, the following is assumed. With the increase of the $Ce^{3+}$ substitution amount, the sintering aid more easily reacts, with a Ce compound. Such reactions may yield a compound that acts as a deactivate or quench center of light emission, increase the volume fraction of particle boundaries, and reduce the particle size.

On the other hand, transparent phosphor ceramics generally has a refractive index higher than air and thus has the following property. That is, light entered to the transparent phosphor ceramics as well as light generated in the transparent phosphor ceramics is trapped within the transparent phosphor ceramics and not efficiently emitted into the air.

Owing to this property, the light tends to be reflected back and forth within the transparent phosphor ceramics and thus passes through the particles and particle boundaries many times.

As a result; in the case of transparent phosphor ceramics having a larger amount of compounds and particle boundaries acting as deactivate centers, it is more notable that light entered to or generated in the transparent phosphor ceramics are absorbed and lost within the transparent phosphor ceramics, which reduces the photon conversion efficiency.

Although further and more detailed study is required to confirm the above mechanism, this hypotheses explains that the internal quantum efficiency is reduced with the increasing amount of $Ce^{3+}$ substitution, which provides the support the experimental data.

In addition, the decrease of the internal quantum efficiency with the increasing amount of $Ce^{3+}$ substitution is an essential problem associated with transparent phosphor ceramics which is made into an inorganic phosphor compact, especially a compact of a phosphor containing the constituent element group A and part of the constituent element group A is replaced by $Ce^{3+}$ and having a crystal structure of garnet. (Note the constituent element group A is composed of one or more elements selected from the group consisting of Mg, Ca, Sr, Ba, Y, La, Gd, Tb, and Lu. Thus, a solution to the problem is required.

Based on FIGS. 20-24, the following is also noted regarding the $Ce^{3+}$ substitution amount.

$Ce^{3+}$ Substitution Amount (2)

With the increase of the $Ce^{3+}$ substitution amount, the resulting transparent phosphor ceramics suffers from a greater reduction in photon conversion efficiency (internal quantum efficiency). This decrease may be ascribable to the increase of the light absorption loss. In view of the above, the $Ce^{3+}$ substitution amount preferably falls within the range from 0.01 atomic % to <3 atomic %, more preferably from 0.01 atomic % to 1 atomic %, and still more preferably from 0.01 atomic % to 0.5 atomic %.

As shown in FIG. 12, the semiconductor light emitting apparatus according to the present invention may include the heat-dissipating substrate 1, which is an insulator board. On the heat-dissipating substrate 1, at least the conductor A2a, the adhesive 23, the solid-state light emitting device 3, and the wavelength converter 4 that are stacked.

In the specific example shown in FIG. 12, the conductor B2b is disposed on the heat-dissipating substrate 1. Alternatively, however, the conductor B2b may be disposed at a location not on or above the heat-dissipating substrate 1.

As long as the conductor A2a is separated from the conductor B2b at least via an insulator (examples of inculcators include a gap), the locations of the conductors are not specifically limited.

Note that in the solid-state light emitting device 3, one of the pair of feeder electrodes A14a and B14b is electrically connected to the conductor A2a and the other to the conductor B2b.

In the solid-state light, emitting device 3, the electrical connection between the conductor B2b and the one of the feeder electrodes A14a and B14b may be established by connecting a conductor C5 between them.

The conductor C5 may be a metal wire (gold wire), for example.

With the electrical connections described above, the semiconductor light emitting apparatus is enabled to supply electrical power to the solid-state light emitting device 3 via the conductors A2a and 32b.

In response, the solid-state light emitting device 3 converts electric energy into light by the action of electric-optic conversion, so that the primary light 15 is emitted.

Figure 14:
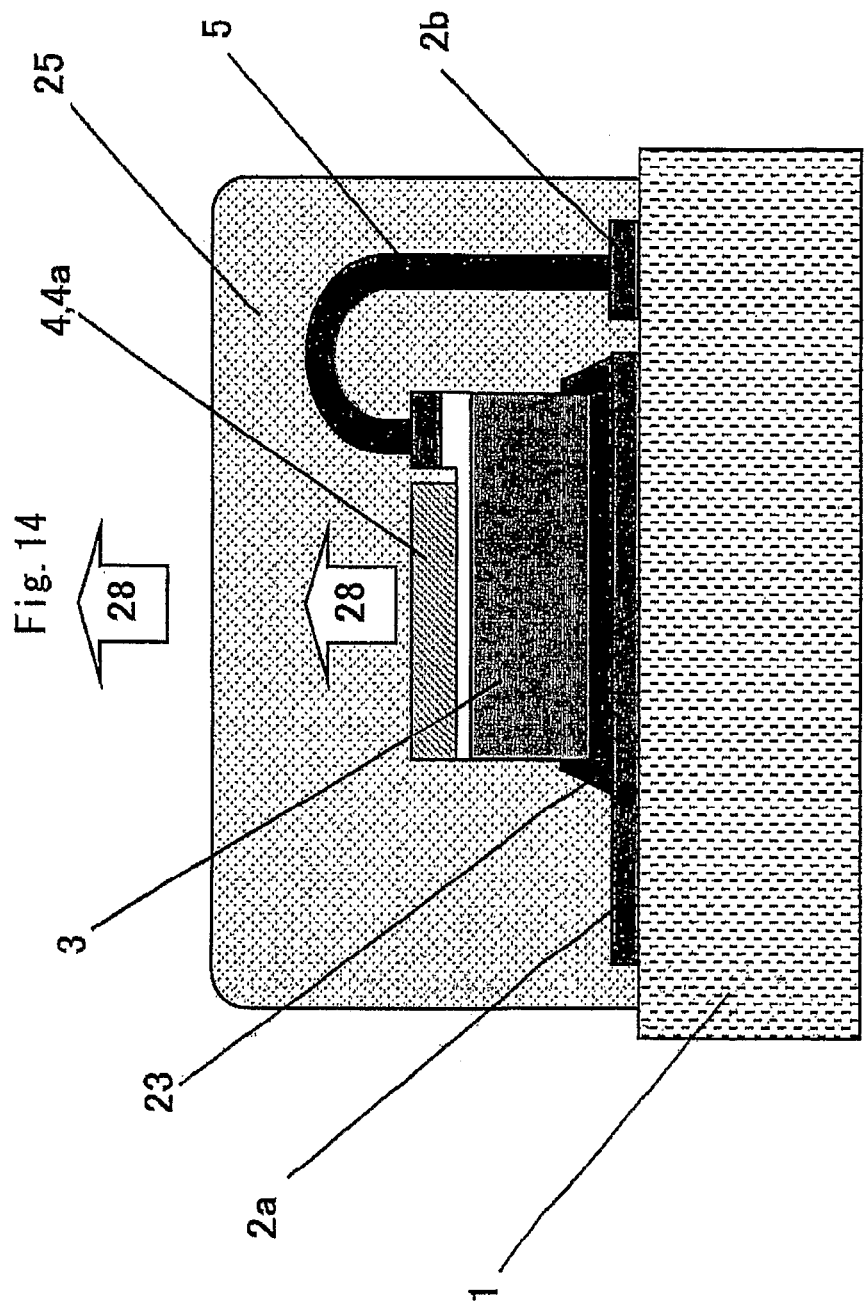
FIG. 14 is a cross-sectional side view of yet another exemplary semiconductor light emitting apparatus according to the present invention.

As shown in FIG. 14, the semiconductor light emitting apparatus according to the present invention may additionally have a light-transmissive body 25 disposed to indirectly seal or embed therein the entire solid-state light emitting device 3. Preferably, the light-transmissive body 25 is in contact at least with a heat dissipating body (the heat-dissipating substrate 1 or the conductor A2a).

With this arrangement, a heat conduction path is ensured such that heat of the wavelength converter 4 is transferred via the light-transmissive body 25 to the conductor A2a and the heat-dissipating substrate 1 (both of which act as a good heat dissipator). That is, the area and envelope volume of the heat dissipating portion increases. In addition, the sectional area of the heat conduction path increase, which serves to increase the overall heat dissipation and thus to suppress the temperature rise of the wavelength converter 4.

In addition, the above arrangement provides a heat conduction path such that heat of the wavelength converter 4 is released uniformly along the entire circumferential surface of the wavelength converter 4. As a result, it is ensured that the portion surrounding the wavelength converter 4 undergoes a uniform temperature rise, rather than being locally heated. This is desirable for obtaining high-power output.

Note that more detailed description of the heat conduction path will be given later with reference to the drawings.

Note that the above statement that reads "light-transmissive body 25 disposed to indirectly seal or embed therein the entire solid-state light emitting device 3" means the following. As shown in FIG. 14, the light-transmissive body 25 is disposed to make contact with the entire side surfaces of the solid-state light emitting device 3 (including the entire side surfaces of the wavelength converter 4) but not with the rear surface of the solid-state light emitting device 3. That is, the solid-state light emitting device 3 is indirectly enclosed within the light-transmissive body 25.

Materials usable as the light-transmissive body 25 include transparent resins (such as silicone resin and fluororesin), and transparent low-melting inorganic materials (such as low-melting glass).

Many of the above-mentioned materials of the light-transmissive body 25 have a relatively high refractive index. Such a material is especially desirable in the configuration that the light-transmissive body 25 disposed to seal the solid-state light emitting device 3 makes direct contact with the main light-extracting surface as well as with the entire side surfaces (except the rear surface) of the solid-state light emitting device 3. With this configuration, the primary light 15 emitted by the solid-state light emitting device 3 is reflected at a higher light-extraction efficiency, which is preferable to ensure high output power.

For the purpose of improving the thermal conductive property, it is preferable to add various inorganic materials into the transparent resin or low-melting inorganic material used to constitute the light-transmissive body 25.

Examples of inorganic materials that may be added to the transparent resin include light-transmissive inorganic materials, light-reflective inorganic materials, highly-thermal conductive inorganic materials having a good thermal conductive property (thermal conductivity is 3 W/mK or higher, preferably 10 W/mK or higher, and more preferably 100 W/mK or higher), highly-reflective inorganic materials having a high refractive index (the refractive index in a visible range of 380 nm to 780 nm at room temperature is 1.2 or higher, preferably 1.4 or higher but less than 4.0 or so), light-diffusing inorganic materials that diffuse the primary light 15, inorganic phosphor materials that absorb the primary light to emit visible light (i.e., inorganic phosphor). As long as at least one of the materials is selected and added to the transparent resin, it does not matter whether one of the materials is solely selected or two or more in combination.

Examples of the transparent inorganic materials include: various oxides (such as aluminum oxide, silicon dioxide, titanium dioxide, magnesium oxide, rare-earth oxide such as yttrium oxide, and complex oxide such as yttrium-aluminum-garnet or $SrTiO_3$); various nitrides (such as aluminum nitride, boron nitride, silicon nitride, gallium nitride, and gallium nitride indium); and carbides such as silicon carbide.

Examples of the light-reflective inorganic materials include: the various oxides mentioned above; sulfates such as barium sulfate; various metals (such as Al, Ti, Au, and Ag).

Examples of the highly-thermal conductive inorganic materials include: the various oxides mentioned above; the various nitrides mentioned above; various carbides (such as silicon carbide); carbons; and the metals Mentioned above.

Examples of the highly-reflective inorganic materials include the transparent inorganic materials mentioned above.

Examples of the light-diffusing inorganic materials include powder (particles) of selected one of the transparent inorganic materials and the reflective inorganic materials mentioned above. The median particle diameter ($D_{50}$) falls within the range from 0.1 μm to <1 mm (submicron to submillimeter levels).

Examples of the inorganic phosphor materials include the inorganic phosphors mentioned above.

The inorganic materials to be added to the transparent resin are not limited to of any shape or property. Yet, in view of the easiness of handling and of controlling the thermal conductive property, it is preferable that the inorganic materials are in particles known to be a pulverulent body or filler having the average or median particle diameter ($D_{50}$) falling within the range from 1 nm to <1 mm. That is, nanoparticle, submicron particles, micron particles and submillimeter particles are included within this range.

The particles that are preferable to obtain the light-transmissive body 25 having good light transmission characteristics are spherical or pseudo-spherical particles or nanoparticles (from 1 nm to <100 nm or so). With such particles, the light-transmissive body 25 that exhibits an excellent light transmittance is obtained.

In one preferred embodiment of the semiconductor light emitting apparatus according to the present invention; the wavelength converter 4 is made from any of the above-mentioned ceramic compacts having a good linear transmittance, and the light-transmissive body 25 contains any of the above-mentioned light-diffusing inorganic materials.

The semiconductor light emitting apparatus according to this preferred embodiment is configured to suppress temperature quenching and color separation of the mixture light, so that the output light will be of high intensity and homogeneous color.

Figure 15:
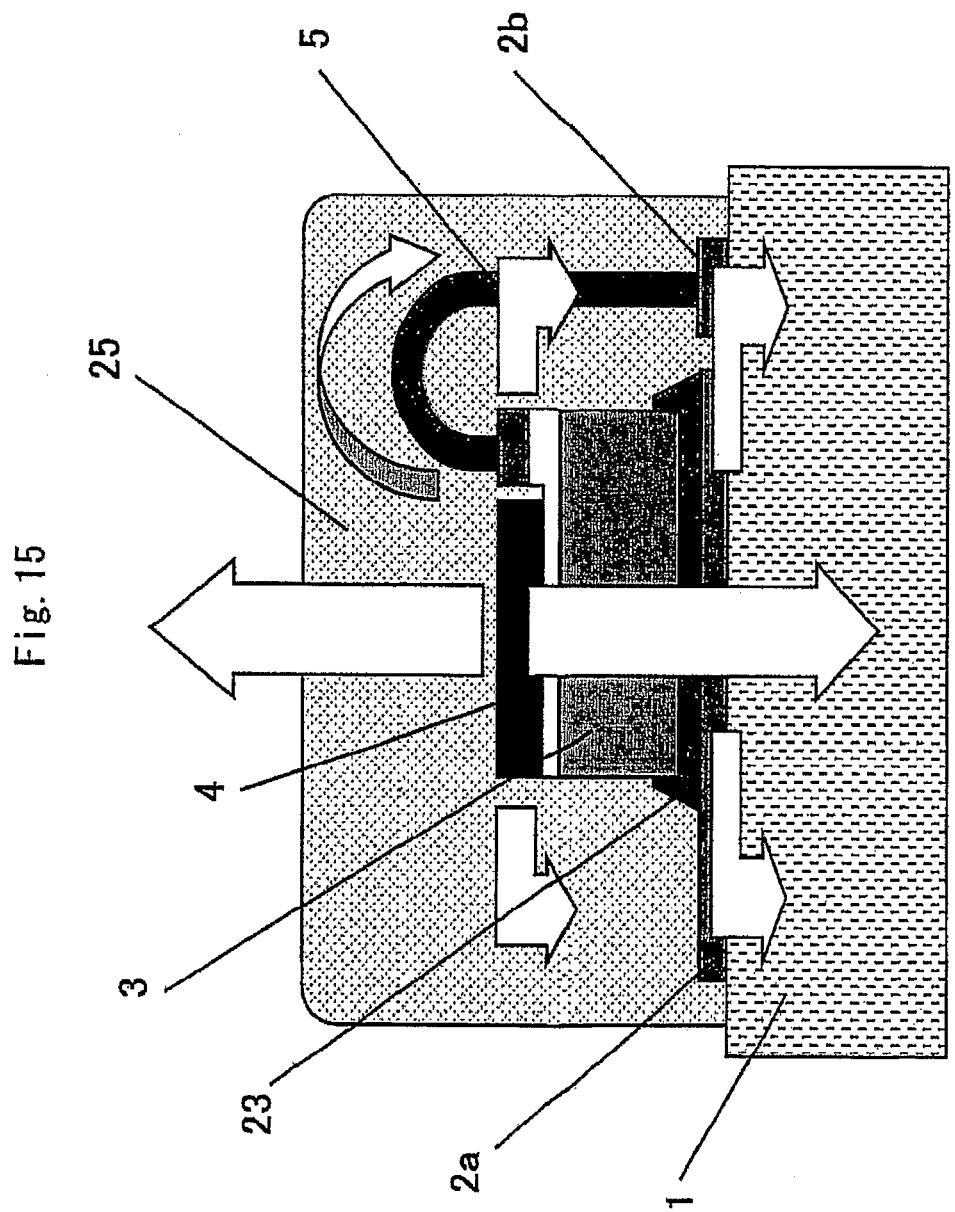
FIG. 15 is a cross-sectional side view of a heat conduction path of the semiconductor light emitting apparatus according to the present invention.

FIG. 15 shows the heat conduction path of heat generated by the wavelength conversion layer 4a of the wavelength converter 4, with respect to the exemplary semiconductor light emitting apparatus according to the present invention shown in FIG. 14 (the conductor A2a is disposed on the heat-dissipating substrate 1, the solid-state light emitting device 3 is mounted on the conductor A2a, and the wavelength converter 4 is disposed on the solid-state light emitting device 3).

In FIG. 15, each portion that generates heat is solidly shaded, and each heat conduction path is indicated with an arrow.

As shown in FIG. 15, the semiconductor light emitting apparatus according to the present invention is configured to effectively release heat in the following manner to improve the heat-dissipating property, despite that the heat generation increases with the increasing input power. That is the heat generated by the wavelength conversion layer 4a of the wavelength converter 4 is first conducted from the wavelength converter 4 to the solid-state light emitting device 3 that is in contacting relation. The heat conducted to the solid-state light emitting device 3 is released (1) to the high thermal conductors (such as the conductor A2a, the heat-dissipating substrate 1, an external additional heat dissipator (not shown)) that are, disposed below the solid-state light emitting device 3. Here, the heat is conducted via the entire rear surface of the solid-state light emitting device 3 uniformly and at a fast rate. In addition, the heat conducted to the solid-state light emitting device 3 is also released (2) via the light-transmissive body 25 to the high thermal conductors disposed below the solid-state light emitting device 3 as well as to the ambient air. In addition, the heat of the solid-state light emitting device 3 is also related (3) to the high thermal conductors also via the conductor C5.

As described above, the heat conduction paths are provided such that the heat generated by the wavelength conversion layer 4a of the wavelength converter 4 are released uniformly and effectively, which is effective to suppress the temperature quenching resulting from the temperature rise of the wavelength conversion layer 4a and thus to ensure high-power output.

In the above manner, by virtue of the high thermal conductor having a good thermal conductive property and a relatively large surface area and envelope volume, heat is conducted at an improved heat dissipation efficiency. More specifically, heat generated by the wavelength conversion layer 4a is conducted via the solid-state light emitting device 3 in the downward direction, lateral-downward direction, and lateral direction of the solid-state light emitting device 3. As a consequence, the reduction of emission efficiency caused by the temperature rise of the wavelength conversion layer 4a is suppressed.

Note that according to the preferred embodiment 1, the solid-state light emitting device 3 has a pair of feeder electrodes one on the upper surface and the other on the rear surface. It is naturally appreciated that the similar effect is achieved in the case where the pair of feeder electrodes are both disposed on either of the upper or rear surface of the solid-state light emitting device 3.

Conditions for Obtaining Correlated Color Temperatures Suitable for Halogen Lamps and Vehicle Headlights The present inventors studied the conditions for obtaining phosphors that emit light at a correlated color temperature (target value 5000 K) suitable for halogen lamps and vehicle headlights.

Figure 26:
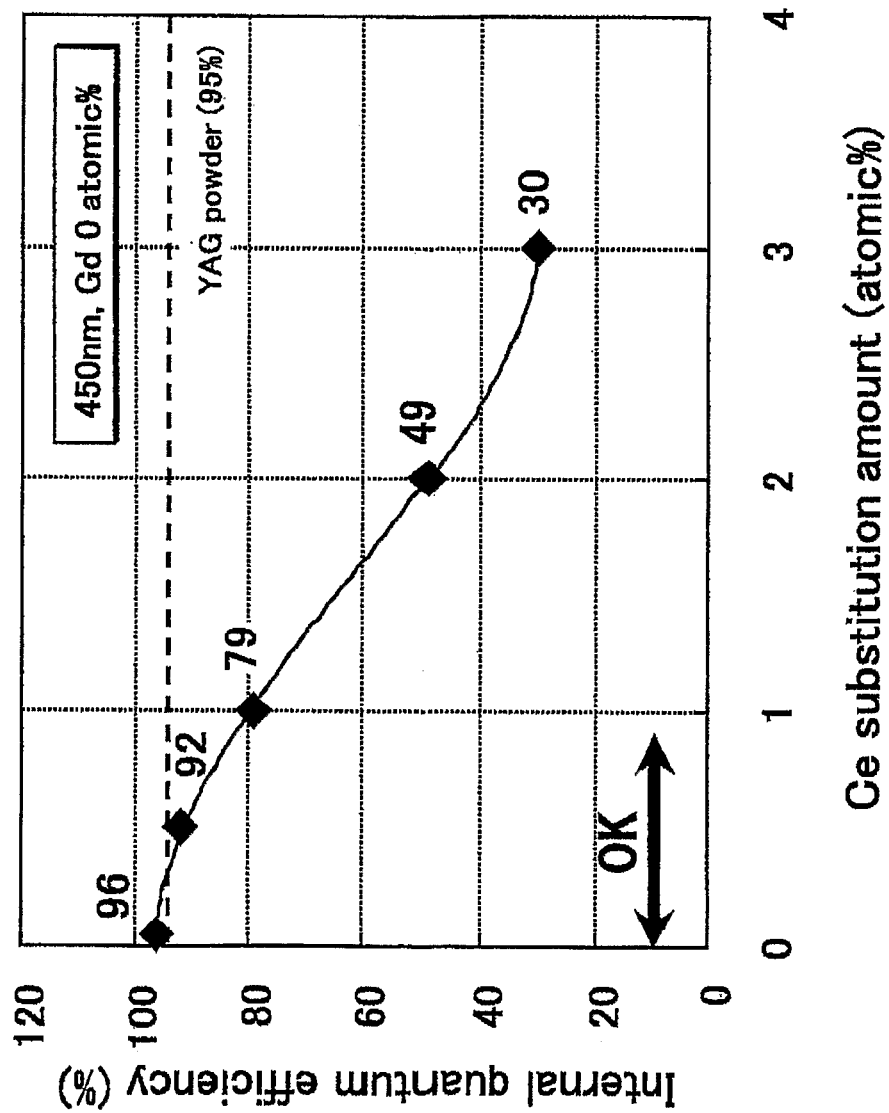
FIG. 26 is a graph showing the relation between the $Ce^{3+}$ substitution amount and the internal quantum efficiency.

First, the $Ce^{3+}$ substitution amount was studied. FIG. 26 is a graph showing the relation between the $Ce^{3+}$ substitution amount and the internal quantum efficiency. The graph summarizes the measurement results shown in FIGS. 20-25.

As shown in FIG. 26, the internal quantum efficiency tends to increase with the decreasing $Ce^{3+}$ substitution amount. When excited by 450 nm radiation, the phosphor with the $Ce^{3+}$ substitution amount of 0.5 atomic % or less exhibited the internal quantum efficiency of 90% or higher. Note that the range shown to be "OK" in FIG. 26 corresponds to the internal quantum efficiency that is 80% or higher.

As described above, the internal quantum efficiency is preferably 85% or higher, and more preferably 90% or higher. Thus, in order to maintain the internal quantum efficiency 90% or higher, the preferable $Ce^{3+}$ substitution amount is determined to be 0.5 atomic %.

As shown in FIG. 19, when the $Ce^{3+}$ substitution amount was 0.5 atomic % and the $Gd^{3+}$ substitution amount was 0 atomic %, the phosphor exhibited the correlated color temperature of about 8000 K. That means, it is necessary to adjust the chromaticity to allow the correlated color temperature to be 5000 K or so. As described above, by substituting part of Y by $Gd^{3+}$, the peak wavelength of the $Y_3Al_5O_{12}$:$Ce^{3+}$-based yellow-green phosphor shifts to longer wavelengths to render the emission light yellowish. Keeping this in mind, the present inventors attempted to adjust the chromaticity by $Gd^{3+}$ substitution.

Figure 27:
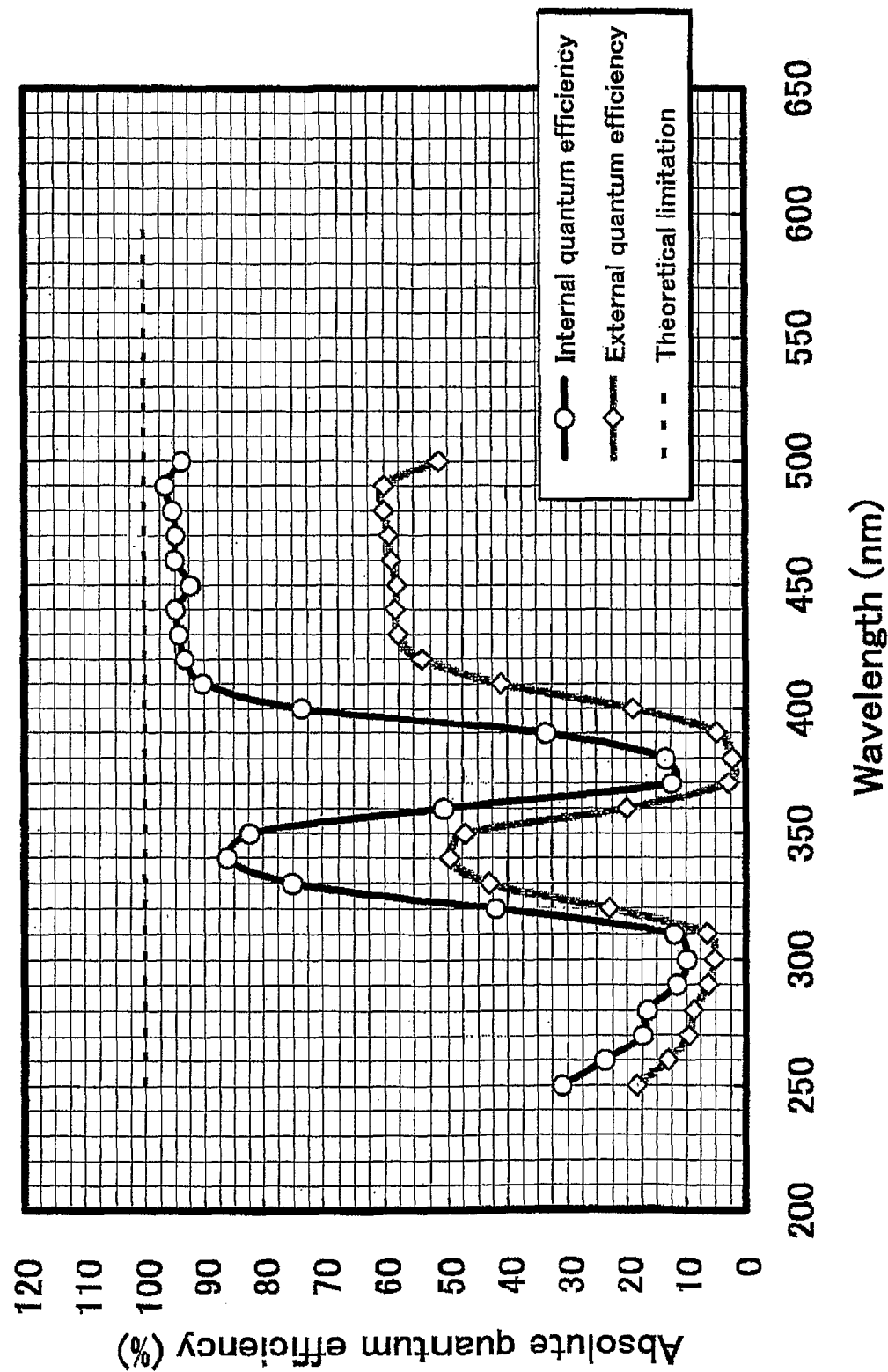
FIG. 27 is a graph of the internal quantum efficiency of yet another exemplary transparent phosphor ceramics according to the present invention.
Figure 28:
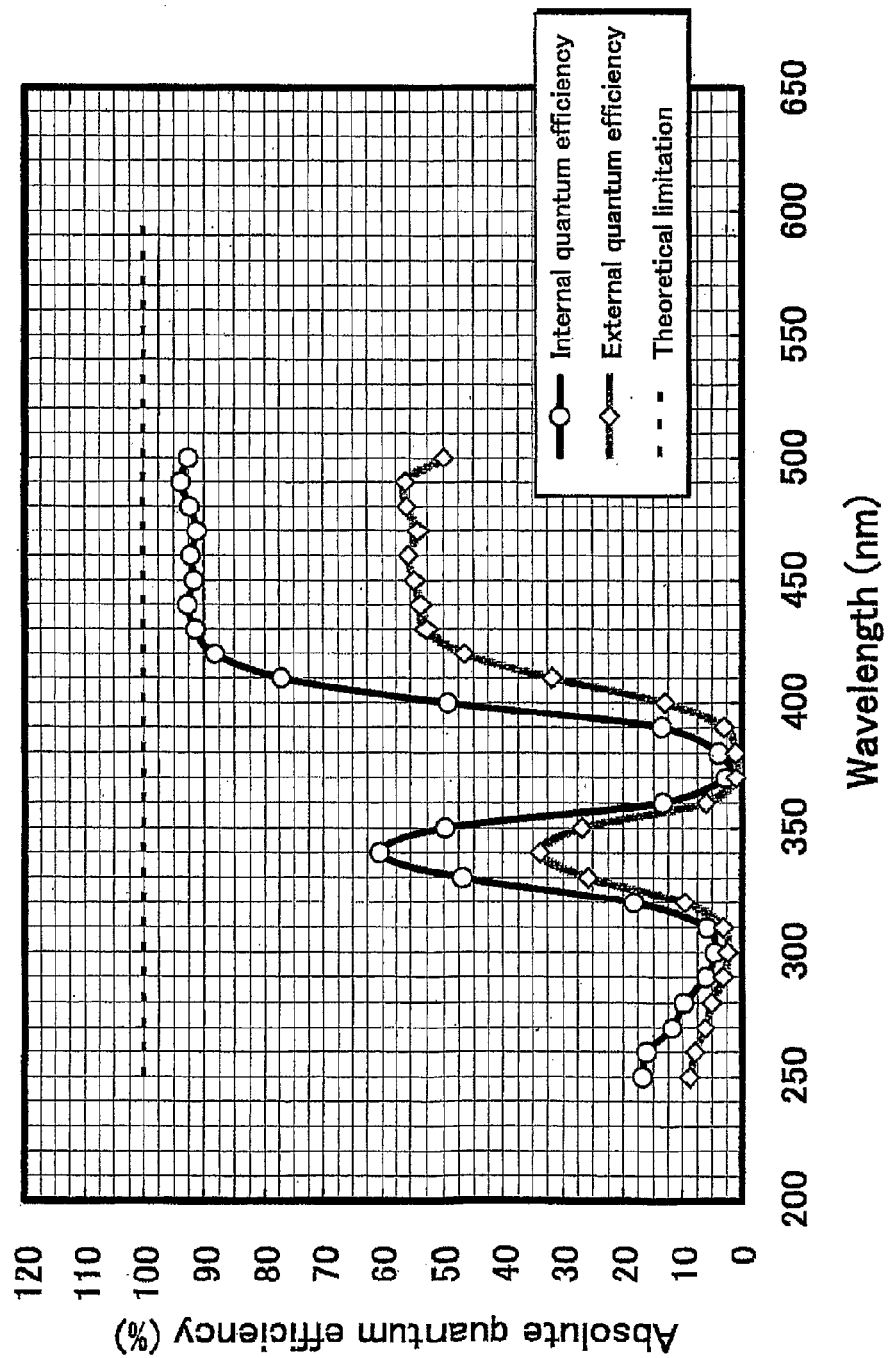
FIG. 28 is a graph of the internal quantum efficiency of yet another exemplary transparent phosphor ceramics according to the present invention.
Figure 29:
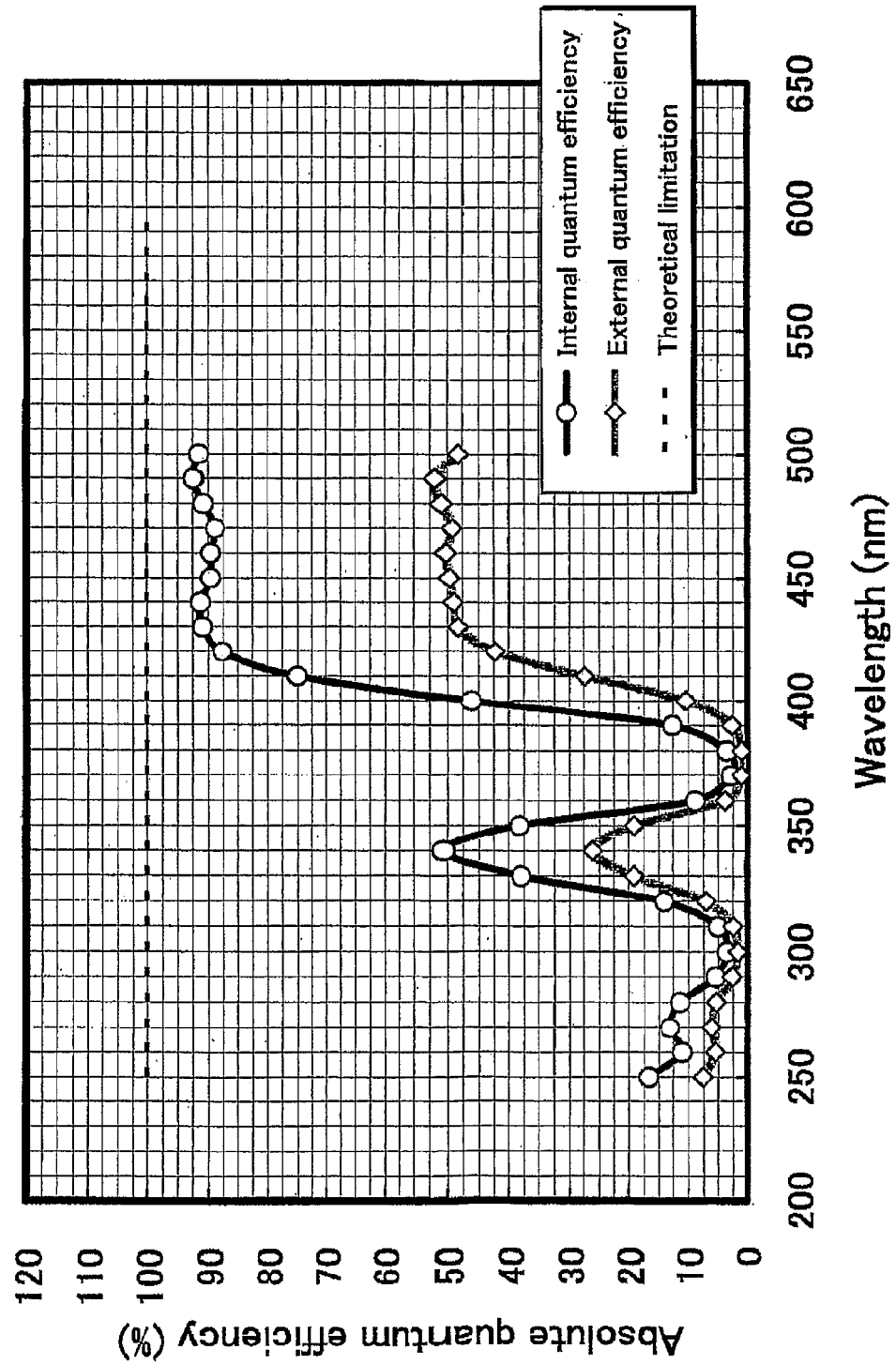
FIG. 29 is a graph of the internal quantum efficiency of yet another exemplary transparent phosphor ceramics according to the present invention.

With regard to the $Gd^{3+}$ substation, the present inventors first studied how the internal quantum efficiency would be affected by the $Gd^{3+}$ substitution amount. FIGS. 27-29 are graphs showing the internal quantum efficiency of transparent phosphor ceramics. In each graph, the $Ce^{3+}$ substitution amount was 0.5 atomic %. On the other hand, the $Gd^{3+}$ substitution amount were different for each graph. FIG. 27 shows the internal quantum efficiency of transparent phosphor ceramics with the $Gd^{3+}$ substitution amount being 0 atomic %, and 15 atomic % in FIG. 28, and 30 atomic % in FIG. 29. As apparent from FIGS. 27-29, the $Gd^{3+}$ substitution amount affected little on the internal quantum efficiency.

Figure 30:
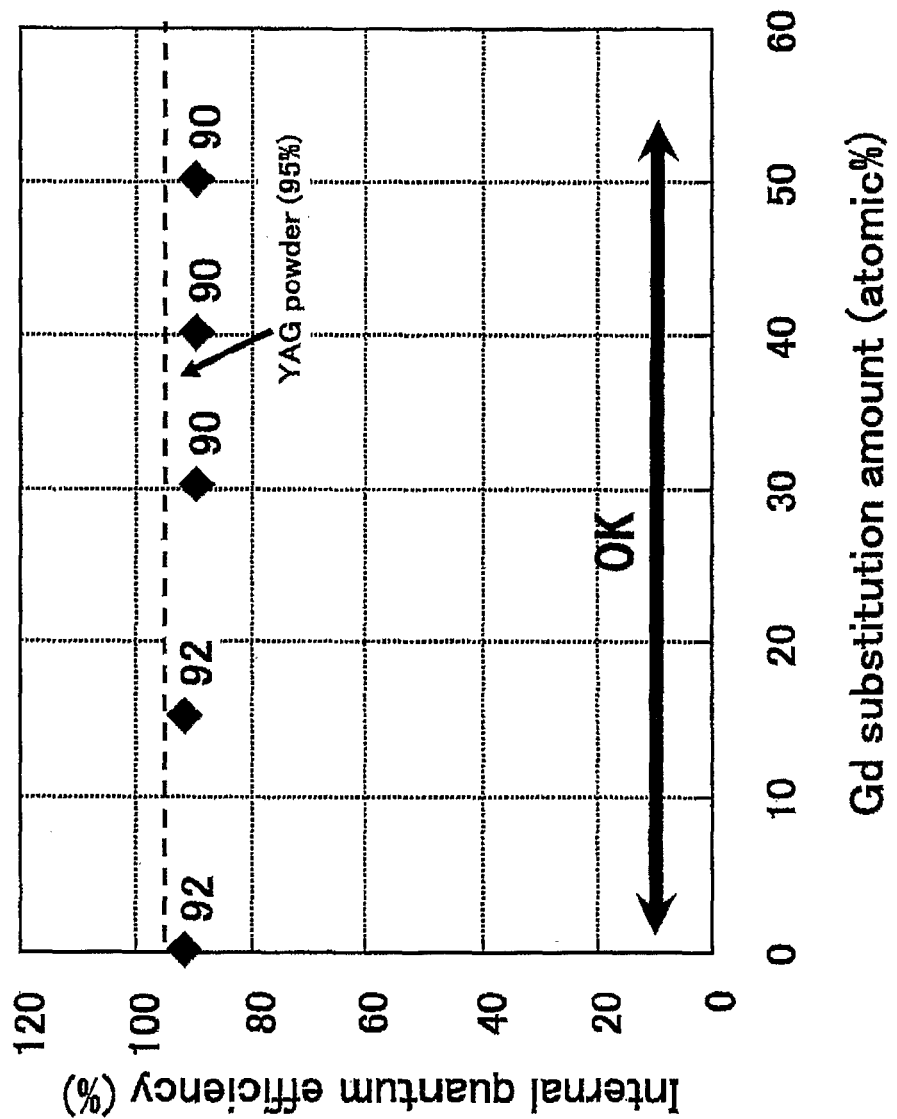
FIG. 30 is a graph showing the relation between the $Gd^{3+}$ substitution amount and the internal quantum efficiency.

FIG. 30 is a graph showing the relation between the $Gd^{3+}$ substitution amount and the internal quantum efficiency of samples of transparent phosphor ceramics. More specifically, the graph shows the internal quantum efficiency of the samples of transparent phosphor ceramics when excited by radiation at 450 nm. As shown in FIG. 30, as long as the $Gd^{3+}$ substitution amount was within the range up to 50 atomic %, all the samples exhibited the internal quantum efficiency of 90% or higher.

Figure 31:
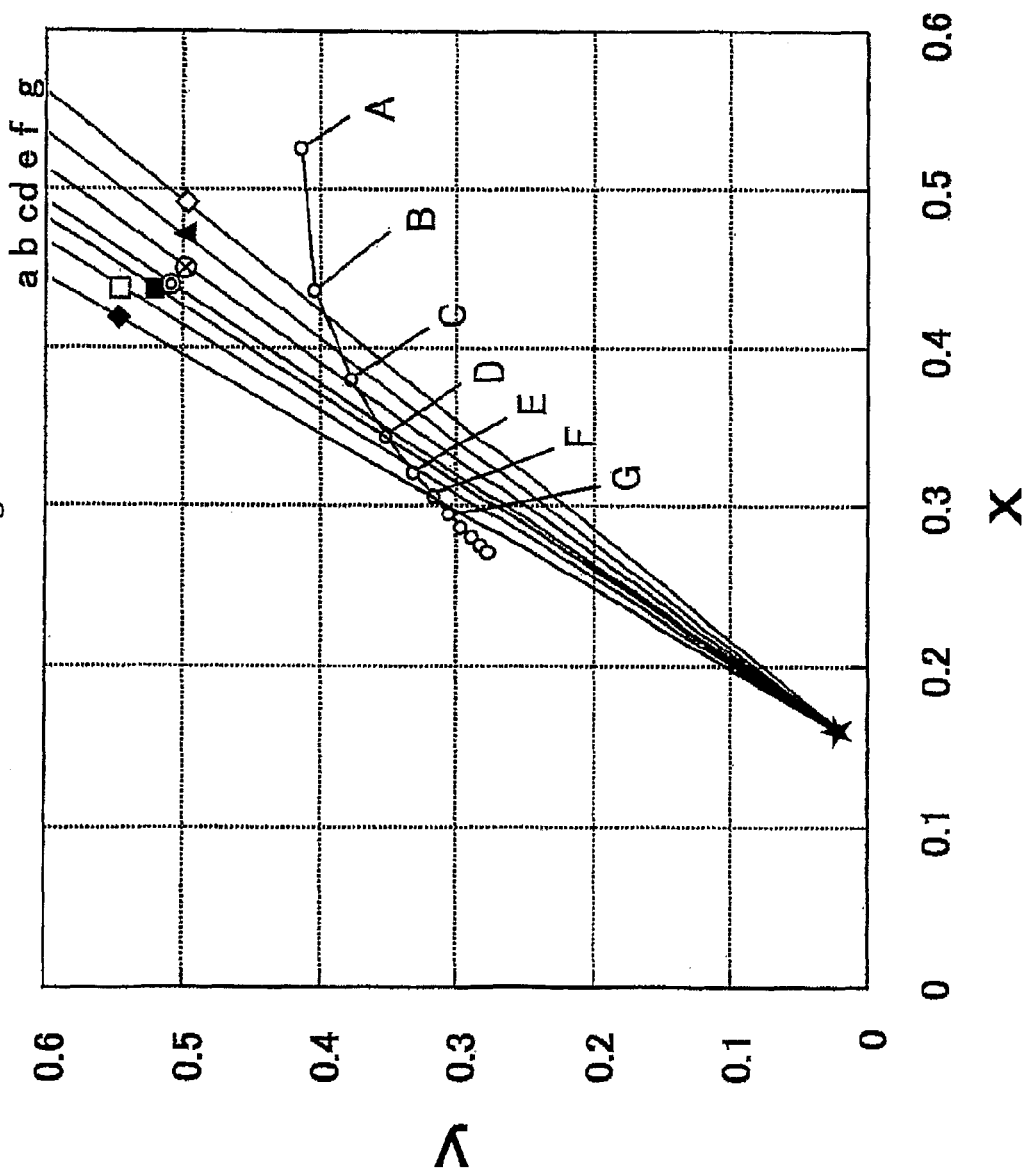
FIG. 31 is a diagram showing the chromaticities of light emitted by white LEDs.

In view of the above, the present inventors studied how the chromaticity would be affected by the $Gd^{3+}$ substitution amount within the range up to 50 atomic %. FIG. 31 is a graph showing the chromaticity of light emitted by white LEDs on the CIE chromaticity diagram. Each white LED was configured to emit a mixture of light emitted by the blue light emitting diode and light emitted by the transparent phosphor ceramics ($Y_3Al_5O_{12}$:$Ce^{3+}$-based phosphor) having a different thickness. In all the samples of transparent phosphor ceramics, the $Ce^{3+}$ substitution amount was commonly 0.5 atomic % but with the different $Gd^{3+}$ substitution amounts. In the graph, the line segments a, b, c, d, e, f and g correspond to the samples with the $Gd^{3+}$ substitution amount 0 atomic %, 5 atomic %, 15 atomic %, atomic %, 30 atomic %, 40 atomic %, and 50 atomic %, respectively.

Note, in addition, that the points A, B, C, D, E, F, and G in FIG. 31 are at the chromaticity coordinates corresponding to 2000 K, 3000 K, 4000K, 5000 K, 6000 K, 7000 K, and 8000 K.

As is apparent from FIG. 31, when the $Ce^{3+}$ substitution amount was 0.5 atomic % and the $Gd^{3+}$ substitution amount was 20 atomic %, the emission light was obtained at the correlated color temperature 5000 K.

In addition, the present inventors further studied the temperature characteristics of preferable phosphors. For use in vehicle headlights, preferable temperature characteristics of phosphor is such that 70% or higher of the emission intensity at room temperature is maintained at 150° C. The present inventors studied the conditions for ensuring such preferable temperature characteristics.

Figure 32:
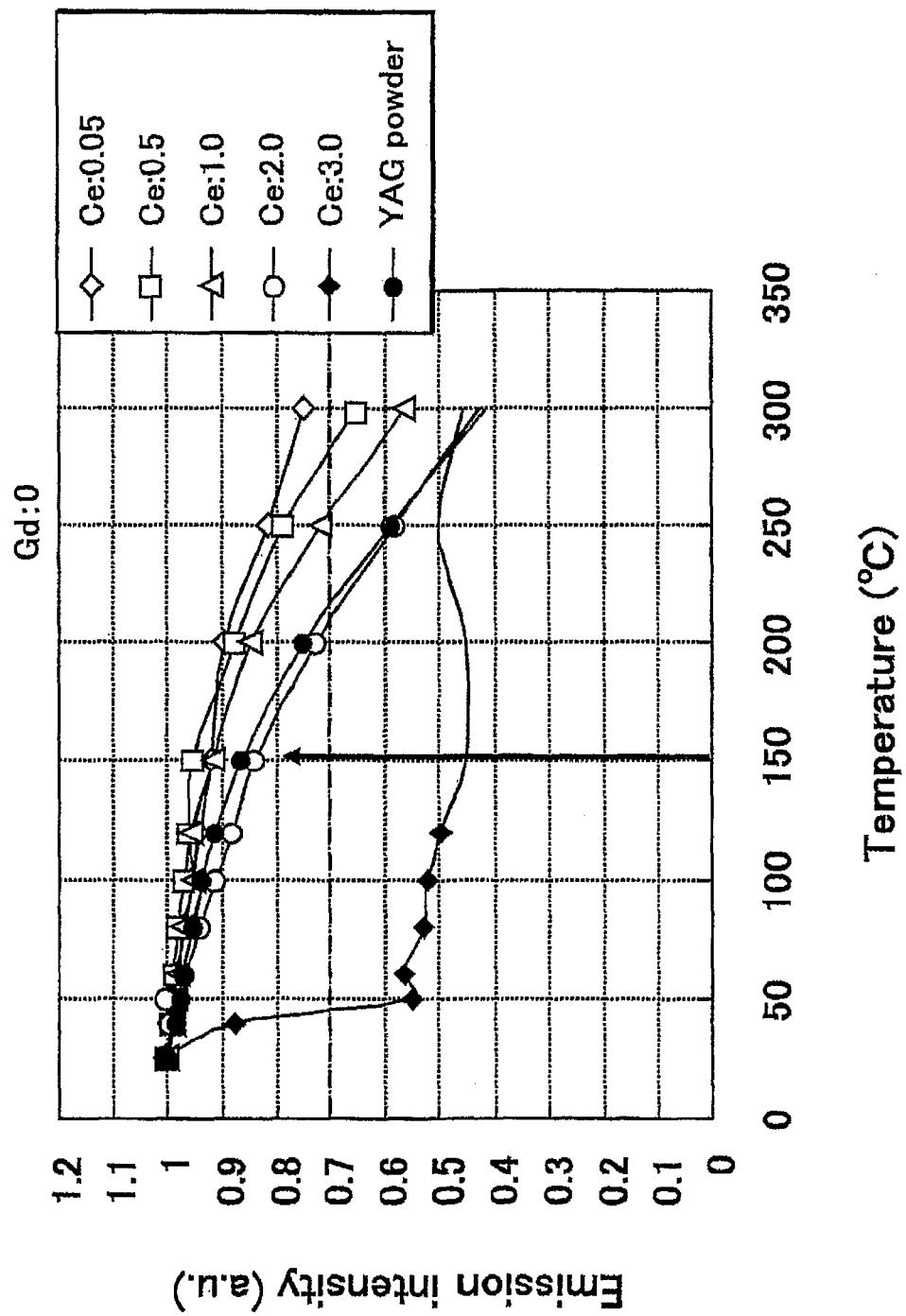
FIG. 32 is a graph showing the relation between the $Ce^{3+}$ substitution amount and the temperature characteristics.

FIG. 32 is a graph showing the relation between the $Ce^{3+}$ substitution amount and the temperature characteristics measured on samples of phosphors. All the samples of phosphors were with the $Gd^{3+}$ substitution amount of 0 atomic % but with different $Ce^{3+}$ substitution amounts, which were 0.05 atomic %, 0.5 atomic %, 1.0 atomic %, 2.0 atomic %, and 3.0 atomic %. For the reference purpose, measurement data on the $Y_3Al_5O_{12}$:$Ce^{3+}$ powder phosphor are also shown. The samples with the $Ce^{3+}$ substitution amount not more than 2.0 atomic % exhibited the emission intensity, of 70% or higher. However, when the $Ce^{3+}$ substitution amount reaching 3.0 atomic % or higher, the emission intensity sharply dropped to below 70%.

Figure 33:
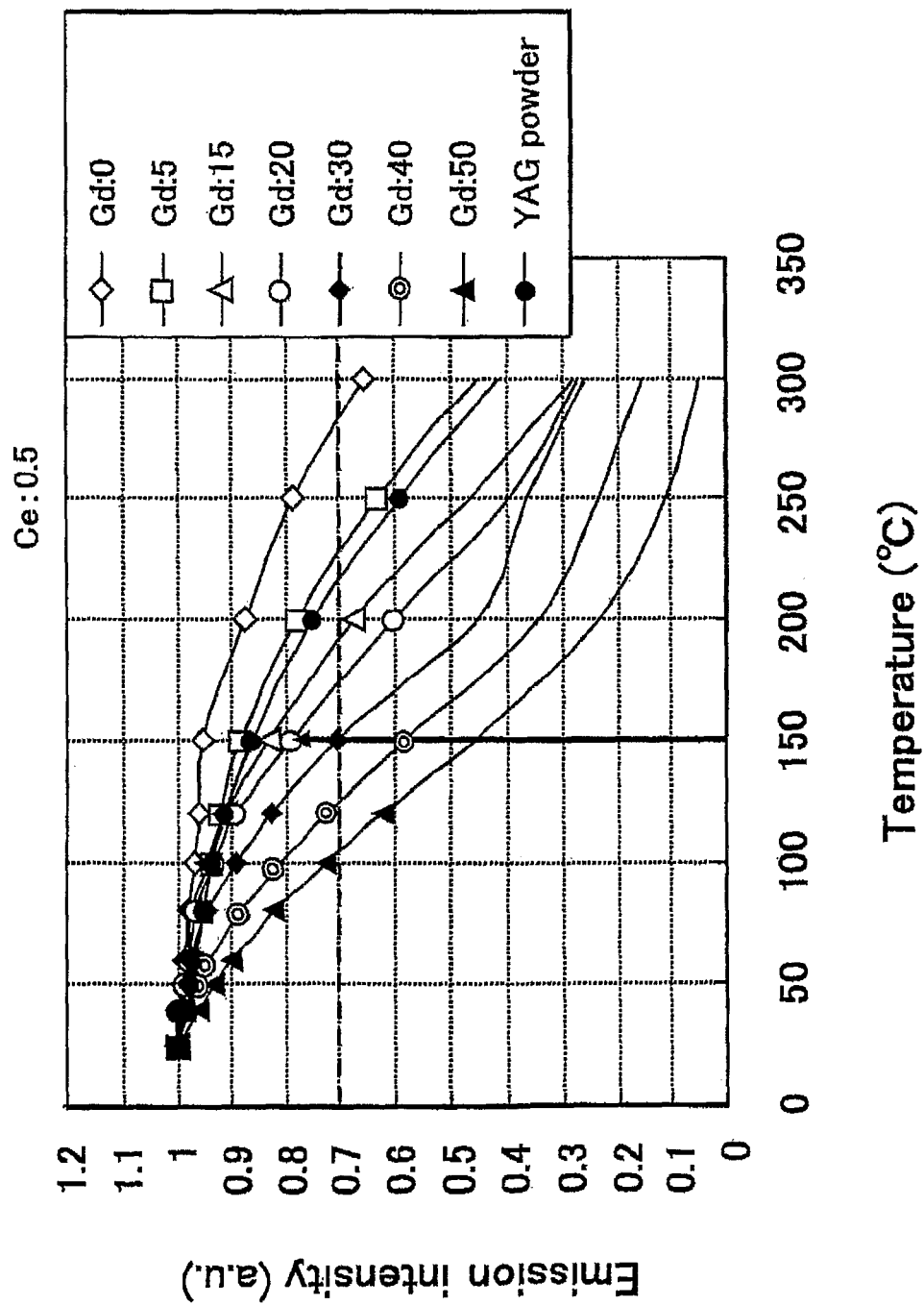
FIG. 33 is a graph showing the relation between the $Gd^{3+}$ substitution amount and the temperature characteristics.

FIG. 33 is a graph showing the substitution amount of $Gd^{3+}$ and temperature characteristics measured on phosphor samples. For all the samples, the $Ce^{3+}$ substitution amount was uniformly 0.5 atomic % but with different substitution amounts of $Gd^{3+}$ which were 0 atomic %, 5 atomic %, 15 atomic %, 20 atomic %, 30 atomic %, 40 atomic %, and 50 atomic %. For the reference purpose, measurement data on the $Y_3Al_5O_{12}$:$Ce^{3+}$ powder phosphor are also shown. All the samples with the substitution amount of $Gd^{3+}$ being no more than 30 atomic % exhibited the emission intensity of 70% or higher. However, when the substitution amount of $Gd^{3+}$ was 40 atomic % or higher, the emission intensity sharply dropped to below 70%.

Based on FIGS. 32 and 33, it is found that as long as the $Ce^{3+}$ substitution amount is no more than 2.0 atomic % and the substitution amount of $Gd^{3+}$ is no more than 30 atomic %, 70% or higher of the emission intensity at room temperature is maintained at 150° C. It is noted that these substitution amounts also satisfy the above-mentioned conditions for obtaining light at the correlated color temperature of 5000 K, which requires that the $Ce^{3+}$ substitution amount should be 0.5 atomic % and the Gd$^{3+}$ substitution amount should be 20 atomic %. It is thus concluded that the Ce$^{3+}$ substitution amount should be 0.5 atomic % and the Gd$^{3+}$ substitution amount should be 20 atomic %, light at the correlated color temperature of 5000 K is obtained without compromising the target temperature characteristics.

The above description relates to the study made on the conditions for obtaining the phosphor that emits light at the correlated color temperature of 5000 K. The present inventors conducted further study on the conditions for obtaining the phosphor that emits light at the correlated color temperature within the range from 2800K to 8000 K, besides 5000 K.

FIG. 34 is a table of measurement data on a plurality of white LEDs each including: a transparent phosphor ceramics containing $Y_3Al_5O_{12}$:Ce$^{3+}$-based and a blue light emitting diode having a light-emitting layer (peak wavelength at 450 nm) made from an InGaN-based compound. Each white LED emits white light by addictive color mixture where yellow-green light emitted by the transparent phosphor ceramics is mixed with blue light emitted by the blue LED. The table, shows, for each white LED, the Ce$^{3+}$ substitution amount and the Gd$^{3+}$ substitution amount of the transparent phosphor ceramics, the thickness of the transparent phosphor ceramics (having a plate-like shape), and the chromaticity (x and y) and the correlated color temperature of the emission light of the white LED.

Figure 35:
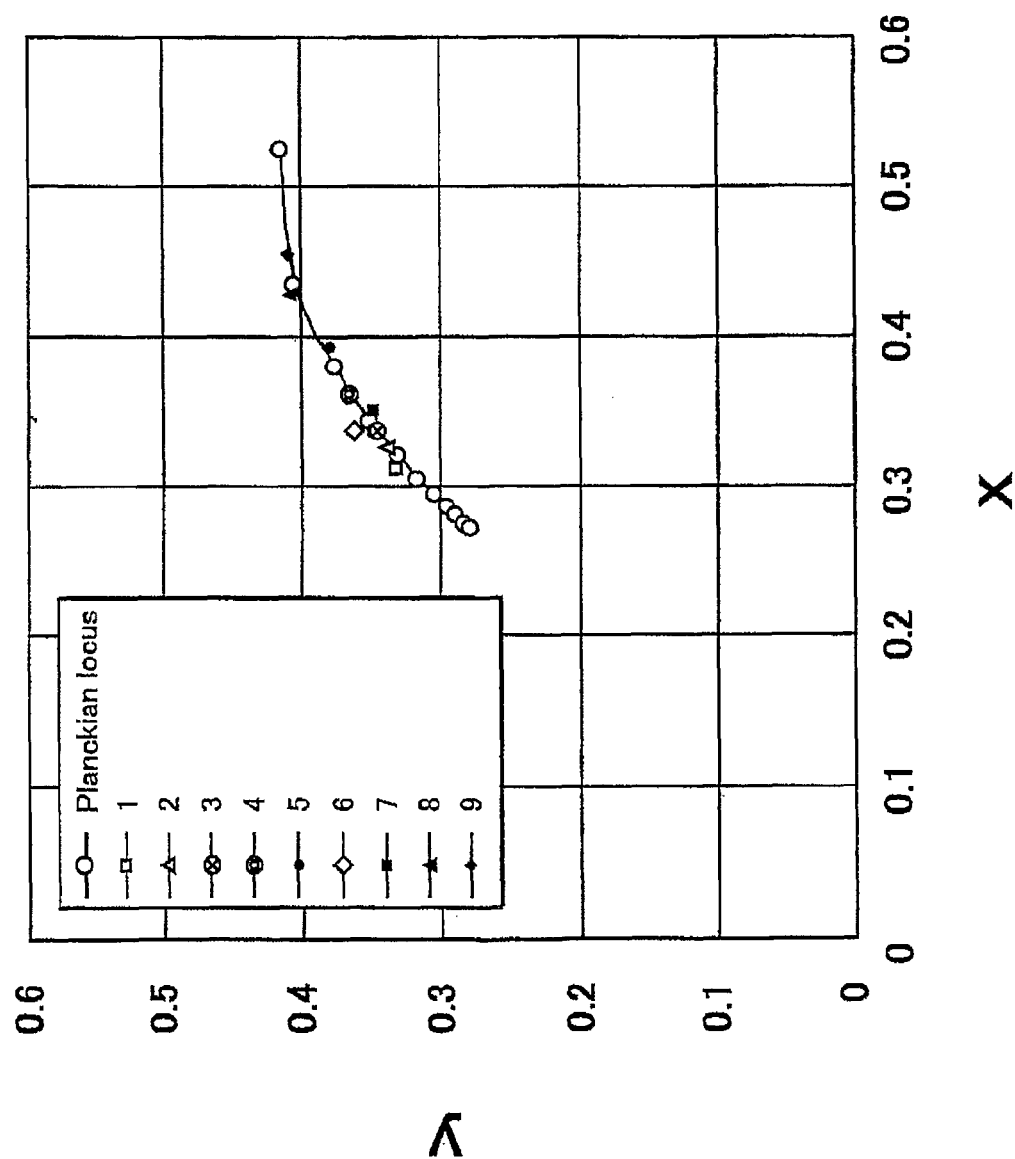
FIG. 35 is a table showing the chromaticities of light emitted by the white LEDs.

FIG. 35 is a CIE chromaticity diagram on which the chromaticity of the emission light of each white LEDs is plotted, along with the Planckian locus. (Note that the configuration and some of the properties of the white LEDs are shown in FIG. 34.)

As shown in FIGS. 34 and 35, the emission light are obtained at various correlated color temperatures within the range from 2800-8000K, by changing the Ce$^{3+}$ substitution amount, the Gd$^{3+}$ substitution amount, and the thickness of transparent phosphor ceramics, and the like.

In FIG. 34, Example groups 1-5 are those with the Ce$^{3+}$ substitution amount being 0.5 atomic %, whereas Example groups 6-9 are those with the Ce$^{3+}$ substitution amount being 0.8 atomic %. By comparing the former and the latter Example groups, it is found that the correlated color temperature lowers with the increasing Ce$^{3+}$ substitution amount. Based on this finding, the present inventors studied the conditions for obtaining preferable temperature characteristics when the Ce$^{3+}$ substitution amount was 0.8 atomic %.

Figure 36:
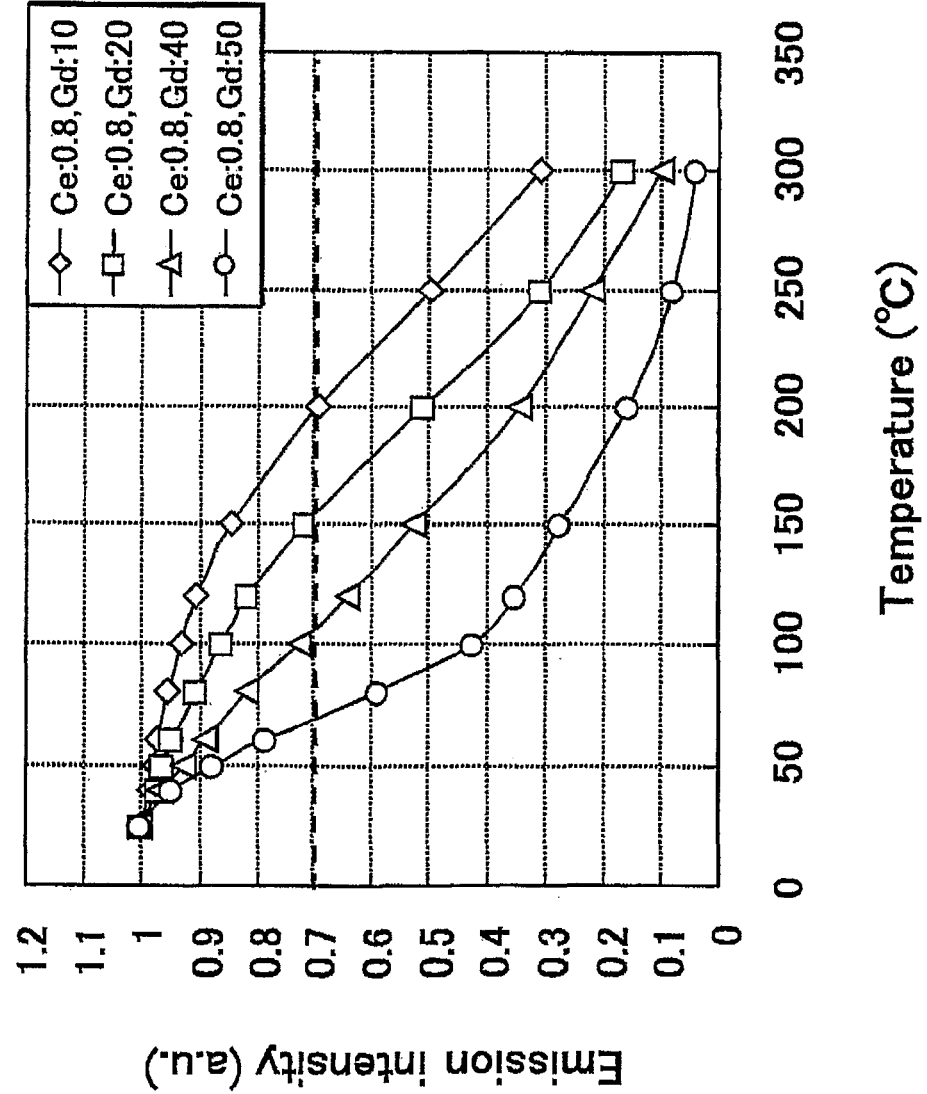
FIG. 36 is a graph showing the relation between the $Gd^{3+}$ and the temperature characteristics.

FIG. 36 is a view showing the relation between the substitution amount of Gd$^{3+}$ and the temperature characteristics. In each sample, the Ce$^{3+}$ substitution amount was uniformly 0.8 atomic % but the substitution amount of Gd$^{3+}$ was either of 10 atomic %, 20 atomic %, 40 atomic %, and 50 atomic %. When the Ce$^{3+}$ substitution amount was 0.8 atomic %, the preferable emission intensity (70% or higher) was exhibited as long as the substitution amount of Gd$^{3+}$ was 20 atomic % or less. When the substitution amount of Gd$^{3+}$ was 40 atomic % or higher, the resulting emission intensity was less than 70%.

The above study was made to identify samples having temperature characteristics suitable for halogen lamps and vehicle headlights. That is, the emission intensity at 150° C. should be 70% or higher of the emission intensity at room temperature for such a purpose. For the general illumination purpose, however, it is sufficient that the emission intensity at 70° C. is 70% or higher of the emission intensity at room temperature. On the other hand, for halogen lamps and vehicle headlights expected to be used in a harsher environment, it is preferable that the emission intensity at 200° C. is maintained to be 70% or higher of the emission intensity at room temperature. In view of this, the present inventors studied the measurement data to clarify the conditions for obtaining samples capable of maintaining the emission intensity at 70° C., 150° C., and 200° C. to be equal to 70% or higher of the emission intensity at room temperature.

FIGS. 37 and 38 are tables showing the temperature ranges that are determined by the Ce$^{3+}$ substitution amount and the Gd$^{3+}$ substitution amount. The tables are prepared by reorganizing the measurement data shown in FIGS. 31-36, from the viewpoint of temperature characteristics.

The data shown in FIG. 37 relates to samples with the Ce$^{3+}$ substitution amount of 0.5 atomic %. With these samples having the Ce$^{3+}$ substitution amount of 0.5 atomic %, as long as the Gd$^{3+}$ substitution amount was 50 atomic % or less, the emission intensity exhibited at 70° C. within the color temperature range of 3600-8000 K was maintained at 70% or higher of the emission intensity exhibited at room temperature. As long as the Gd$^{3+}$ substitution amount was 30 atomic % or less, the emission intensity exhibited at 150° C. within the color temperature range of 4500-8000 K was maintained at 70% or higher of the emission intensity exhibited at room temperature. As long as the Gd$^{3+}$ substitution amount was 10 atomic % or less, the emission intensity exhibited at 200° C. within the color temperature range of 6000-8000 K was maintained at 70% or higher of the emission intensity exhibited at room temperature.

The data shown in shown in FIG. 38 relates to samples with the Ce$^{3+}$ substitution amount of 0.8 atomic %. With these samples having the Ce$^{3+}$ substitution amount of 0.8 atomic %, as long as the Gd$^{3+}$ substitution amount was 50 atomic % or less, the emission intensity exhibited at 70° C. within the color temperature range of 2800-7000 K was maintained at 70% or higher of the emission intensity exhibited at room temperature. As long as, the Gd$^{3+}$ substitution amount was 20 atomic % or less, the emission intensity exhibited at 150° C. within the color temperature range of 4500-7000K was maintained at 70% or higher of the emission intensity exhibited at room temperature. As long as the Gd$^{3+}$ substitution amount was 10 atomic % or less, the emission intensity exhibited at 200° C. within the color temperature range of 5500-7000K was maintained at 70% or higher of the emission intensity exhibited at room temperature.

Problems Associated with High-Power Output Point Light Source

The following describes problems associated with semiconductor light emitting apparatus configured to be suitable as a high-power point light source. Some of the problems are already mentioned above, and the following are typical problems relating to a wavelength converter.

(1) Color Separation of Mixture Color Light Associated with Wavelength Converter Made of Ceramic Compact In order to address the above-mentioned problem of temperature rise of the phosphor layer, a ceramic compact (transparent phosphor ceramics, for example) having a high thermal conductivity and excellent heat dissipation is employed as the wavelength converter. Unfortunately, however, the color unevenness of the output light tends to be more notable with the ceramic compact than with a resin phosphor layer. This color unevenness is ascribable to the different light distribution characteristics between the LED light and the secondary light. The LED light is highly directive, whereas the secondary light diffuses uniformly. As a result, when seen the output light from the front, the LED light (blue light, for example) is more dominant at the central portion of the wavelength converter, whereas the secondary light (yellow light, for example) is more dominant at the peripheral portion. That is, the emission light appears to be in separate colors, rather than in one uniformly mixture color (white light, for example).

In addition to the above-described technical problems, there are other problems related to manufacturing and selling, including those not directly associated with the increase of input power or higher-power confutation. Some of such problems are described below.

(2) Low Yield and Complication of Manufacturing Steps Associated with Difficulty of Color Adjustment The following discussion relates to a white LED that is configured to emit white light by mixing blue LED light with yellow light that is obtained by converting the blue LED light by the wavelength converter. With the increase of the power density input to the chip, the many other component members such as the chip and the wavelength converter are placed into the usage conditions that tend to greatly vary in response to small external environmental changes. As a consequence, the output light varies in characteristics especially in color tone. Especially problematic is that the variations accelerate with the increase of the input power density.

(3) In Many Manufacturing Methods, it is Difficult to Predict Impact on Performance and Quality of the Products Resulting from Adaptation of the Step of Forming a Phosphor Layer in the Later Stage of the Entire Manufacturing.

Generally, white LEDs are fundamentally different from other phosphor devices (such as phosphor lamps, CRTs, PDPs, FEDs, and VFDs) with respect to the step of forming a phosphor layer. The feature lies in that the step of forming a phosphor layer is performed in the later stage of the entire manufacturing process. Generally, relatively high-level technical expertise are required to provide a high quality and high performance phosphor layer. In the manufacturing process of other phosphor devices, a phosphor layer is formed in separate steps and then incorporated into other step (s) at a later stage of the entire manufacturing process to complete the devices. However, this rarely applies to the manufacturing of white LEDs. A phosphor layer is formed in steps that are performed in the final or close to the final stage of the entire manufacturing process. Naturally, occurrences of defective in-process phosphor layers contribute greatly to manufacturing losses, which is one factor of increasing the manufacturing cost (4) Low Market-Expected Price of White LEDs Despite its short developing history, white LEDs are rapidly growing in the market, becoming popular, and under intensified inter-corporate competition. It is therefore difficult to develop products that meet the market demand, without using expensive component members (such as high-output LED chips, red phosphors, and heat-dissipating substrates) which are in the development stage, have scarcity value, and available in the small market still being formed. Under these circumstances, the manufacturing cost inevitably increases.

The above-described background factors crate the need to provide a solution to all the problems noted above, with the configuration that uses sufficiently proven techniques in the applications of electronic devices, rather than new techniques not having utilization track records. The semiconductor light emitting apparatus according to one embodiment of the present invention meets the need.

Embodiment 2

Figure 16:
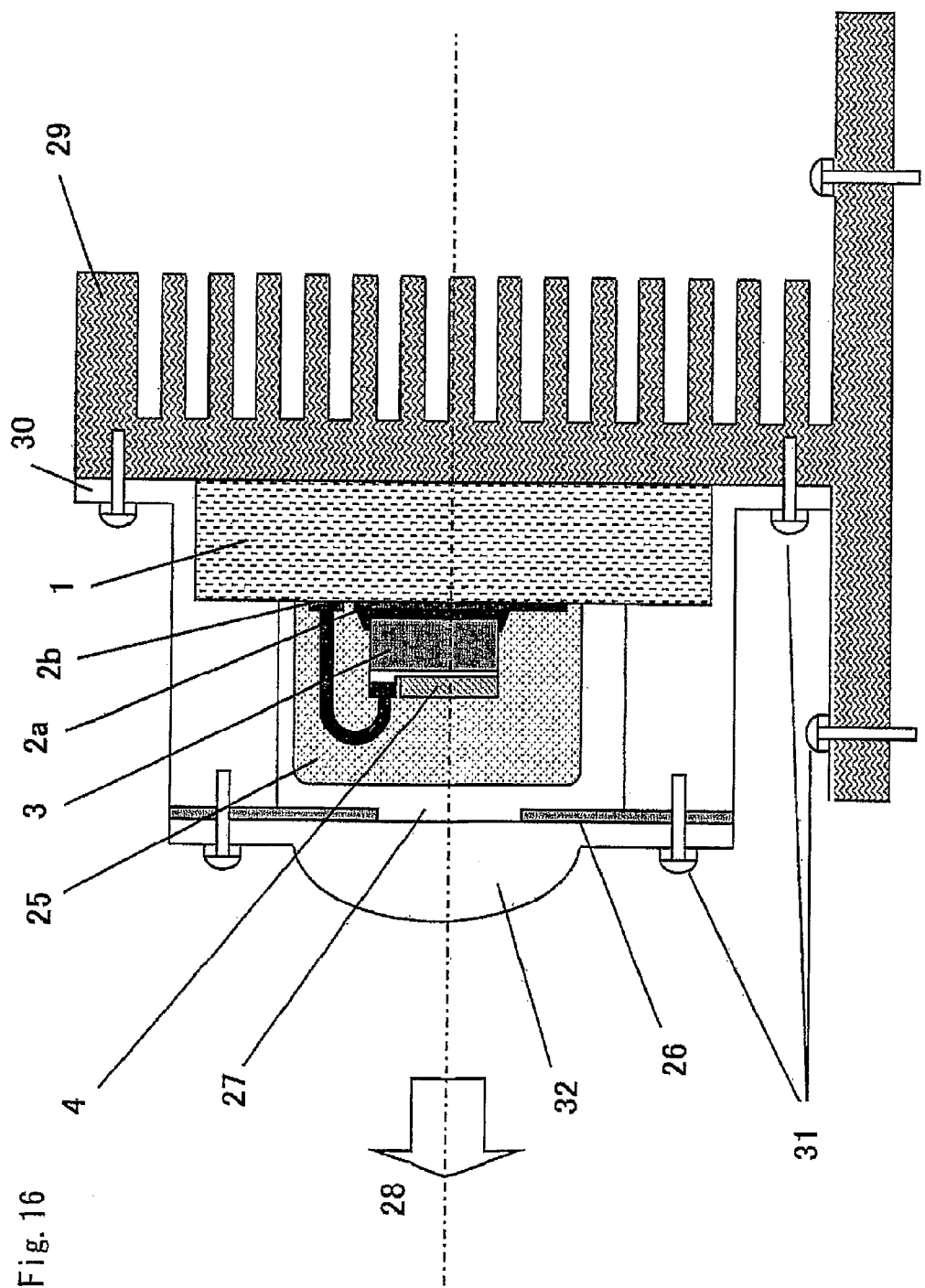
FIG. 16 is a cross-sectional side view of an exemplary light source apparatus according to the present invention.
Figure 17:
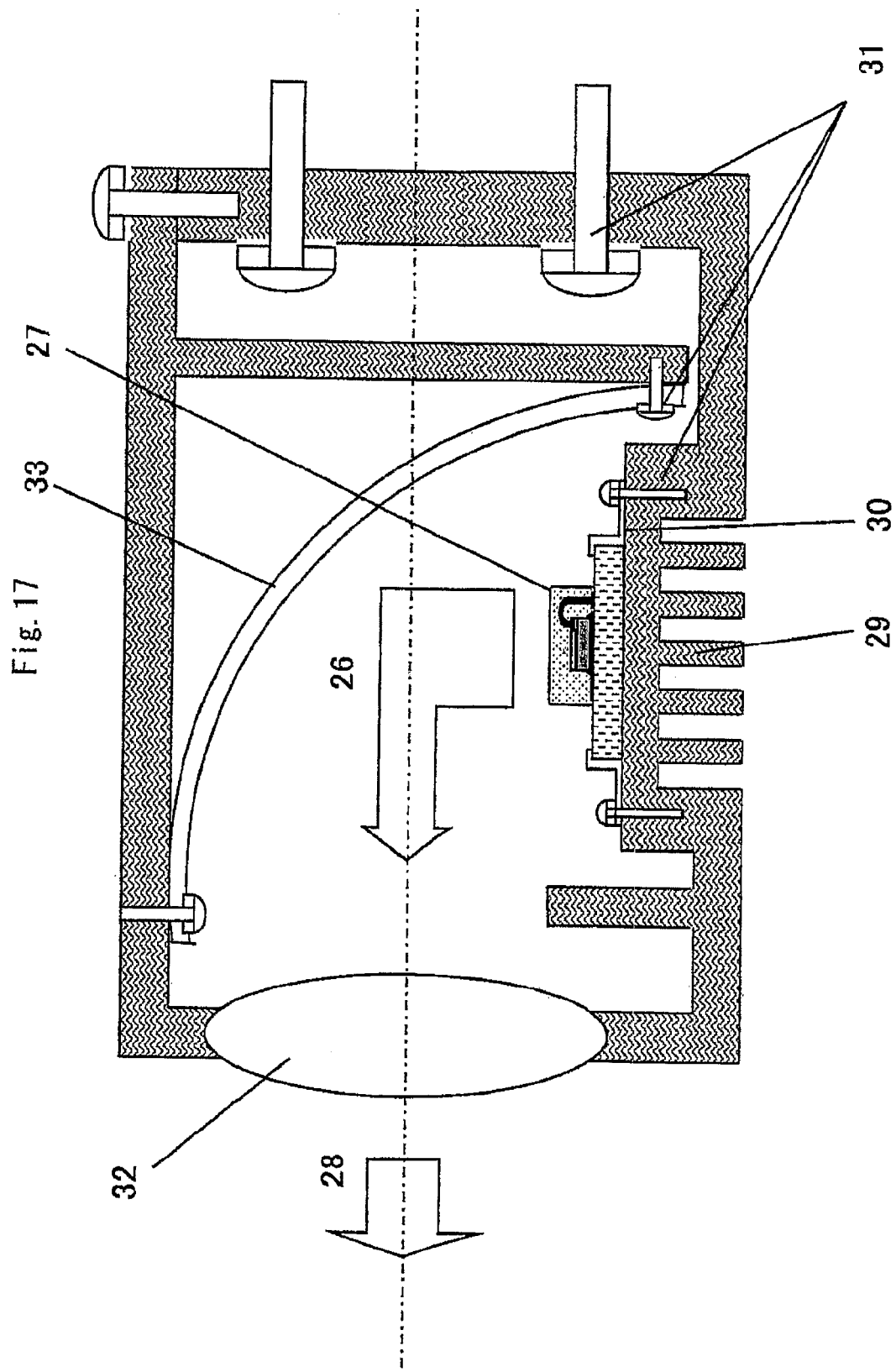
FIG. 17 is a cross-sectional side view of another exemplary light source apparatus according to the present invention.

FIGS. 16 and 17 are cross-sectional side views each showing, an example of a headlight apparatus (such as a projection light source or a vehicle headlight) configured by employing a semiconductor light emitting apparatus according to the present invention.

As shown in FIGS. 16 and 17, the light source apparatus according to the preferred embodiment 2 of the present invention is configured with the semiconductor light emitting apparatus 27 according to the preferred embodiment 1. In one preferable embodiment, the light source apparatus at least includes an external heat dissipator 29 in combination with the semiconductor light emitting apparatus 27.

This configuration provides a small and compact light source apparatus that emits beam light.

In FIGS. 16 and 17, the semiconductor light emitting apparatus 27 is the semiconductor light emitting apparatus described in the preferred embodiment 1 and emits output light 28 in response to electrical power supply.

That is, the semiconductor light emitting apparatus employs a small piece of any of the examples of the wavelength converter 4 (such as a resin phosphor layer or transparent phosphor ceramics) described above and the wavelength converter 4 is attached to the solid-state light emitting device 3 with an adhesive substance in a manner to cover at least the main light-extracting surfaces.

In the above configuration, the size of the main light-extracting surface of the solid-state light emitting device 3 is substantially equal to the size of the light-exiting surface of the semiconductor light emitting apparatus, so that the semiconductor light emitting apparatus constitutes a high-intensity point light source.

Preferably, the wavelength converter 4 is a total inorganic wavelength converter that is composed exclusively of the wavelength conversion layer 4a. Examples of such wavelength converters include transparent phosphor ceramics, phosphor glass, and the above-mentioned MGC optical convertor.

Such a total inorganic wavelength converter has a high thermal conductivity, is configured not to accumulate heat easily, and is readily available. By virtue of the advantageous properties, even if the semiconductor light emitting apparatus is configured so that the wavelength converter 4 receives incident light of high energy density, the temperature rise of the wavelength converter 4 is still suppressed relatively easily; As a result, it is ensured that the output light 28 is obtained at high energy efficiency.

The following now describes the external heat dissipator 29. The heat dissipater 29 may be a heat-dissipating structure having a radiation fin, for example. Alternatively, the heat dissipater may be a water cooling jacket. The heat dissipator 29 dissipates heat generated by the semiconductor light emitting apparatus 27 and provide cooling for the semiconductor light emitting apparatus 27.

FIGS. 16 and 17 each show a light source apparatus having an optical lens 32 for collecting light emitted by the semiconductor light emitting apparatus 27 according to the present invention. In FIG. 16, the light source apparatus is additionally provided with a light shield 26 for achieving desired lighting distributions. It should be noted, however, that the above-mentioned accessories are optional and selectively used as necessary.

The embodiment 2 of the present invention also achieves the advantageous effect of improving the output power by suppressing the temperature rise of the wavelength converter 4 (and the solid-state light emitting device 3) in the same or similar manner as described above. Thus, the description below is given only briefly not in detail.

FIG. 16 shows an exemplary light source apparatus for headlamp. The light source apparatus is so configured that the semiconductor light emitting apparatus 27 according to the present invention is fixedly disposed on the external heat dissipator 29 via a fixing jig 30. The output light 28 that is emitted by the semiconductor light emitting apparatus in the lateral direction in the figure directly exits as the output light the light source apparatus.

FIG. 17 shows an exemplary light source apparatus for vehicle headlight. The light source apparatus is so configured that the semiconductor light emitting apparatus 27 according to the present invention is fixedly disposed on the external heat dissipator 29 via the fixing jig 30. The output light 28 that is emitted by the semiconductor light emitting apparatus in the upward direction in the figure directly exits as the output light the light source apparatus.

Each light source apparatus according to this preferred embodiment employs the semiconductor light emitting apparatus 27 configured to have good heat dissipation and heat resistance, which allows the external heat dissipator 29 to be small in envelope volume. Thus, the small and compact light source apparatus is provided.

Although no further description is given, it is naturally appreciated that various other modifications of light source apparatus may be made using the semiconductor light emitting apparatus according to the present invention, based on the same technical concept.

INDUSTRIAL APPLICABILITY

The present invention provides a semiconductor light emitting apparatus and light source apparatus having high-power output and highly reliability. These apparatuses are especially suitable as a high-power point light source and can be manufactured through a simple application of traditionally used practical technicians. The present invention is therefore of high practical value.

REFERENCE SIGNS LIST

1 Heat-dissipating Substrate
2a Conductor A (Patterning Electrode)
2b Conductor B (Patterning Electrode)
3 Solid-State Light Emitting Device
4 Wavelength Converter
4a Wavelength Conversion Layer
5 Conductor C (Wire Conductor)
6 Electrode Pad
7 Insulating Substrate
8 Conductive Substrate
9 Transparent Substrate
10 Reflective Layer
11 Semiconductor Light-Emitting Layer
12 Transparent Electrode
13 Electrode
14 Feeder Electrode A
14b Feeder Electrode B
15 Primary Light
16 Transparent Host Material
17 Phosphor
17a Phosphor Compact
17b Phosphor Particles
18 Light Diffuser
20 Transparent Substrate
21 Electrode Outlet Portion
22 Feeder Terminal
23 Adhesive
24 Insulator
25 Light-Transmissive Body
26 Light Shield
27 Semiconductor Light Emitting Apparatus
28 Output Light
29 External Heat Dissipator
30 Fixing Jig
31 Mounting Screw
32 Optical Lens
33 Reflecting Mirror

The invention claimed is:

1. A semiconductor light emitting apparatus, comprising:
a solid-state light emitting device operable to emit primary light having an emission peak within a blue wavelength region from 430 nm to less than 475 nm; and
a wavelength convertor operable to convert the primary light into secondary light at a longer wavelength, wherein
the wavelength convertor is an inorganic compact that includes a transparent wavelength conversion layer with a thickness in a range from 30 μm to less than 100 μm, the wavelength conversion layer containing a $Y_3Al_5O_{12}$:$Ce^{3+}$-based phosphor having a garnet crystal structure,
wherein the $Y_3Al_5O_{12}$:$Ce^{3+}$-based phosphor is expressed by the chemical formula $(Y_{1-a-x}Gd_aCe_x)_3Al_5O_{12}$,
"x" expressed in atomic % denotes a $Ce^{3+}$ substitution amount, the $Ce^{3+}$ substitution amount falling within a range from greater than 0.5 atomic % to 1 atomic %, and
"a" expressed in atomic % denotes a $Gd^{3+}$ substitution amount, the $Gd^{3+}$ substitution amount falling within a range from 0 atomic % to 30 atomic %, both inclusive.

2. The semiconductor light emitting apparatus of claim 1, wherein
the primary light has an emission peak within a wavelength region from 440 nm to 470 nm, both inclusive, and
emission light of the semiconductor light emitting apparatus is white light having a correlated color temperature within a range from 2800 K to 6700 K, both inclusive.

3. The semiconductor light emitting apparatus of claim 1, wherein
the wavelength conversion layer exhibits an absolute internal quantum efficiency of 85% or higher, when excited by blue light at a wavelength of 450 nm at room temperature.

4. The semiconductor light emitting apparatus of claim 1, wherein
the wavelength converter is attached to the solid-state light emitting device via a transparent adhesive material to make an intimate contact with a main light-extracting surface of the solid-state light emitting device.

5. The semiconductor light emitting apparatus of claim 4, wherein
the wavelength conversion layer has a contour that conforms to a contour of an upper surface or the main light-extracting surface of the solid-state light emitting device.

6. The semiconductor light emitting apparatus of claim 5, wherein
the solid-state light emitting device has a pair of feeder electrodes disposed (i) both on the upper surface or (ii) one on the upper surface and another on a rear surface of the solid-state light emitting device, and
the solid-state light emitting device is mounted on a heat dissipator so that an intimate contact is made between the heat dissipator and the entire rear surface of the solid-state light emitting device, the rear surface being an opposite surface to the main light-extracting surface.

7. The semiconductor light emitting apparatus of claim 6, wherein the wavelength conversion layer is disposed (i) at a location not overlapping with the feeder electrodes and (ii) to cover the entire main light-extracting surface.

8. The semiconductor light emitting apparatus of claim 7, wherein
the wavelength conversion layer has a substantially polygonal contour, and
at least one corner of the polygonal wavelength conversion layer is cut away or chamfered at least partly.

9. The semiconductor light emitting apparatus of claim 1, wherein
the wavelength converter includes:
the wavelength conversion layer configured to convert the primary light into the secondary light; and
a transparent substrate configured to support the wavelength conversion layer and not to convert the primary light, and
the transparent substrate is larger in volume than the wavelength conversion layer.

10. The semiconductor light emitting apparatus of claim 9, wherein
the transparent substrate comprises a pair of substrate layers, and
the pair of substrate layers are disposed to sandwich the wavelength conversion layer therebetween.

11. A light source apparatus comprising the semiconductor light emitting apparatus of claim 1.

12. The semiconductor light emitting apparatus of claim 1, wherein
the wavelength convertor as a plate-like shape.

* * * * *